(12) United States Patent
Park et al.

(10) Patent No.: US 10,267,467 B2
(45) Date of Patent: Apr. 23, 2019

(54) LIGHT EMITTING MODULE

(71) Applicant: LG ELECTRONICS INC., Seoul (KR)

(72) Inventors: Jun Park, Seoul (KR); Byungwoo Jeoung, Seoul (KR); Sangok Yeo, Seoul (KR)

(73) Assignee: LG Electronics Inc., Seoul (KR)

( * ) Notice: Subject to any disclaimer, the term of this patent is extended or adjusted under 35 U.S.C. 154(b) by 105 days.

(21) Appl. No.: 15/136,242

(22) Filed: Apr. 22, 2016

(65) Prior Publication Data

US 2016/0312978 A1 Oct. 27, 2016

(30) Foreign Application Priority Data

Apr. 23, 2015 (KR) .................. 10-2015-0057463

(51) Int. Cl.
*F21V 9/00* (2018.01)
*F21S 41/14* (2018.01)
(Continued)

(52) U.S. Cl.
CPC ............. *F21S 41/14* (2018.01); *F21S 41/143* (2018.01); *F21S 41/16* (2018.01); *F21S 41/17* (2018.01);
(Continued)

(58) Field of Classification Search
CPC ............... F21S 48/1104; F21S 48/1109; F21S 48/1159; F21S 48/1241; F21S 48/13;
(Continued)

(56) References Cited

U.S. PATENT DOCUMENTS 9,354,498 B2 * 5/2016 Takahashi .......... G02B 19/0028
2007/0279907 A1 * 12/2007 Goto ....................... B60Q 1/085
362/277

(Continued)

FOREIGN PATENT DOCUMENTS

CN 102720954 10/2012
DE 102012211915 1/2014
(Continued)

OTHER PUBLICATIONS

Korean Notice of Allowance in Korean Application No. 10-2015-0057616, dated Feb. 20, 2017, 2 pages.
(Continued)

*Primary Examiner* — Jan T Mai
*Assistant Examiner* — Matthew Peerce
(74) *Attorney, Agent, or Firm* — Fish & Richardson P.C.

(57) ABSTRACT

A light emitting module is disclosed. The light emitting module includes a condensing lens for condensing incident light into a space, a light source for providing first light to pass through the condensing lens, a first optical path conversion member for reflecting the first light to provide first reflected light to pass through the condensing lens, a second optical path conversion member for providing the first reflected light as second reflected light to pass through the condensing lens, and a case for receiving at least the condensing lens, the light source, the first optical path conversion member, and the second optical path conversion member.

18 Claims, 50 Drawing Sheets

(51) Int. Cl.
*F21V 29/70* (2015.01)
*F21V 5/04* (2006.01)
*F21V 7/00* (2006.01)
*F21V 13/12* (2006.01)
*F21V 29/51* (2015.01)
*F21V 29/71* (2015.01)
*F21V 29/76* (2015.01)
*F21V 13/04* (2006.01)
*F21V 14/04* (2006.01)
*H01S 5/323* (2006.01)
*F21S 41/19* (2018.01)
*F21S 41/143* (2018.01)
*F21S 41/17* (2018.01)
*F21S 41/29* (2018.01)
*F21S 41/20* (2018.01)
*F21S 41/255* (2018.01)
*F21S 41/39* (2018.01)
*F21S 41/32* (2018.01)
*F21S 41/36* (2018.01)
*F21S 41/16* (2018.01)
*F21V 9/30* (2018.01)
*F21S 41/365* (2018.01)

(52) U.S. Cl.
CPC .............. *F21S 41/19* (2018.01); *F21S 41/255* (2018.01); *F21S 41/285* (2018.01); *F21S 41/295* (2018.01); *F21S 41/321* (2018.01); *F21S 41/36* (2018.01); *F21S 41/395* (2018.01); *F21V 5/04* (2013.01); *F21V 7/0033* (2013.01); *F21V 7/0041* (2013.01); *F21V 9/30* (2018.02); *F21V 13/04* (2013.01); *F21V 13/12* (2013.01); *F21V 14/04* (2013.01); *F21V 29/51* (2015.01); *F21V 29/70* (2015.01); *F21V 29/713* (2015.01); *F21V 29/76* (2015.01); *H01S 5/32316* (2013.01); *F21S 41/365* (2018.01)

(58) Field of Classification Search
CPC .............. F21S 48/1305; F21S 48/1329; F21S 48/1388; F21S 48/155; F21S 48/1757; F21S 48/2268; F21S 48/23
USPC .......................................................... 362/84
See application file for complete search history.

(56) References Cited

U.S. PATENT DOCUMENTS

| 2012/0057363 | A1 | 3/2012 | Ishida et al. |
| 2014/0293631 | A1 | 10/2014 | Lee |
| 2015/0098236 | A1 | 4/2015 | Lin et al. |
| 2016/0082881 | A1* | 3/2016 | Yamato .................. B60Q 3/217 362/511 |

FOREIGN PATENT DOCUMENTS

| EP | 2508795 | 10/2012 |
| EP | 2693106 | 2/2014 |
| EP | 2769879 | 8/2014 |
| JP | 2007-072339 | 3/2007 |
| JP | 2011-142000 | 7/2011 |
| JP | 2014-0178464 | 3/2013 |
| JP | 2014-240270 | 12/2014 |
| KR | 10-2010-0019505 | 11/2010 |
| KR | 10-2012-0115099 | 10/2012 |
| KR | 10-2012-0131534 | 12/2012 |

OTHER PUBLICATIONS

Partial European Search Report issued in European Application No. 16166632.6 dated Aug. 17, 2016, 9 pages.

* cited by examiner

LIGHT EMITTING MODULE

CLAIM OF PRIORITY

This application claims priority to Korean Patent Application Serial No. 10-2015-0057463, filed on Apr. 23, 2015, the entire contents of which are hereby incorporated by reference.

BACKGROUND OF THE INVENTION

1. Field of the Invention

The present invention relates to a light emitting module and a lamp device for vehicles including the same.

2. Description of the Related Art

In general, vehicles are equipped with lamp devices for illuminating nearby objects during poor lighting conditions or signaling the state of driving to nearby vehicles or pedestrians.

The lamp device for vehicles includes a head lamp mounted to the front side of the vehicle and a tail lamp mounted to the rear side of the vehicle. The head lamp is a lamp for illuminating the area ahead while driving at night. The tail lamp includes a brake lamp, which is turned on when a driver steps on a brake, and a turn signal lamp, which indicates the direction of travel of the vehicle.

Recently, light emitting diodes or laser diodes have been used as light sources for automotive lamp devices for good energy efficiency.

In particular, laser diodes are receiving attention due to their high degree of straightness, long-distance illumination and non-disturbance of the field of vision of drivers of oncoming vehicles.

The laser diode needs a phosphor and a lens assembly in order to output white light. However, this complicates the structure of the automotive lamp device, reduces efficiency, and increases the volume of the device. The lamp device for vehicles having a conventional laser diode will now be described.

FIG. 26 is a conceptual view of a conventional light emitting module. Referring to FIG. 21, a conventional light emitting module operates in such a manner that blue light generated from a laser diode is focused while passing through a prism 3 and a lens 4, the focused light is reflected from a first optical path conversion member 5, passes through a light transmissive phosphor 6 and is converted into white light, and the white light is radiated forward from a wavelength conversion unit 7.

However, if the light emitting module is arranged lengthwise along an optical axis inside the head lamp for vehicles, the length of the head lamp may be increased in response thereto.

Further, since the conventional light emitting module needs a relatively large number of components and has an optical path structure in which the light passes through each component only once, it may be hard to manufacture a compact head lamp due to the overall size of the components.

Specifically, light transmitted through the light transmissive phosphor 6 spreads out in a fan shape. For this reason, it is necessary for light incident upon the light transmissive phosphor 6 to be concentrated on a small spot (about 0.5 mm). The conventional light emitting module uses the above-described optical path in order to focus light (having a diameter of about 6 mm) emitted from the laser diode on a small spot on the light transmissive phosphor 6.

In addition, using a large number of components in order to focus light on such a small spot may increase costs and deteriorate reliability, and using the light transmissive phosphor may cause a decrease in efficiency.

The light transmissive phosphor must be configured such that light is transmitted through the front surface and the rear surface of the light transmissive phosphor, which have a large area than the side surface of the light transmissive phosphor, and heat is dissipated through the side surface of the light transmissive phosphor, through which light is not transmitted. As a result, a heat sink must be connected to the side surface of the light transmissive phosphor.

In this case, the contact area between the light transmissive phosphor and the heat sink is small with the result that heat is not easily dissipated from the light transmissive phosphor, whereby the light transmissive phosphor easily overheats. In general, the efficiency of the light transmissive phosphor is abruptly reduced at high temperature with the result that lighting using the light transmissive phosphor has limited intensity of light.

In addition, the relative position between a condensing lens and each light source is very important in order to condense light into a front space. A small spatial difference therebetween greatly may reduce the efficiency of light generated by the light emitting module. Furthermore, light may not be efficiently condensed into a space.

Meanwhile, in a head lamp for vehicles, which uses a blue laser as a light source, light is locally concentrated on the surface of a phosphor, with the result that the surface of the phosphor is heated to 200° C. or higher. In a case in which the phosphor is heated to a high temperature as described above, a conventional wavelength conversion device, which is formed of a silicon resin containing phosphor powder dispersed therein, may be destroyed by heat, or wavelength conversion efficiency may be extremely reduced.

SUMMARY OF THE INVENTION

Therefore, the present invention has been made in view of the above problems, and it is an object of the present invention to provide a light emitting module which has high light efficiency, excellent light convergence and straightness, a small size, and high heat dissipation efficiency.

In accordance with an aspect of the present invention, the above and other objects can be accomplished by the provision of a light emitting module including a condensing lens for condensing incident light into a space, a light source for providing first light to pass through the condensing lens, a first optical path conversion member for reflecting the first light to provide first reflected light to pass through the condensing lens, a second optical path conversion member for providing the first reflected light as second reflected light to pass through the condensing lens, and a case for receiving at least the condensing lens, the light source, the first optical path conversion member, and the second optical path conversion member.

In accordance with another aspect of the present invention, there is provided a light emitting module including a condensing lens for condensing incident light into a space, a light source for providing first light to pass through the condensing lens, a first optical path conversion member for reflecting the first light to provide first reflected light to pass through the condensing lens, a second optical path conversion member for providing the first reflected light as second reflected light to pass through the condensing lens, and a case for receiving at least the condensing lens, the light source, the first optical path conversion member, and the second optical path conversion member.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1A:
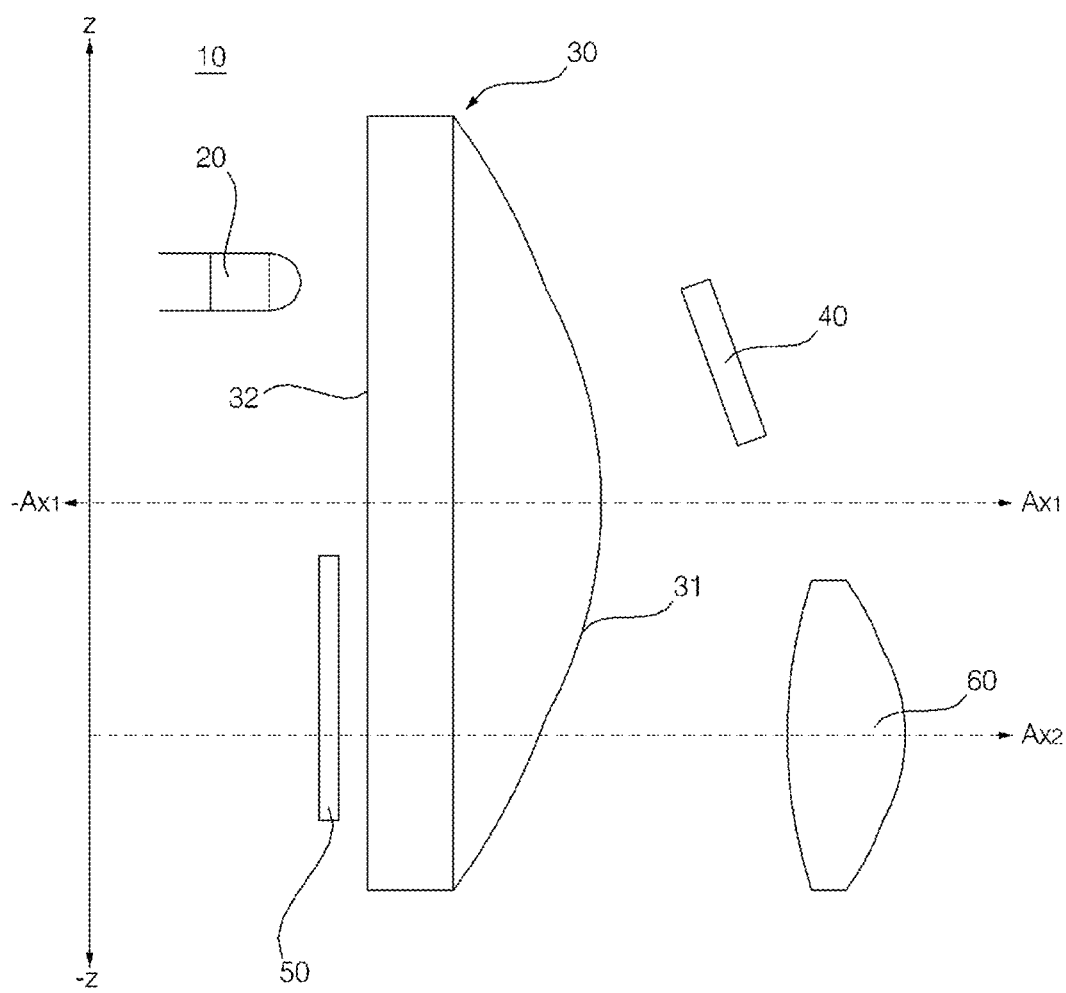
FIGS. 1A and 1B are conceptual views of a light emitting module according to an embodiment of the present invention when viewed in different directions.
Figure 1B:
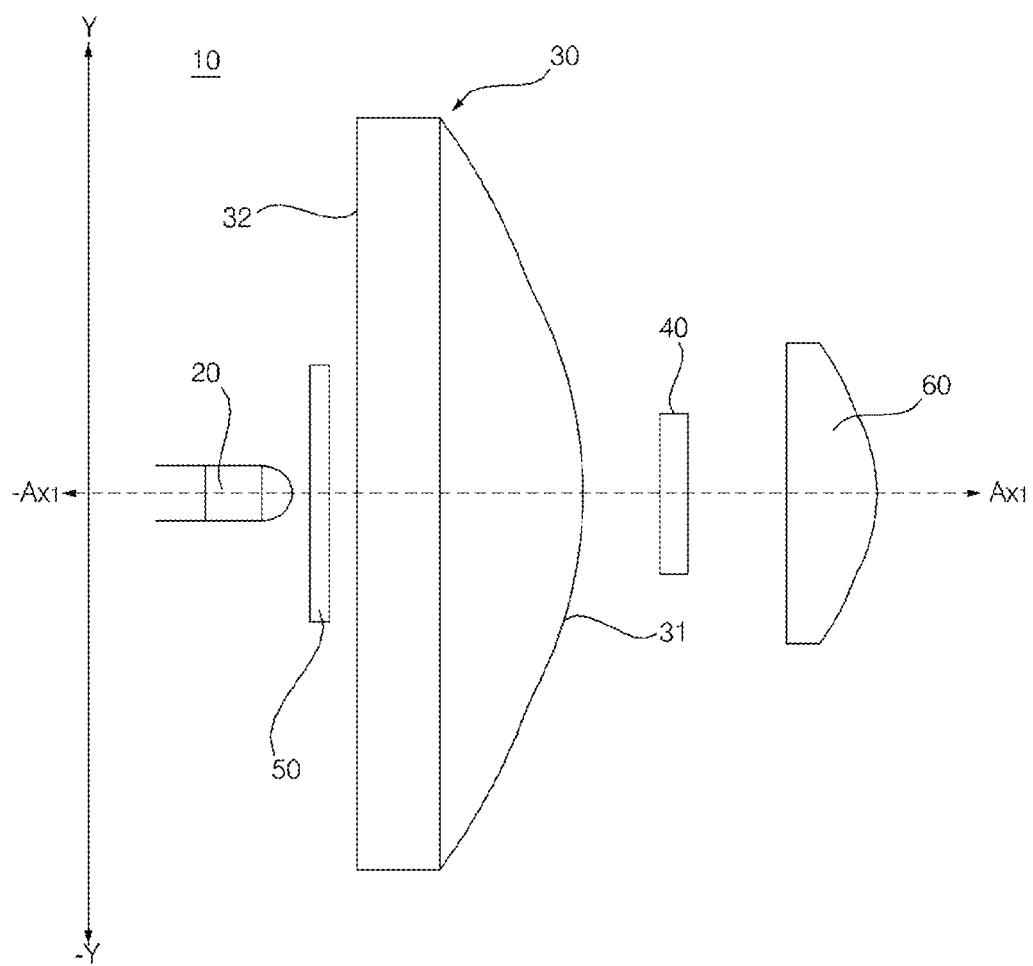
Figure 2:
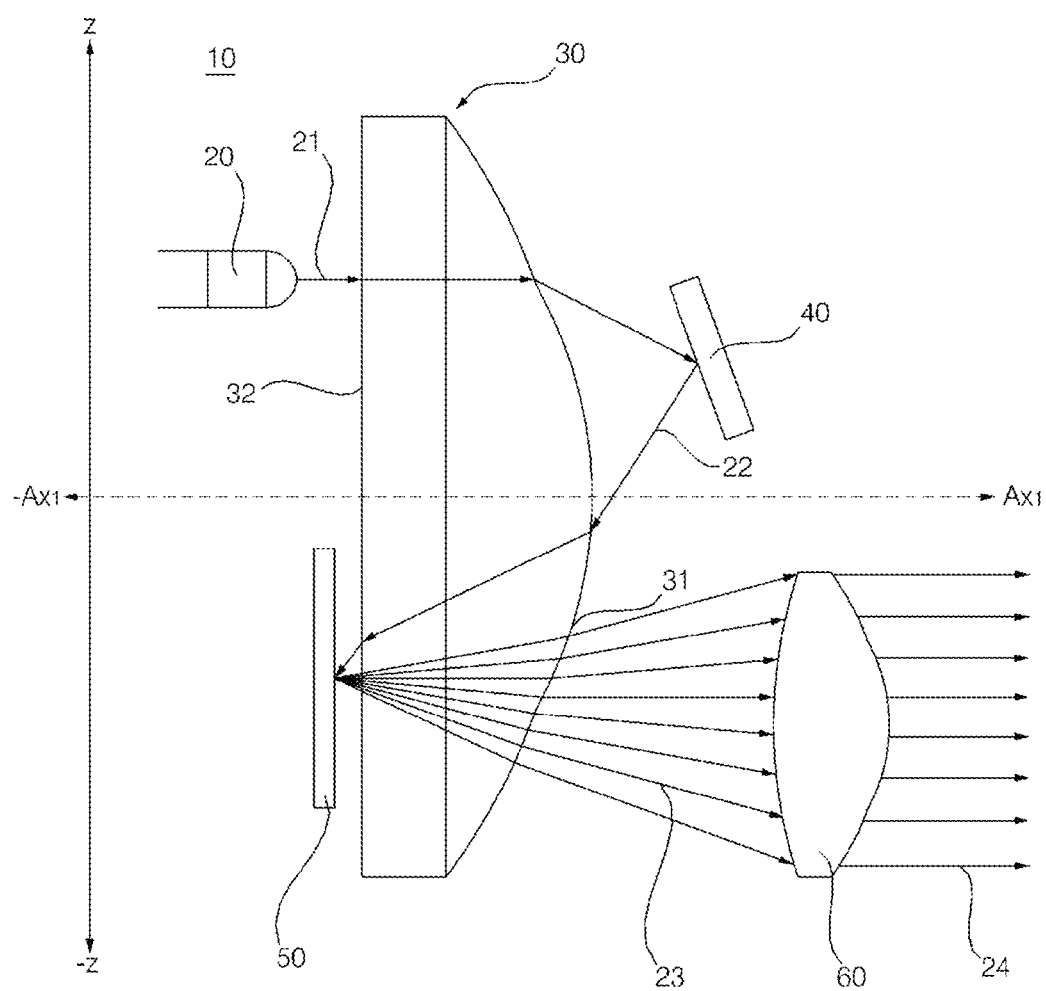
FIG. 2 is a conceptual view illustrating an optical path of the light emitting module according to the embodiment of the present invention.

FIGS. 1A and 1B are conceptual views of a light emitting module according to an embodiment of the present invention when viewed in different directions, and FIG. 2 is a conceptual view illustrating an optical path of the light emitting module according to the embodiment of the present invention.

Referring to FIGS. 1 and 2, a light emitting module 10 according to an embodiment of the present invention includes a condensing lens 30, a light source 20, a first optical path conversion member 40, a wavelength conversion unit 50, and a case for receiving the condensing lens 30, the light source 20, the first optical path conversion member 40, and the wavelength conversion unit 50.

Specifically, the light emitting module 10 according to the embodiment of the present invention includes a condensing lens 30 for condensing incident light into a space, a light source disposed at one side of the condensing lens 30 for providing light 21 to pass through the condensing lens 30, a first optical path conversion member 40 disposed at the other side of the condensing lens 30 for reflecting the light 21 passing through the condensing lens 30 such that the light 21 is provided back to the condensing lens 30, and a wavelength conversion unit 50 disposed at one side of the condensing lens 30 for providing light 22 incident upon the condensing lens 30 through the first optical path conversion member 40 back to the condensing lens 30.

More specifically, the light emitting module 10 includes a condensing lens 30 for condensing light incident from the rear into a front space, a light source 20 disposed behind the condensing lens 30 to emit first light 21 toward the condensing lens 30, a first optical path conversion member 40 disposed in front of the condensing lens 30 for reflect the first light 21, having passed through the condensing lens 30 to supply first reflected light 22 to the condensing lens 30, and a wavelength conversion unit 50 disposed behind the condensing lens 30 for supplying the first reflected light 22, having passed through the condensing lens 30, as second reflected light 23 to pass through the condensing lens 30.

A light emitting module 10 according to another embodiment of the present invention includes a main case 101 having a light source 20 and a condensing lens 30, a bracket 140 coupled to the main case 101, the bracket 140 being provided at one side thereof with a receiving hole 143, a heat dissipation support member 210 coupled to the bracket 140, the heat dissipation support member 210 having a support part 211, which is inserted into the receiving hole 143, the heat dissipation support member 210 being provided at one side thereof with a heat sink 220, and a wavelength conversion unit 50 disposed at the support part 211 for converting the wavelength of absorbed light.

Here, the direction "front" refers to the right side (direction of Ax1) along a central axis Ax1 and −Ax1 (also referred to as an optical axis) of the condensing lens 30 in FIG. 1. The direction "rear" refers to the left side (direction of −Ax1) along the central axis Ax1 and −Ax1 of the condensing lens 30 in FIG. 1. The vertical direction refers to an upward and downward direction (direction of Z-axis), which is perpendicular to the optical axis in FIG. 1A, and the horizontal direction refers to the direction of the Y-axis in FIG. 1B, which is perpendicular to the optical axis and the vertical direction.

The central axis Ax1 of the condensing lens 30 is an imaginary line which connects the focal point of a front surface 31 of the condensing lens 30 with the center of the condensing lens 30.

The components that are received in the case will be described first, and then the case will be described.

The condensing lens 30 functions to concentrate light incident from the rear of the optical axis on a predetermined spot in the front of the optical axis. The condensing lens 30 refracts the incident light due to the shape of the condensing lens 30 and the difference in refractive index between the condensing lens 30 and the outside. The refractive index of the condensing lens 30 may be greater than 1, and preferably, may range from 1.5 to 1.6.

For example, the condensing lens 30 includes a spherical lens or an aspherical lens. Preferably, the condensing lens 30 may be embodied as an aspherical lens.

The condensing lens 30 may have a shape that is convex in the front direction of the optical axis Ax. In another example, the condensing lens 30 may include a rear surface 32 which is perpendicular to the central axis Ax1 of the condensing lens 30, and a front surface 31 which is formed to be convex in the front direction of the condensing lens 30. Alternatively, the rear surface 32 may be formed to be concave in the front direction of the optical axis.

The front surface 31 of the condensing lens 30 is formed in a curve shape having a peak which lies on the central axis Ax1 of the condensing lens 30. In detail, the front surface 31 of the condensing lens 30 may be formed in a curve shape which has a focal point on the central axis Ax1 of the condensing lens 30 and multiple radii of curvature.

The condensing lens 30 refracts light that is incident parallel to the central axis Ax1 of the condensing lens 30, and concentrates the light on a predetermined spot in the front region of the optical axis. The condensing lens 30 may be made of various materials that light can penetrate.

The light source 20 functions to generate light by receiving electrical energy and converting the electrical energy into optical energy. For example, the light source 20 may be embodied as an ultra-high voltage (UHV) mercury lamp, a light emitting diode (LED), a laser diode (LD) or the like. Preferably, the light source 20 may be embodied as a laser diode having good light straightness and convergence.

Various power supplies may supply power to the light source 20. The power may be supplied by a printed circuit board (PCB), a metal core PCB, a flexible PCB, a ceramic PCB or the like.

Here, the laser diode is a semiconductor laser having two electrodes for performing laser processes. For example, the laser diode may have a GaAs, $Al_x Ga_{1-x}As$ double heterojunction structure.

The light source 20 may generate various colors of light. Preferably, the light source 20 generates blue-based light having good efficiency.

The light source 20 is disposed behind the condensing lens 30, and emits the first light 21 toward the condensing lens 30. The first light 21 is incident parallel to the central axis Ax1 (optical axis) of the condensing lens 30. Here, the term "parallel" does not refer to a parallel state in the mathematical sense, but refers to a substantially parallel state within the allowable range.

The first light 21 is incident into the condensing lens 30 through a point on the rear surface 32 of the condensing lens 30 that is located eccentrically from the central axis Ax1 of the condensing lens 30.

In detail, the condensing lens 30 may be divided into a first region and a second region by an imaginary section cut along the central axis Ax1 of the condensing lens 30.

For example, as shown in FIG. 1, the first region is an upper region (region in the direction of Z-axis) above the central axis Ax1 of the condensing lens 30. The second region is a lower region (region in the direction of −Z-axis) below the central axis Ax1 of the condensing lens 30. In this situation, the first light 21 is incident into the first region of the condensing lens 30.

To this end, the light source 20 is located eccentrically from the central axis Ax1 of the condensing lens 30. Specifically, the light source 20 is located eccentrically from the central axis Ax1 of the condensing lens 30 in the vertical direction (the direction of Z-axis and −Z-axis). Of course, the light source 20 may be located eccentrically from the central axis Ax1 of the condensing lens 30 in the horizontal direction (the direction of Y-axis and −Y-axis). Alternatively, the light source 20 may be located so as to overlap the central axis Ax1 of the condensing lens 30 when viewed in the vertical direction.

The light source 20 is spaced apart from the central axis Ax1 of the condensing lens 30 in a first direction (direction of Z-axis) which is perpendicular to the central axis Ax1 of the condensing lens 30. The light source 20 and the wavelength conversion unit 50 are located opposite each other across the central axis Ax1 of the condensing lens 30.

The first light 21 generated from the light source 20 is incident on a point that is eccentric from the central axis Ax1 of the condensing lens 30, is refracted from the front surface 31 of the condensing lens 30, and is then incident on the first optical path conversion member 40.

The first optical path conversion member 40 is disposed in front of the condensing lens 30, reflects the first light 21 having passed through the condensing lens 30, and supplies the first reflected light 22 to the condensing lens 30.

In detail, the first optical path conversion member 40 is arranged so that the first reflected light 22 can pass through the condensing lens 30 from the front surface 31 to the rear surface 32 thereof. The first optical path conversion member 40 may include a planar surface or a curved surface. According to the number of light sources 20, a plurality of first optical path conversion members 40 may be arranged in a stair shape. Further, the first optical path conversion member 40 may be rotatably structured so as to adjust the angle of the first reflected light 22.

In greater detail, in order to effectively arrange the components in the limited space of the lamp device for vehicles and increase the efficiency thereof, the first optical path conversion member 40 is arranged so that the first reflected light 22 is incident into the condensing lens 30 through a point on the front surface 31 of the condensing lens 30 that is located eccentrically from the central axis Ax1 of the condensing lens 30. At this time, it is preferable that the first reflected light 22 is incident into the second area of the condensing lens 30.

The spot of incidence of the front surface 31 of the condensing lens 30, on which the first reflected light 22 is incident, is located apart from the central axis Ax1 of the condensing lens 30 in a second direction. In other words, the first reflected light 22 is incident into another region of the condensing lens 30, which is opposite to the region of the condensing lens 30 into which the first light 21 is incident.

If the first optical path conversion member 40 is disposed on the central axis Ax1 of the condensing lens 30, it has a shortcoming in that the distance between the first optical path conversion member 40 and the light source is increased, and thus the overall length of the light emitting module 10 is increased.

Therefore, the first optical path conversion member 40 is located eccentrically from the central axis Ax1 of the condensing lens 30 in the vertical direction (the direction of Z-axis and −Z-axis). Of course, the first optical path conversion member 40 may be located eccentrically from the central axis Ax1 of the condensing lens 30 in the horizontal direction (the direction of Y-axis and −Y-axis). Alternatively, the first optical path conversion member 40 may be located so as to overlap the central axis Ax1 of the condensing lens 30 when viewed in the vertical direction.

It is preferable that the first optical path conversion member 40 is disposed at a position spaced apart from the central axis Ax1 of the condensing lens 30 in the first direction (direction of Z-axis) which is perpendicular to the central axis Ax1 of the condensing lens 30.

For example, the first optical path conversion member 40 includes a reflection layer which has a reflection surface intersecting the optical axis. Here, the reflection layer may be made from a material having a good reflection property, for example, a material selected from the group consisting of Ag, Ni, Al, Rh, Pd, Ir, Ru, Mg, Zn, Pt, Au, Hf, and a combination thereof.

The reflection layer may have a structure in which a plurality of layers having different refractive indexes is alternately stacked.

The wavelength conversion unit 50 is disposed behind the condensing lens 30, reflects the first reflected light 22 having passed through the condensing lens 30, and supplies the second reflected light 23 to the condensing lens 30.

The wavelength conversion unit 50 may function only to reflect the light, or to convert a wavelength of the light while reflecting the light. For example, the wavelength conversion unit 50 may convert the wavelength of the blue-based light emitted from the light source 20 and generate white-based light. The detailed structure of the wavelength conversion unit 50 will be described later. According to the purpose of the light emitting module 10, the wavelength conversion unit 50 may be structured only to reflect the light, or to convert the wavelength of the light during the reflection. Accordingly, the second reflected light 23 reflected from the wavelength conversion unit 50 may have a wavelength that is different from that of the first reflected light 22.

The wavelength conversion unit 50 is disposed behind the condensing lens 30, and supplies the second reflected light 23 to the condensing lens 30.

The first reflected light 22, which is incident on the front surface 31 of the condensing lens 30 from the first optical path conversion member 40, is refracted at the boundary surfaces of the condensing lens 30, and is radiated from the rear surface 32 of the second region of the condensing lens 30. The first reflected light 22, having passed through the condensing lens 30, is incident on the wavelength conversion unit 50, and is reflected as the second reflected light 23 from the wavelength conversion unit 50. The second reflected light 23 is incident on a region of the rear surface 32 that is eccentric from the central axis Ax1 of the condensing lens 30. In detail, the second reflected light 23 is incident on the second region of the rear surface 32 of the condensing lens 30. The second reflected light 23, which is incident on the condensing lens 30, is refracted at the boundary surfaces of the condensing lens 30, and is radiated to the front through the front surface 31 of the condensing lens 30. The second reflected light 23 is radiated from the second region of the front surface 31 of the condensing lens 30.

The reflection property of light will now be described as follows.

Light may be specularly reflected or diffusely reflected based on the surface property of the reflector.

Diffuse reflection may include Gaussian reflection, Lambertian reflection, and mixed reflection.

In general, specular reflection is reflection in which, when light is incident on a point of the reflector, an angle between a normal line passing the point and an optical axis of the incident light is equal to an angle between the normal line and an optical axis of reflected light.

Gaussian reflection is reflection in which intensity of reflected light based on an angle at the surface of the reflector and an angle between a normal line and the reflected light vary according to values of a Gaussian function.

Lambertian reflection is reflection in which intensity of reflected light based on an angle at the surface of the reflector and an angle between a normal line and the reflected light vary according to values of a cosine function.

The mixed reflection includes at least one selected from among specular reflection, Gaussian reflection and Lambertian reflection.

In one embodiment, the first optical path conversion member 40 specularly reflects light for light focusing. In the case in which the wavelength conversion unit 50 functions only to reflect light, the wavelength conversion unit 50 specularly reflects light.

In another embodiment, in the case in which the wavelength conversion unit 50 is configured to perform both reflection and wavelength conversion, the wavelength conversion unit 50 has a structure including a reflection layer and a phosphor layer coated on the reflection layer. When the wavelength conversion unit 50 performs reflection and wavelength conversion, the second reflected light 23 from the wavelength conversion unit 50 undergoes Lambertian reflection or mixed reflection. Accordingly, when the wavelength conversion unit 50 performs reflection and wavelength conversion, the second reflected light 23 is radiated ahead of the optical axis Ax. In other words, the second reflected light 23 becomes fan-shaped light which is directed at a predetermined angle in upper and lower directions based on an arbitrary line parallel to the central axis Ax1 of the condensing lens 30.

Preferably, the reflection surface of the wavelength conversion unit 50 is arranged perpendicular to the central axis Ax1 of the condensing lens 30.

The second reflected light 23 is incident on the second region of the rear surface 32 of the condensing lens 30, is refracted at the boundary surfaces of the condensing lens 30, and is radiated from the condensing lens 30. The second reflected light 23 having passed through the condensing lens 30 has a smaller radiation angle than the second reflected light 23 that is incident into the condensing lens 30.

Accordingly, the second reflected light 23 having passed through the condensing lens 30 is diffused while having a certain degree of straightness. Such second reflected light 23 may be used as a low beam in a lamp device for vehicles, which illuminates a region spaced apart by a short distance.

The wavelength conversion unit 50 is located eccentrically from the central axis Ax1 of the condensing lens 30 in the vertical direction (the direction of Z-axis and −Z-axis). Of course, the wavelength conversion unit 50 may be located eccentrically from the central axis Ax1 of the condensing lens 30 in the horizontal direction (the direction of Y-axis and −Y-axis). Alternatively, the wavelength conversion unit 50 may be located so as to overlap the central axis Ax1 of the condensing lens 30 when viewed in the vertical direction.

Specifically, the wavelength conversion unit 50 is disposed spaced apart from the central axis Ax1 of the condensing lens 30 in the second direction (direction of −Z-axis) which is perpendicular to the central axis Ax1 of the condensing lens 30. The wavelength conversion unit 50 is located opposite the light source 20 across the central axis Ax1 of the condensing lens 30.

An auxiliary condensing lens 60 functions to concentrate light incident from the rear of the optical axis in the forward direction of the optical axis. The auxiliary condensing lens 60 refracts the incident light due to the shape of the auxiliary condensing lens 60 and the difference in refractive index between the auxiliary condensing lens 60 and the outside. The refractive index of the auxiliary condensing lens 60 may be greater than 1, and may preferably range from 1.5 to 1.6.

The auxiliary condensing lens 60 is decentered with respect to the central axis Ax1 of the condensing lens 30. In particular, the central axis Ax2 of the auxiliary condensing lens 60 is decentered with respect to the central axis Ax1 of the condensing lens 30.

The central axis Ax2 of the auxiliary condensing lens 60 is decentered in the vertical direction (direction of Z-axis/−Z-axis) with respect to the central axis Ax1 of the condensing lens 30. Of course, the central axis Ax2 of the auxiliary condensing lens 60 may be decentered in the horizontal direction (direction of Y-axis/−Y-axis) with respect to the central axis Ax1 of the condensing lens 30, or may be located so as to overlap the central axis Ax1 of the condensing lens 30 when viewed in the vertical direction. In particular, the central axis Ax2 of the auxiliary condensing lens 60 is decentered in the second direction (direction of −Z-axis) with respect to the central axis Ax1 of the condensing lens 30.

Also, the central axis Ax2 of the auxiliary condensing lens 60 may be located within the second region of the condensing lens 30. Preferably, the central axis Ax2 of the auxiliary condensing lens 60 is located parallel to the central axis Ax1 of the condensing lens 30.

The light incident into the auxiliary condensing lens 60 from the rear is refracted at the boundary surfaces of the auxiliary condensing lens 60, and is radiated parallel to the optical axis.

The light, whose wavelength is converted and which is reflected from the wavelength conversion unit 50, is incident into the auxiliary condensing lens 60, similar to the light incident from the focal point position of the auxiliary condensing lens 60, and is therefore efficiently converted into light parallel to the optical axis. The auxiliary condensing lens 60 may be made from the same material as the condensing lens 30.

However, when the second reflected light 23 is incident into the auxiliary condensing lens 60, off-axis aberration occurs, since the light is incident eccentrically with respect to the central axis of the condensing lens 30.

Therefore, the auxiliary condensing lens 60 has a structure for removing the off-axis aberration while concentrating the incident light. The detailed structure of the auxiliary condensing lens 60 will be described hereinafter.

Figure 3:
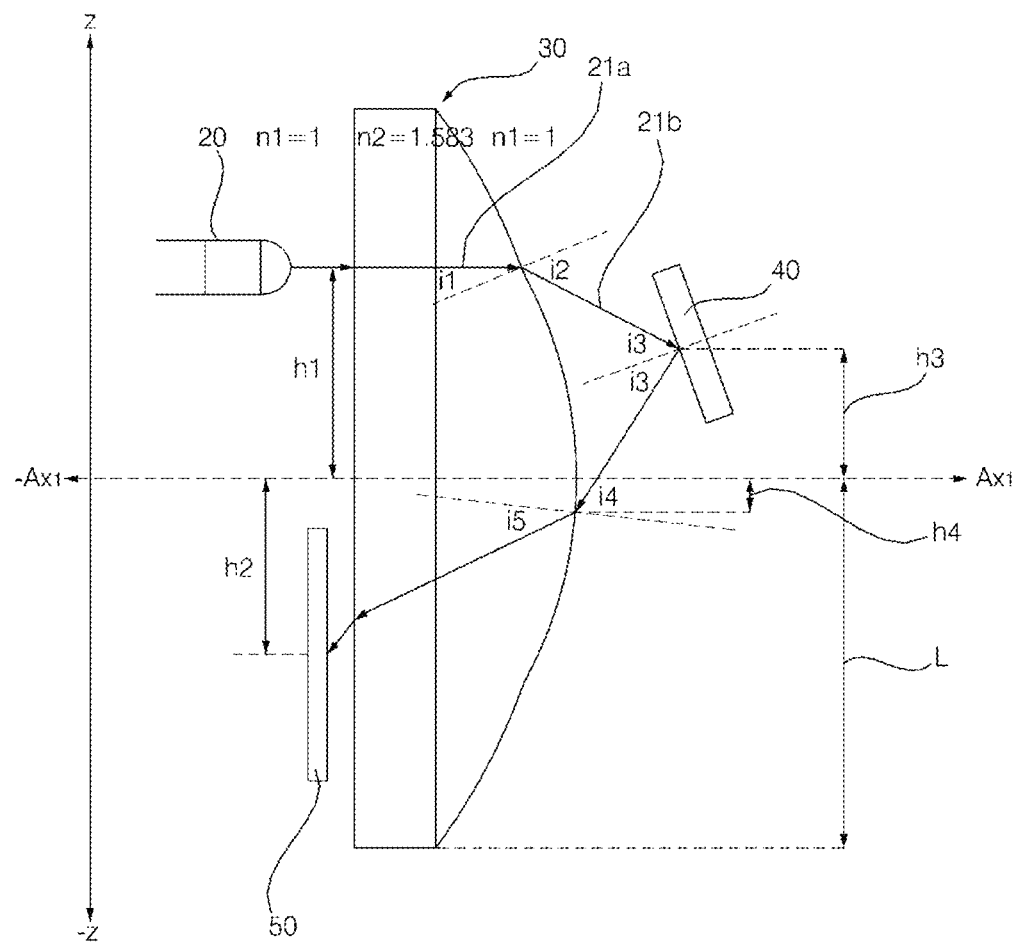
FIGS. 3 and 4 are reference views for explaining refraction and reflection of the light emitting module according to the embodiment of the present invention.
Figure 4:
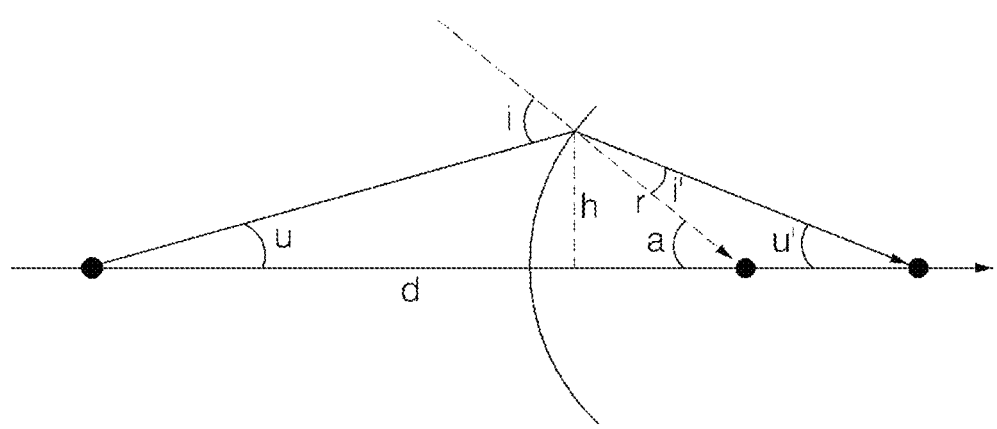

FIGS. 3 and 4 are reference views for explaining refraction and reflection of the light emitting module 10 according to the embodiment of the present invention.

First, referring to FIG. 4, Snell's law related to light refraction is as follows.

$$n \sin i = n' \sin i'$$

A refraction formula is deduced by transforming Snell's law as follows.

$$ni \cong n'i'$$
$$n(\alpha - u) = n'(\alpha - u')$$
$$n\left(\frac{h}{r} - u\right) = n'\left(\frac{h}{r} - u'\right)$$
$$n'u' = nu + \frac{h}{r}(n' - n)$$

Where n refers to a refractive index of a medium before refraction, n' refers to a refractive index of the medium after refraction, i refers to an angle between a plane onto which light is incident and a vertical plane, and i' refers to an angle between radiated light and the vertical plane.

Using the above refraction formula, a distance h of each component from the central axis Ax1 of the condensing lens 30 can be calculated as follows.

$$n'u' = nu + \frac{h}{r}(n' - m) \Rightarrow h = \frac{r(n'u' - nu)}{(n' - n)}$$

Where r refers to a radius of curvature of the lens.

The condensing lens 30 in this embodiment is embodied as an aspherical lens, in which a radius of curvature of a center portion is smaller than that of an edge portion.

When observed from the front of the central axis Ax1 of the condensing lens 30, the light source 20, the first optical path conversion member 40 and the wavelength conversion unit 50 are disposed at positions that overlap the condensing lens 30. Therefore, the housing accommodating the light emitting module 10 may be reduced to the size of the condensing lens 30.

In detail, a first distance h1 between the central axis Ax1 of the condensing lens 30 and the light source 20 is smaller than a radius L of the condensing lens 30. Here, the first distance h1 is calculated using the above-mentioned distance calculation formula.

A second distance h2 between the central axis Ax1 of the condensing lens 30 and the wavelength conversion unit 50 is smaller than the radius L of the condensing lens 30. Of course, the second distance h2 is also calculated using the above-mentioned distance calculation formula. The wavelength conversion unit 50 is located behind the condensing lens 30, and more precisely, at a position adjacent to the rear surface 32 of the condensing lens 30.

Preferably, the first distance h1 of the light source 20 and the second distance h2 of the wavelength conversion unit 50 may be equal. More preferably, a ratio of the first distance h1 to the second distance h2 may be in the range of 1:0.7 to 1:1.1. Much more preferably, the ratio of the first distance h1 to the second distance h2 may be in the range of 1:0.94 to 1:0.98.

A third distance h3 between the central axis Ax1 of the condensing lens 30 and the first optical path conversion member 40 is greater than 0 and smaller than the radius L of the condensing lens 30. Of course, the third distance h3 is also calculated using the above-mentioned distance calculation formula. Preferably, a ratio of the first distance h1 to the third distance h3 may be in the range of 1:0.5 to 1:0.9. More preferably, the ratio of the first distance h1 to the third distance h3 may be in the range of 1:0.6 to 1:0.8.

A fourth distance h4 between the central axis Ax1 of the condensing lens 30 and the spot of incidence of the first reflected light 22 may be smaller than the first distance h1 or the second distance h2. Preferably, a ratio of the first distance h1 of the light source 20 to the fourth distance h4 of the spot of incidence may be in the range of 1:0.1 to 1:0.6. More preferably, the ratio of the first distance h1 of the light source 20 to the fourth distance h4 of the spot of incidence may be in the range of 1:0.35 to 1:0.37.

For convenience of assembly, the light emitting module 10 is generally accommodated in a hexahedron-shaped housing. By disposing the light source 20 at the upper portion behind the condensing lens 30 and disposing the wavelength conversion unit 50 at the lower portion behind the condensing lens 30, the length of the light emitting module 10 may be reduced, and space utilization may be maximized. As a result, the light emitting module 10 may be easily accommodated in the housing.

Further, by disposing the auxiliary condensing lens 60 at the lower portion in front of the condensing lens 30 and disposing the first optical path conversion member 40 at the upper portion in front of the condensing lens 30, the length of the light emitting module 10 may be reduced, and space utilization may be maximized, so that the light emitting module 10 can be easily accommodated in the housing.

Figure 5A:
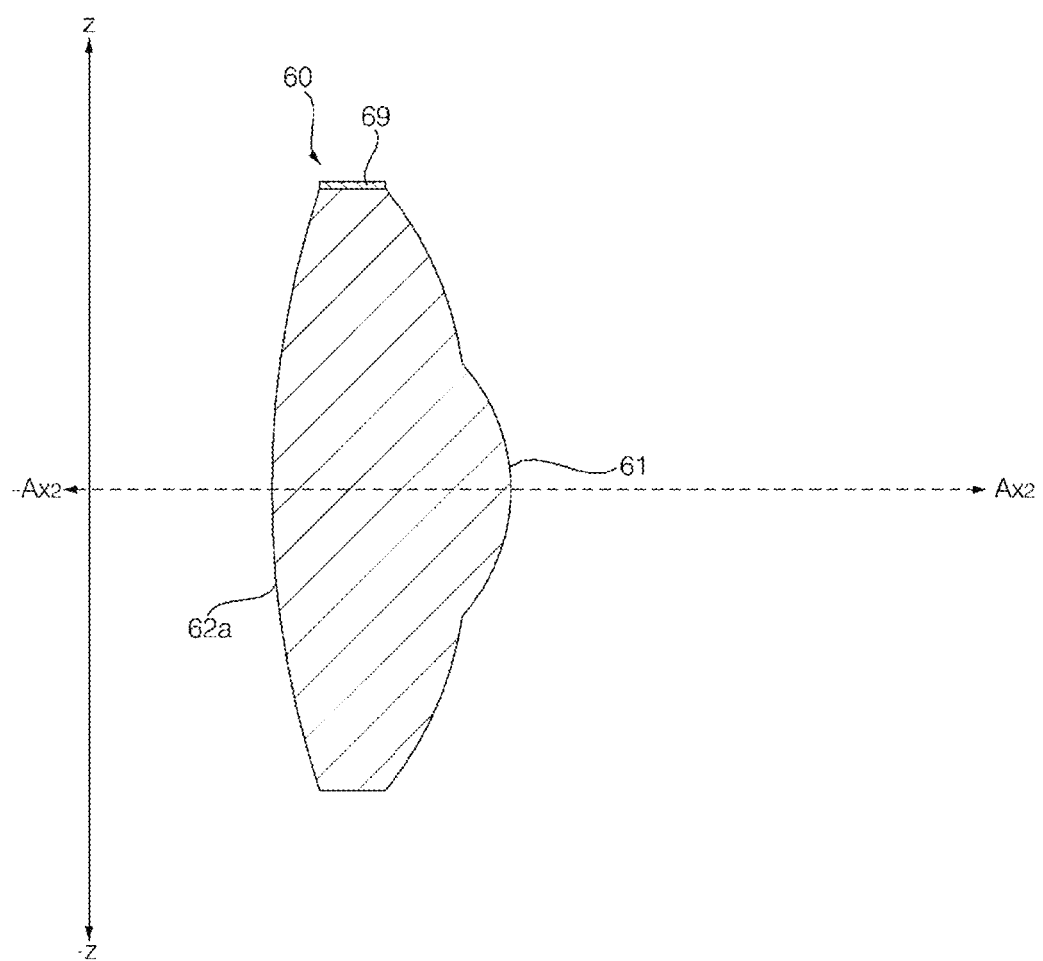
FIG. 5A is a longitudinal sectional view cut through an auxiliary condensing lens according to an embodiment of the present invention in the vertical direction.
Figure 5B:
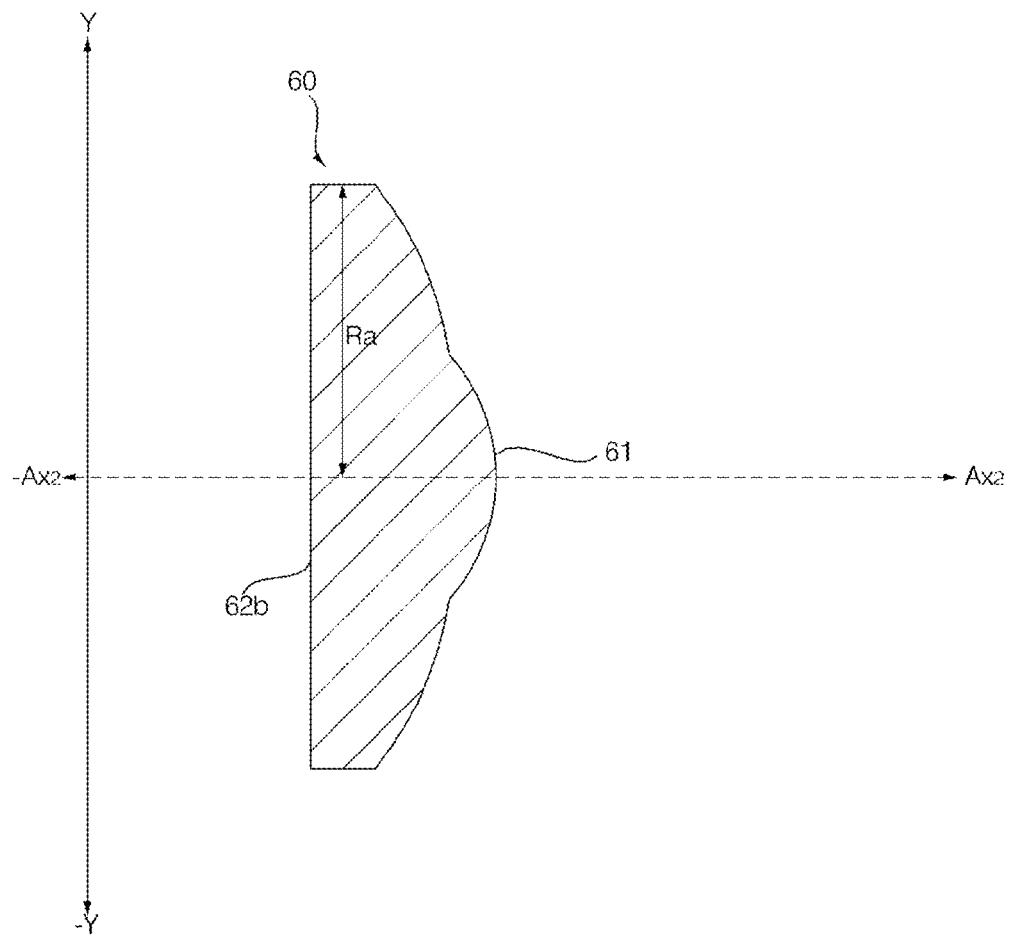
FIG. 5B is a cross sectional view cut through the auxiliary condensing lens according to the embodiment of the present invention in the horizontal direction.

FIG. 5A is a longitudinal sectional view cut through an auxiliary condensing lens according to an embodiment of the present invention in the vertical direction, and FIG. 5B is a cross sectional view cut through the auxiliary condensing lens according to the embodiment of the present invention in the horizontal direction. Preferably, the central axis Ax2 of the auxiliary condensing lens 60 lies in the longitudinal section and the cross section of the auxiliary condensing lens.

Referring to FIGS. 1 and 5, the auxiliary condensing lens 60 includes a first refractive surface 62a and 62b and a second refractive surface 61 to mitigate off-axis aberration and concentrate light in the forward direction.

The first refractive surface 62a and 62b is the surface of the auxiliary condensing lens 60 that is exposed toward the condensing lens 30. The first refractive surface 62a and 62b defines the rear surface of the auxiliary condensing lens 60. The first refractive surface 62a and 62b is disposed opposite to the second refractive surface 61. The shape of the first refractive surface 62a and 62b is different from that of the second refractive surface 61.

The first refractive surface 62a and 62b also acts as a boundary surface with respect to the outside of the auxiliary condensing lens 60, on which the second reflected light 23 is incident. The second reflected light 23 is refracted at the first refractive surface 62a and 62b. The first refractive surface 62a and 62b has a shape that compensates for off-axis aberration.

The first refractive surface 62a and 62b includes different refractive sections. Specifically, the first refractive surface 62a and 62b includes a vertical refractive section 62a and a horizontal refractive section 62b when viewed from different directions. The vertical refractive section 62a, as shown in FIG. 5A, is a section observed in a longitudinal section cut through the auxiliary condensing lens 60 in the vertical direction. The horizontal refractive section 62b, as shown in FIG. 5B, is a section observed in a cross-section cut through the auxiliary condensing lens 60 in the horizontal direction.

In order to compensate for off-axis aberration, the vertical refractive section 62a and the horizontal refractive section 62b may have different shapes from each other. In an example, the vertical refractive section 62a is curved with a predetermined radius of curvature, and the horizontal refractive section 62b is flat.

In particular, the horizontal refractive section 62b may be substantially flat, or may be curved with a very large radius of curvature. The vertical refractive section 62a may be convex toward the rear of the auxiliary condensing lens 60. The center of curvature of the vertical refractive section 62a is located in front of the auxiliary condensing lens 60.

In another example, the vertical refractive section 62a and the horizontal refractive section 62b may be curved with different radii of curvature. In particular, the radius of curvature of the vertical refractive section 62a is less than that of the horizontal refractive section 62b. More particularly, the radius of curvature of the horizontal refractive section 62b is 5 times or more of that of the vertical refractive section 62a.

The centers of curvature of the horizontal refractive section 62b and the vertical refractive section 62a are located in front of the auxiliary condensing lens 60. Preferably, the centers of curvature of the horizontal refractive section 62b and the vertical refractive section 62a are located on the central axis Ax1 of the condensing lens 30 in front of the auxiliary condensing lens 60.

Described in detail, the first refractive surface 62a and 62b is, overall, shaped as a segment of a toroid having a central axis that extends in the horizontal direction. That is, the first refractive surface 62a and 62b of the auxiliary condensing lens 60 is curved in the vertical direction, thereby compensating for off-axis aberration occurring in the vertical direction.

Preferably, the radius of curvature of the vertical refractive section 62a is 8 to 15 times the radius Ra of the auxiliary condensing lens 60. The vertical refractive section 62a may be a curve whose vertex is on the central axis Ax2 of the auxiliary condensing lens 60.

The second refractive surface 61 is the surface of the auxiliary condensing lens 60 that is exposed to the front of the auxiliary condensing lens 60. The second refractive surface 61 defines the front surface of the auxiliary condensing lens 60. The second refractive surface 61 is disposed opposite to the first refractive surface 62a and 62b.

The second refractive surface 61 also acts as a boundary surface with respect to the outside of the auxiliary condensing lens 60, from which the second reflected light 23 is radiated. The second reflected light 23 is refracted at the second refractive surface 61. The second refractive surface 61 has a shape that concentrates light.

In an example, the second refractive surface 61 of the auxiliary condensing lens 60 has a spherical or aspherical shape. Particularly, the second refractive surface 61 has a shape that is symmetric in the horizontal direction and the vertical direction.

More particularly, the second refractive surface 61 may be convex in the forward direction. Preferably, the second refractive surface 61 may be a curve whose vertex is on the central axis Ax2 of the auxiliary condensing lens 60. More preferably, the second refractive surface 61 may be configured as a combination of curves having centers of curvature located at the rear of the auxiliary condensing lens 60 and different radii of curvature. The radius of curvature of the center portion in the second refractive surface 61 may be less than that of the peripheral portion in the second refractive surface 61.

In addition, the light emitting module according to this embodiment may further include a wavelength conversion coating layer 69 configured to surround a portion of the edge of the auxiliary condensing lens 60. The wavelength conversion coating layer 69 is disposed so as to cover the upper part of the vertical section of the auxiliary condensing lens 60. The wavelength conversion coating layer 69 contains a phosphor to limit the emission of unconverted blue light to the wavelength conversion unit 50.

The kind of the phosphor is selected based on the wavelength of light that is emitted from the light source 20 such that light radiated from the wavelength conversion coating layer 69 becomes white light.

Figure 6A:
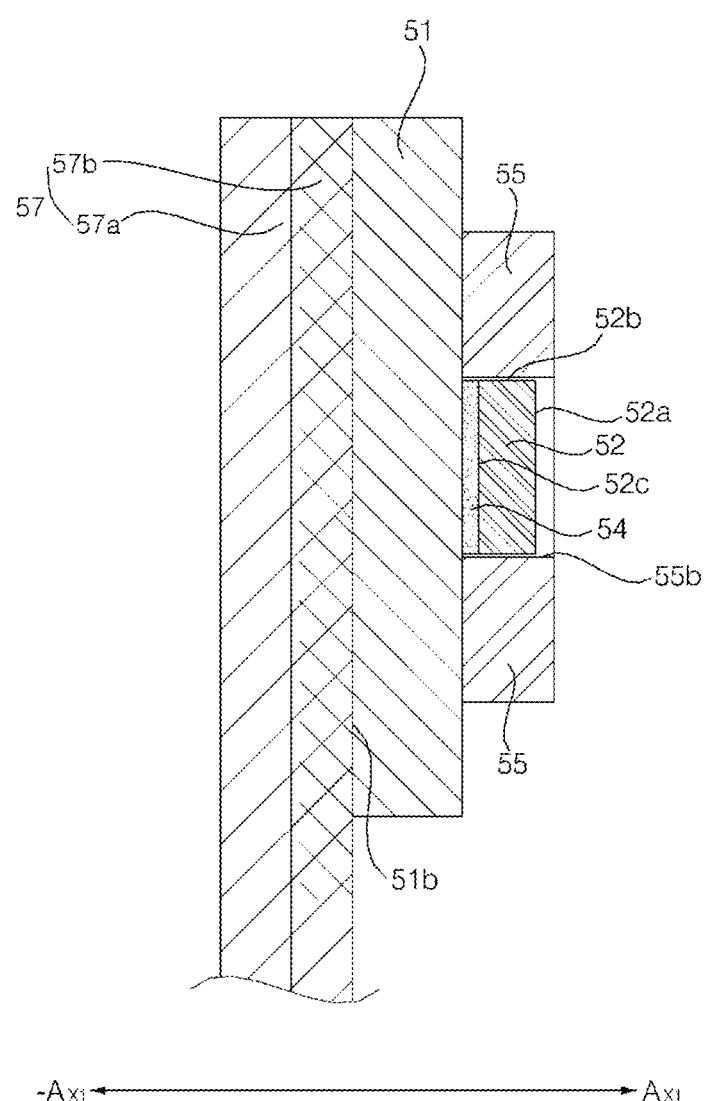
FIG. 6A is a sectional view of a wavelength conversion unit according to an embodiment of the present invention.
Figure 6B:
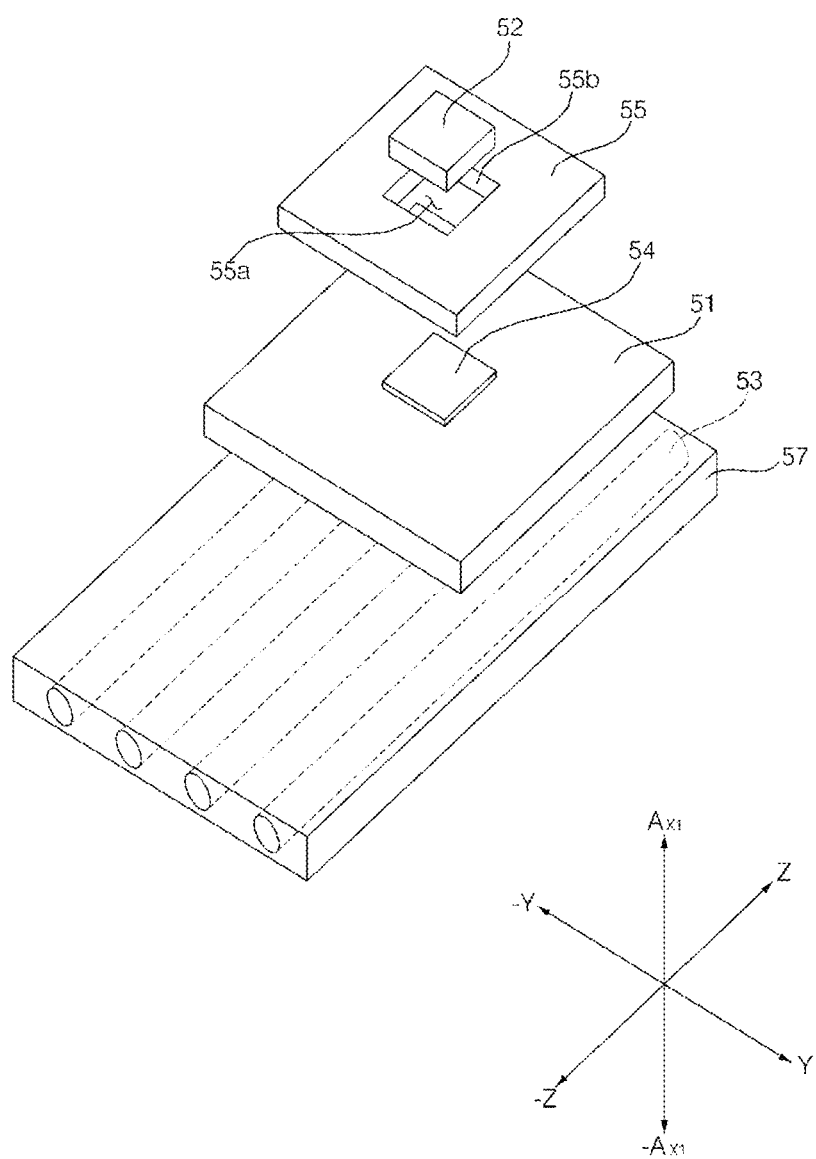
FIG. 6B is an exploded perspective view of the wavelength conversion unit according to the embodiment of the present invention.

FIG. 6A is a sectional view of a wavelength conversion unit according to an embodiment of the present invention, and FIG. 6B is an exploded perspective view of the wavelength conversion unit according to the embodiment of the present invention.

Referring to FIGS. 6A and 6B, a wavelength conversion unit 50 according to an embodiment of the present invention includes a reflection plate 51 having a reflection surface 51a for reflecting incident light, a wavelength conversion device 52 supported by the reflection surface 51a of the reflection plate 51 for absorbing a portion of the incident light and converting the wavelength of the absorbed light, and a side wall 55 supported by the reflection surface 51a of the reflection plate 51, the side wall 55 being disposed so as to surround the wavelength conversion device 52.

The reflection plate 51 reflects incident light. The reflection plate 51 supports at least the wavelength conversion device 52. In addition, the reflection plate 51 defines a space in which the side wall 55 is supported.

The reflection plate 51 has a reflection surface 51a for reflecting incident light and a heat conduction surface 51b disposed opposite to the reflection surface 51a.

The reflection surface 51a reflects light incident from the light source 20, and reflects light the wavelength of which has been converted by the wavelength conversion device 52. Specifically, the reflection surface 51a of the reflection plate 51 reflects light radiated from the condensing lens 30 and light the wavelength of which has been converted by the wavelength conversion device 52 such that they are incident on the second region of the rear surface 32 of the condensing lens 30.

The reflection surface 51a may be made of a material having a good reflection property, for example, a material selected from the group consisting of Ag, Ni, Al, Rh, Pd, Ir, Ru, Mg, Zn, Pt, Au, Hf, and a combination thereof. The reflection surface 51a may be made of a material identical to or different from that of the reflection plate 51. The reflection plate 51 may be made of aluminum, which exhibits high thermal conductivity and a good reflection property. The reflection surface 51a has an area sufficient to support at least the wavelength conversion device 52 and the side wall 55.

The reflection surface 51a of the reflection plate 51 defines a surface intersecting an arbitrary line that is parallel to the central axis Ax1 of the condensing lens 30. The reflection surface 51a of the reflection plate 51 has various shapes in consideration of the convergence and diffusion of light that is reflected by and thus radiated from the reflection surface 51a. Specifically, the reflection surface 51a of the reflection plate 51 includes a spherical surface, a curved surface, or a flat surface intersecting an arbitrary line that is parallel to the central axis Ax1 of the condensing lens 30.

More specifically, the reflection surface 51a of the reflection plate 51 is disposed perpendicular to the central axis Ax1 of the condensing lens 30. In this case, the reflection surface 51a of the reflection plate 51 is flat.

A heat sink is disposed in contact with the heat conduction surface 51b of the reflection plate 51, which is disposed opposite to the reflection surface 51a. The heat sink absorbs heat generated from the reflection plate 51 or dissipates heat generated from the reflection plate 51 to the outside.

In an example, the heat sink may include a plurality of heat dissipation fins, which have large contact area with external air. In another example, as shown in FIG. 6B, the heat sink may include a heat pipe 53 for absorbing heat and a plurality of heat dissipation fins (not shown) connected to the heat pipe 53. The heat pipe 53 may be embedded in a support member 57.

The support member 57 is formed to have a plate shape having a predetermined area. The support member 57 may have a single-layered structure or a multi-layered structure. The support member 57 has a sufficient area to support at least the reflection plate 51. One surface of the support member 57 is in surface contact with the heat conduction surface 51b of the reflection plate 51. In addition, the heat dissipation fins are connected to one side of the support member 57 in order to dissipate heat generated from the reflection plate 51 to the outside.

In an embodiment, the support member 57 includes a metal layer 57a, which exhibits high thermal conductivity.

The metal layer 57a is a base layer having high heat dissipation and supportability. For example, the metal layer 57a may be constituted by at least one selected from between a metal film and a metal mesh. Specifically, the metal layer 57a may be constituted by a metal film or a metal mesh or by stacking the metal film and the metal mesh. The metal layer 57a may be constituted by a metal film. The kind of metal constituting the metal layer 57a is not particularly restricted so long as the metal layer 57a is made of a metal material that exhibits high thermal conductivity.

Although the metal constituting the metal layer 57a is not particularly restricted, the metal layer 57a may be made of a metal material having a thermal conductivity of 3 W/mK to 420 W/mK.

In a concrete example, the metal layer 57a may be made of one (a single metal) selected from a group consisting of aluminum (Al), gold (Au), silver (Ag), copper (Cu), nickel (Ni), tin (Sn), zinc (Zn), tungsten (W), and iron (Fe), or an alloy (e.g. stainless steel) of at least two selected therefrom. In consideration of weight and cost, the metal layer 57a may be made of aluminum (Al) or an aluminum (Al) alloy.

In addition, although the thickness of the metal layer 57a is not particularly restricted, the metal layer 57a may have a thickness of 0.5 mm to 20 mm. If the thickness of the metal layer 57a is less than 0.5 mm, the heat dissipation and supportability of the metal layer 57a may be low. If the thickness of the metal layer 57a is greater than 20 mm, the manufacturing cost of the metal layer 57a may be high.

In another embodiment, the support member 57 includes a metal layer 57a and an organic material layer 57b stacked on the metal layer 57a.

The organic material layer 57b may exhibit high thermal conductivity. Specifically, the organic material layer 57b may exhibit higher thermal conductivity than the metal layer 57a. The organic material layer 57b contains an organic material. The organic material may be a carbon material. The carbon material may be at least one selected from a group consisting of graphite, graphene, carbon nano tube (CNT), and carbon nano fiber (CNF). Although the particle size of the organic material is not particularly restricted, the organic material may have a particle size of 200 μm or less, specifically 5 nm to 200 μm. Although the thermal conductivity of the organic material is not particularly restricted, the organic material may have a thermal conductivity of 3 W/mK or higher.

The heat pipe 53 is embedded in the support member 57 to absorb heat from the reflection plate 51 and/or the support member 57. The heat pipe 53 may be in surface contact with the heat conduction surface 51b of the reflection plate 51. In addition, the heat pipe 53 may be in contact with the support member 57. The heat pipe 53 may be flat. One surface of the heat pipe 53 may be in contact with the heat conduction surface 51b of the reflection plate 51, and the other surface of the heat pipe 53 may be in contact with the support member 57.

The heat pipe 53 may be made of a metal or resin material that exhibits high thermal conductivity. Specifically, the heat pipe 53 may be formed to have a pipe shape having an empty space defined therein. Working liquid for absorbing heat may be received in the space defined in the heat pipe 53.

The working liquid functions as a refrigerant for absorbing heat. For example, the working liquid may include water or oil.

The side wall 55 guides light reflected by the reflection plate 51 and light the wavelength of which has been converted by the wavelength conversion device 52 such that they are radiated from the second region of the rear surface 32 of the condensing lens 30.

Specifically, the side wall 55 is supported by the reflection surface 51a of the reflection plate 51, and is disposed so as to surround the wavelength conversion device 52.

The side wall 55 is provided with a reflection side surface 55b for reflecting light. The reflection side surface 55b may be made of a material having a good reflection property, for example, a material selected from the group consisting of Ag, Ni, Al, Rh, Pd, Ir, Ru, Mg, Zn, Pt, Au, Hf, and a combination thereof. The reflection side surface 55b may be made of a material identical to or different from that of the side wall 55. The side wall 55 may be made of aluminum, which exhibits high thermal conductivity and a good reflection property.

The reflection side surface 55b of the side wall 55 defines a closed curved line or a closed space on a surface intersecting an arbitrary line that is parallel to the central axis Ax1 of the condensing lens 30. The space surrounded by the reflection side surface 55b of the side wall 55 is defined as a receiving hole 55a. The wavelength conversion device 52 is received in the receiving hole 55a.

The reflection side surface 55b of the side wall 55 is formed so as to intersect the reflection surface 51a and/or an arbitrary line that is parallel to the reflection surface 51a. Specifically, the reflection side surface 55b of the side wall 55 is disposed parallel to the central axis Ax1 of the condensing lens 30. More specifically, the section of the reflection side surface 55b of the side wall 55 that is parallel to the central axis Ax1 of the condensing lens 30 has a shape such that the sectional area of the receiving hole 55a gradually increases toward the front of the optical axis Ax. The reflection side surface 55b of the side wall 55 is disposed so as to surround a light radiation surface 52a of the wavelength conversion device 52 and/or a side surface 52b intersecting an arbitrary line that is parallel to the light radiation surface 52a.

In a case in which the reflection side surface 55b of the side wall 55 is formed parallel to the central axis Ax1 of the condensing lens 30, light radiated from the wavelength conversion unit is incident on a single spot of the condensing lens 30 in a relatively concentrated state. On the other hand, in a case in which the reflection side surface 55b of the side wall 55 is formed such that the sectional area of the receiving hole 55a gradually increases toward the front of the optical axis Ax, light radiated from the wavelength conversion unit is incident on a single spot of the condensing lens 30 in a relatively diffused state.

The wavelength conversion device 52 absorbs a portion of the incident light and converts the wavelength of the absorbed light. Specifically, blue-based light is incident on the wavelength conversion device 52 and is converted into white-based light.

For example, the wavelength conversion device 52 may be formed in a plate shape. Specifically, the wavelength conversion device 52 may include a ceramic phosphor, such as yellow opto-ceramic, which has higher thermal stability than a conventional phosphor. More specifically, the wavelength conversion device 52 may include at least one selected from among $Y_3Al_5O_{12}:Ce^{3+}$(YAG), $(Y,Gd)_3Al_5O_{12}:Ce^{3+}$, $Y_3(Al,Ga)_5O_{12}:Ce^{3+}$, $Lu_3Al_5O_{12}:Ce^{3+}$, $(Lu,Gd)_3Al_5O_{12}:Ce^{3+}$, and $Lu_3(Al,Ga)_5O_{12}:Ce^{3+}$. The composition of the wavelength conversion device 52 will be described hereinafter in detail.

The wavelength conversion device 52 is located more forward on the optical axis than the reflection plate 51. Accordingly, the wavelength of the first reflected light 22, which is incident on the wavelength conversion device 52, is converted while passing through the wavelength conversion device 52, and the first reflected light 22 is reflected from the reflection plate 51 and converted into the second reflected light 23, which will subsequently pass through the condensing lens 30.

The wavelength conversion device 52 is supported by the reflection surface 51a of the reflection plate 51. Specifically, the wavelength conversion device 52 has a contact surface 52c, which is thermally connected to the reflection surface 51a of the reflection plate 51, and a light radiation surface 52a disposed opposite to the contact surface 52c, from which light which has been incident on the wavelength conversion device 52 and the wavelength of which has been converted by the wavelength conversion device 52 is radiated.

The wavelength conversion device 52 is disposed in surface contact with the reflection surface 51a of the reflection plate 51. Specifically, the contact surface 52c of the wavelength conversion device 52 is disposed in surface contact with the reflection surface 51a of the reflection plate 51 such that heat from the wavelength conversion device 52 can be efficiently transferred to the reflection plate 51.

In order to improve thermal conductivity and adhesiveness between the wavelength conversion device 52 and the reflection plate 51, a thermally conductive adhesive 54 is disposed between the wavelength conversion device 52 and the reflection plate 51.

The thermally conductive adhesive 54 is made of a material that exhibits high thermal conductivity and adhesiveness.

For example, the thermally conductive adhesive may include a thermally conductive organic material and a binder. The thermally conductive organic material is used for heat dissipation, and the binder improves the coupling between organic material particles and between the organic material and the reflection plate 51 or the wavelength conversion device 52.

The organic material may be a carbon material. The carbon material may be at least one selected from a group consisting of graphite, graphene, carbon nano tube (CNT), and carbon nano fiber (CNF). Although the particle size of the organic material is not particularly restricted, the organic material may have a particle size of 200 μm or less, specifically 5 nm to 200 μm.

The material of the binder is not particularly restricted so long as the binder exhibits high adhesiveness. The binder may be made of a natural resin or a synthetic resin. Specifically, the binder may be made of at least one selected from among an acrylic resin, an epoxy resin, a urethane resin, and a urea resin.

Figure 6C:
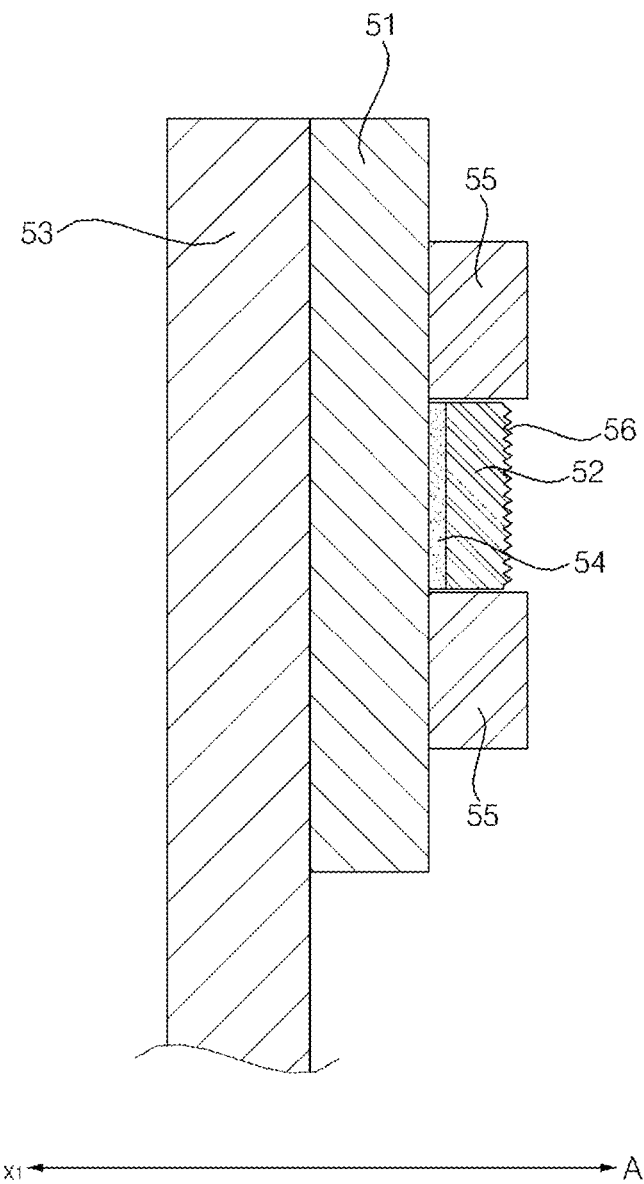
FIG. 6C is a sectional view of a wavelength conversion unit according to another embodiment of the present invention.

FIG. 6C is a sectional view of a wavelength conversion unit according to another embodiment of the present invention.

Referring to FIG. 6C, the wavelength conversion unit according to this embodiment shown in FIG. 6C is different from the wavelength conversion unit of the previous embodiment shown in FIG. 6A in that the shape of the wavelength conversion device 52 according to this embodiment is different from that of the wavelength conversion device 52 according to previous embodiment shown in FIG. 6A.

In this embodiment, the wavelength conversion device 52 further includes a concave and convex pattern 56 formed on the light radiation surface 52a.

The wavelength conversion device 52 is made of a material having a refractive index than that of air. For example, the wavelength conversion device 52 has a refractive index of about 1.8 to 1.9. Consequently, a portion of light the wavelength of which is converted by the wavelength conversion device 52 or light which is reflected by the reflection surface 51a of the reflection plate 51 and passes through the wavelength conversion device 52 is totally reflected due to the difference in refractive index at the boundary surface (the light radiation surface 52a) of the wavelength conversion device 52. The total reflection on the light radiation surface 52a of the wavelength conversion device 52 extremely reduces light efficiency of the light emitting module.

In order to reduce the total reflection, therefore, a structure for improving light extraction efficiency is formed at the light radiation surface 52a of the wavelength conversion device 52. For example, the concave and convex pattern 56 is formed on the light radiation surface 52a of the wavelength conversion device 52.

The concave and convex pattern 56 includes an uneven surface (as compared with the reflection surface 51a of the reflection plate 51). Specifically, the concave and convex pattern 56 is formed such that the light radiation surface 52a of the wavelength conversion device 52 has a surface that is not parallel to the reflection surface 51a of the reflection plate 51.

For example, the concave and convex pattern 56 may be formed to have various shapes, such as a cylindrical shape, a prism shape, a conical shape, a pyramidal shape, a truncated conical shape, and a truncated pyramidal shape, in section. Preferably, the concave and convex pattern 56 is formed to have a conical shape or a pyramidal shape in section.

The concave and convex pattern 56 may be formed by etching the light radiation surface 52a of the wavelength conversion device 52. However, the present invention is not limited thereto. The light radiation surface 52a of the wavelength conversion device 52 may be etched by wet etching and/or dry etching.

The concave and convex pattern 56 prevents light reflected by the reflection surface 51a of the reflection plate 51 from being totally reflected by the light radiation surface 52a of the wavelength conversion device 52 with the result that the light is reabsorbed or scattered, thereby improving light extraction efficiency of the light emitting module.

Figure 6D:
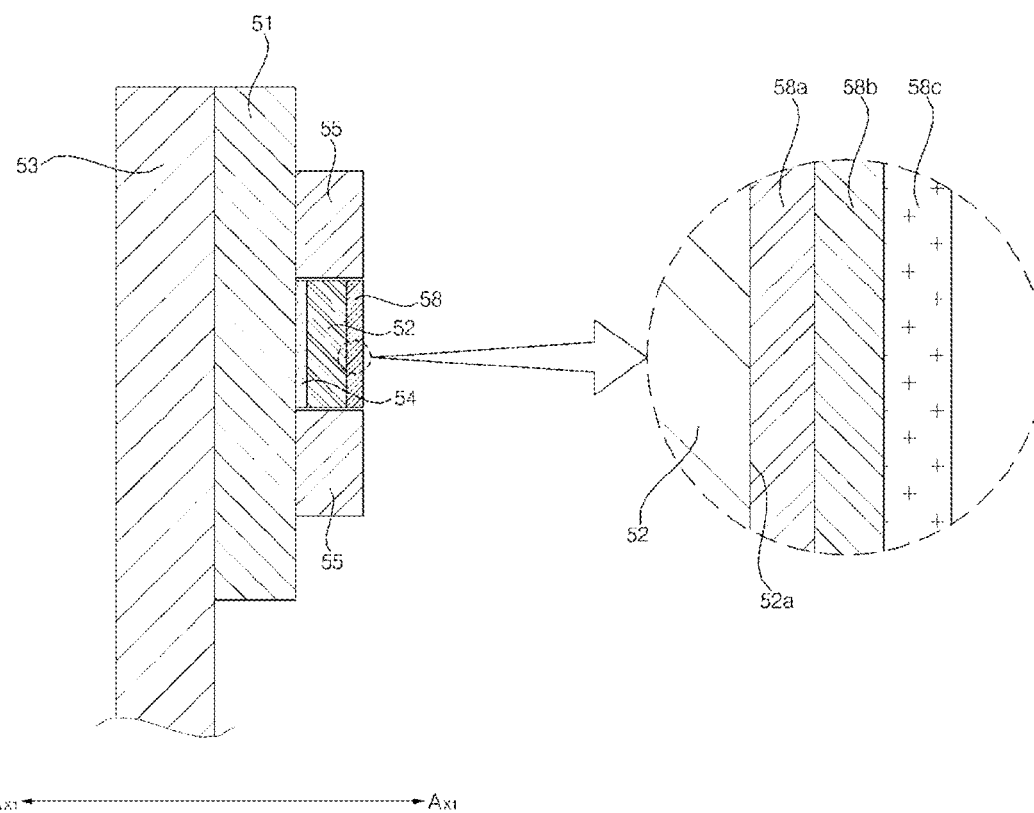
FIG. 6D is a sectional view of a wavelength conversion unit according to a further embodiment of the present invention.

FIG. 6D is a sectional view of a wavelength conversion unit according to a further embodiment of the present invention.

Referring to FIG. 6D, the wavelength conversion unit according to this embodiment shown in FIG. 6D is different from the wavelength conversion unit of the previous embodiment shown in FIG. 6A in that the wavelength conversion unit according to this embodiment further includes a light extraction layer 58.

The light extraction layer 58 reduces total reflection occurring on the boundary surface between the wavelength conversion device 52 and external air, i.e. the light radiation surface 52a. Specifically, the light extraction layer 58 reduces the difference in refractive index between the wavelength conversion device 52 and the external air to reduce total reflection occurring on the boundary surface between the wavelength conversion device 52 and the external air.

The light extraction layer 58 is supported by the light radiation surface 52a of the wavelength conversion device 52. The light extraction layer 58 covers the light radiation surface 52a of the wavelength conversion device 52.

The refractive index of the light extraction layer 58 may be less than that of the wavelength conversion device 52, and may be greater than 1. Specifically, the light extraction layer 58 has a refractive index of 1.1 to 1.6.

The light extraction layer 58 may have a single-layered structure or a multi-layered structure. In this embodiment, as shown in FIG. 6D, the light extraction layer 58 has a multi-layered structure. Specifically, the light extraction layer 58 has a plurality of refraction layers 58a, 58b, and 58c. The refraction layers 58a, 58b, and 58c have different refractive indices, which gradually increases toward the light radiation surface 52a of the wavelength conversion device 52.

Figure 7:
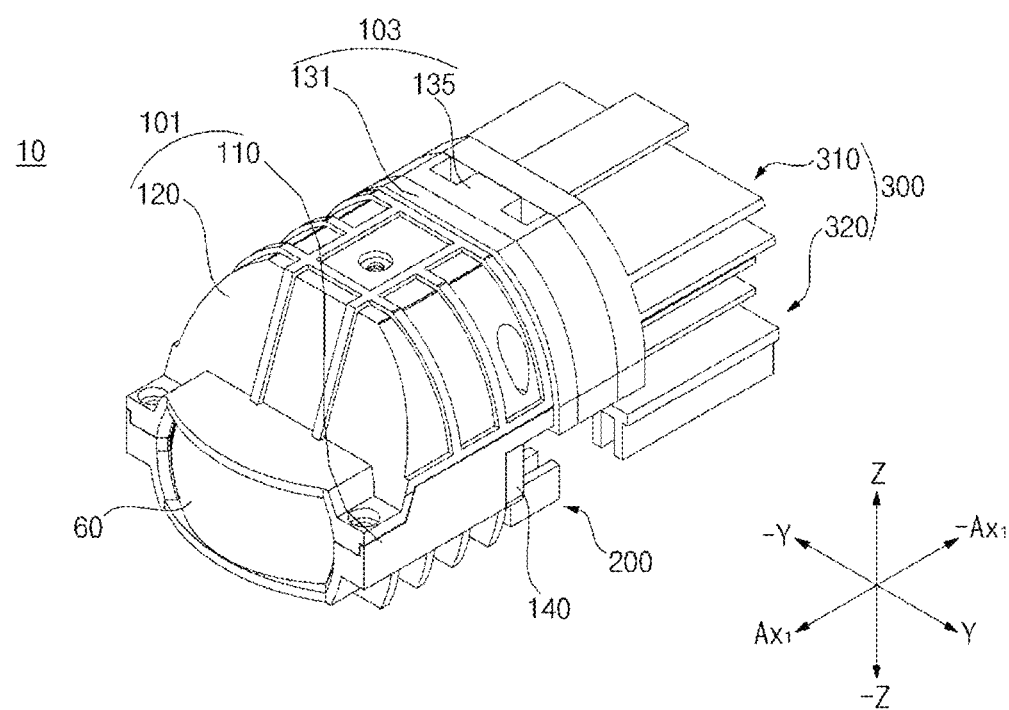
FIG. 7 is a perspective view of a light emitting module including a case according to an embodiment of the present invention.
Figure 8A:
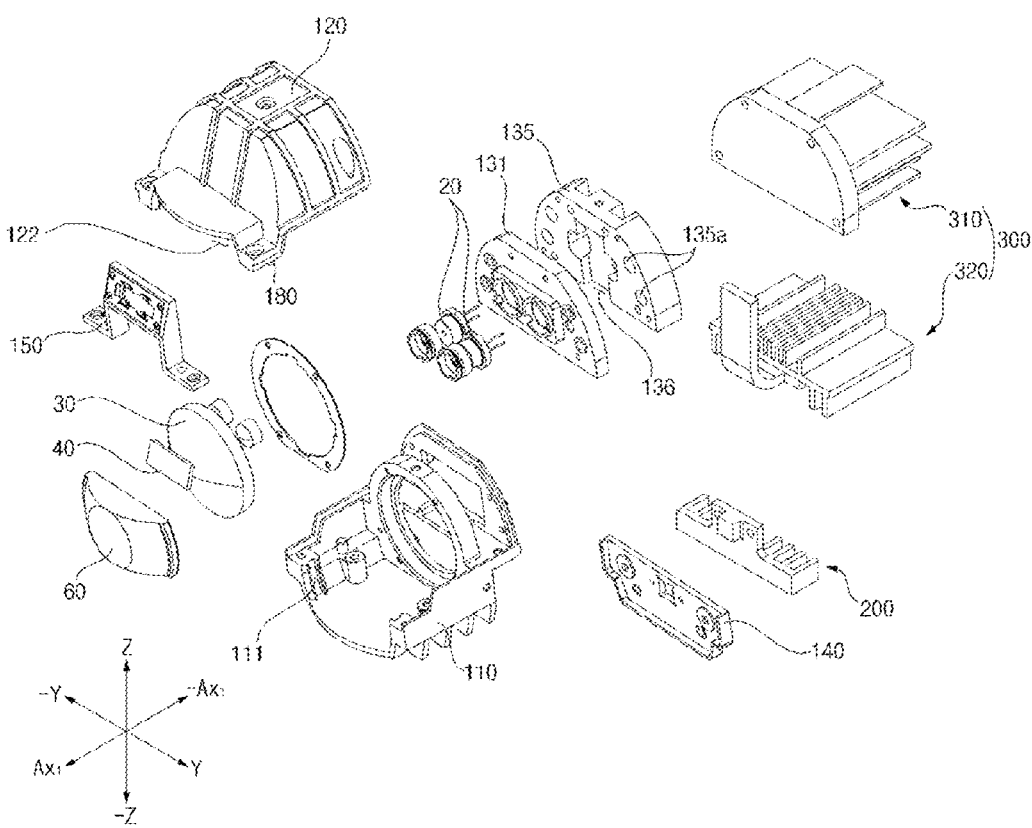
FIGS. 8A and 8B are exploded perspective views of the light emitting module including the case according to the embodiment of the present invention when viewed in different directions.
Figure 8B:
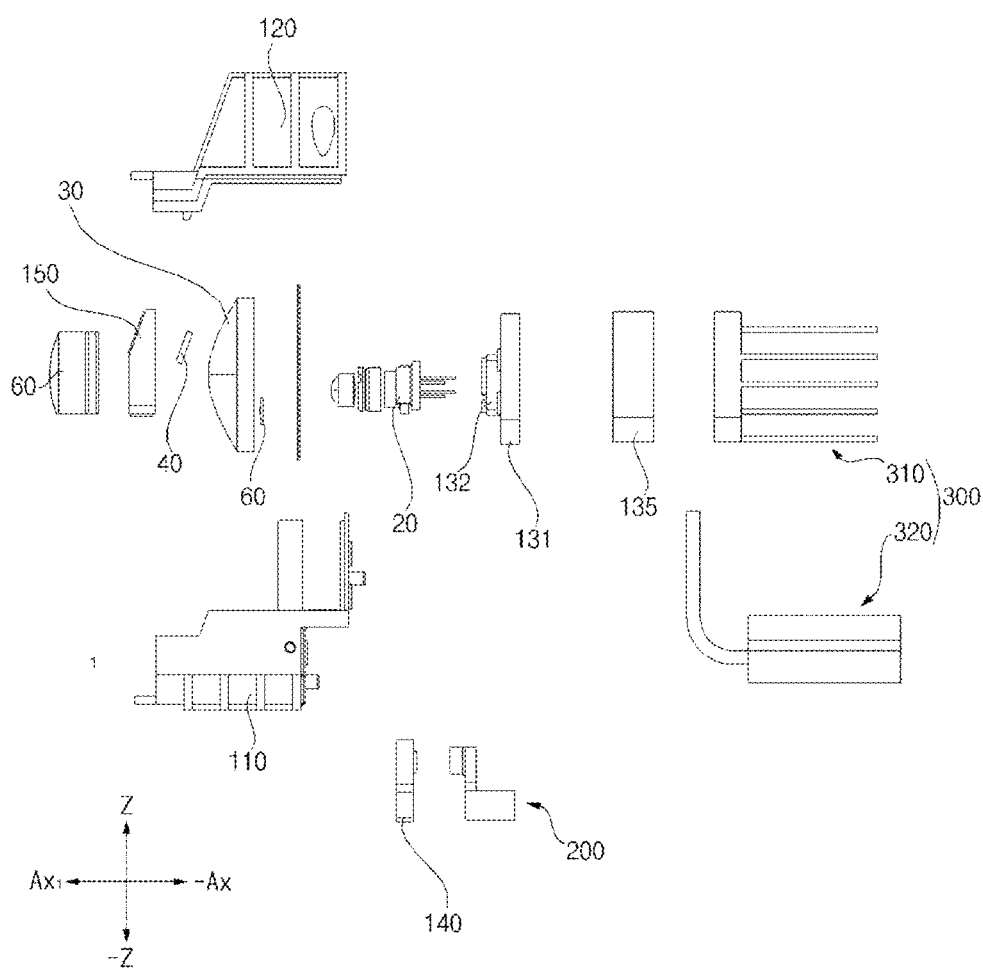
Figure 9A:
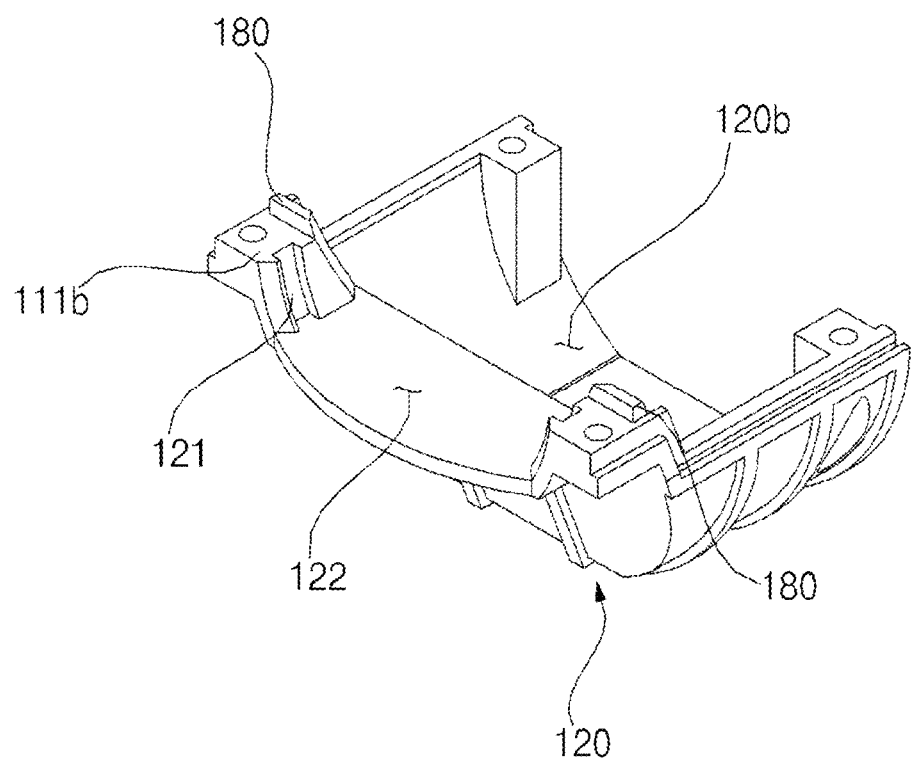
FIG. 9A is a perspective view illustrating a first case according to an embodiment of the present invention.
Figure 9B:
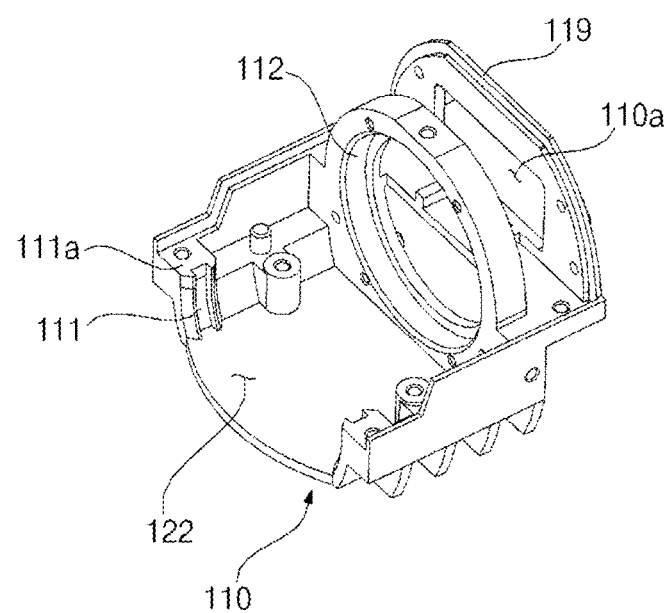
FIG. 9B is a perspective view illustrating a second case according to an embodiment of the present invention.
Figure 9C:
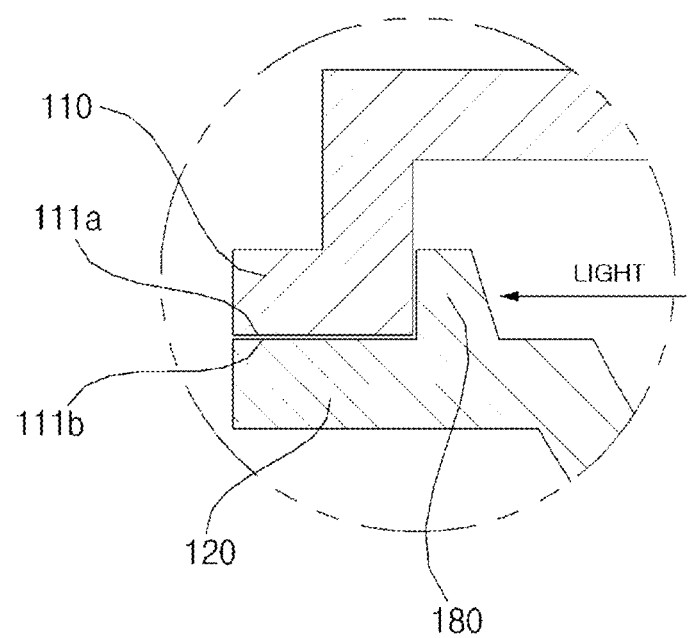
FIG. 9C is a sectional view illustrating the coupling between the first case and the second case according to the embodiment of the present invention.

FIG. 7 is a perspective view of a light emitting module including a case according to an embodiment of the present invention, and FIGS. 8A and 8B are exploded perspective views of the light emitting module including the case according to the embodiment of the present invention when viewed in different directions. FIG. 9A is a perspective view illustrating a first case according to an embodiment of the present invention, FIG. 9B is a perspective view illustrating a second case according to an embodiment of the present invention, and FIG. 9C is a sectional view illustrating the coupling between the first case and the second case according to the embodiment of the present invention.

Referring to FIGS. 7 to 9, the case receives the condensing lens 30, the light source 20, the first optical path conversion member 40, and the wavelength conversion unit 50. The case decides relative positions thereamong. In addition, the case provides a space in which light advances.

In addition, the light emitting module according to the embodiment of the present invention further includes a light source heat dissipation unit for dissipating heat from the light source 120 and a heat dissipation unit 200 for dissipating heat from the wavelength conversion unit 50.

The case accurately decides relative positions among the condensing lens 30, the light source 20, the first optical path conversion member 40, and the wavelength conversion unit 50. The case is configured to have a structure for easily fixing the condensing lens 30, the light source 20, the first optical path conversion member 40, and the wavelength conversion unit 50.

The case may be made of a material that exhibits high thermal conductivity such that heat generated by the components received in the case can be easily discharged through the case. For example, the case may be made of a metal material, such as aluminum. In addition, although not shown in the drawings, a structure, such as heat dissipation fins, which increases the contact area between the case and external air, may be provided at the outer surface of the case in order to dissipate heat from the case.

For example, the case may include a main case 101 and a light source case 103. Alternatively, the case may include a main case 101, a light source case 103, and a bracket 140.

The main case 101 receives the condensing lens 30, the first optical path conversion member 40, and the wavelength conversion unit 50. Specifically, the main case 101 is formed to have a hollow shape, in which a space is defined.

The main case 101 is provided with an optical opening 110a, through which light 21 emitted by the light source 20 passes, a window 120a, through which light 23 reflected by the wavelength conversion unit 50 passes, and a light emission opening 122, through which light that has passed through the wavelength conversion unit 50 and the condensing lens 30 and will be supplied to the auxiliary condensing lens 60 passes.

The optical opening 110a is formed through one surface (specifically, the rear surface) of the main case 101. The optical opening 110a provides a place, through which light generated by the light source 20 passes. The light source case 103, which will be described hereinafter, is coupled to the main case 101 in order to prevent light from being emitted through the optical opening 110a.

Specifically, the optical opening 110a is spaced apart from the central axis Ax1 of the condensing lens 30 in the first direction (direction of Z-axis) which is perpendicular to the central axis Ax1 of the condensing lens 30. The optical opening 110a is formed parallel to the central axis Ax1 of the condensing lens 30.

The light emission opening 122 is formed through one surface (specifically, the front surface) of the main case 101. The light emission opening 122 provides a place, through which light (second reflected light 23) having passed through the wavelength conversion unit 50 and the condensing lens 30 passes.

The light emission opening 122 defines a space in which the auxiliary condensing lens 30 is coupled. The light emission opening 122 is closed by the auxiliary condensing lens 30. One surface of the auxiliary condensing lens 30 is exposed through the light emission opening 122.

Specifically, the light emission opening 122 is spaced apart from the central axis Ax1 of the condensing lens 30 in the second direction (direction of −Z-axis) which is perpendicular to the central axis Ax1 of the condensing lens 30. The light emission opening 122 is formed parallel to the central axis Ax1 of the condensing lens 30. The light emission opening 122 is formed to have a cylindrical shape having the central axis Ax2 of the condensing lens 30 as the axis.

The window 120a is formed through one surface (specifically, the rear surface) of the main case 101. The window 120a is a place, through which the second reflected light 24 reflected by the wavelength conversion unit 50 and the first reflected light 22 radiated through the condensing lens 30 pass. The bracket 140, which will be described hereinafter, is coupled to the main case 101 in order to prevent light from being emitted through the window 120a.

Specifically, the window 120a is spaced apart from the central axis Ax1 of the condensing lens 30 in the second direction (direction of −Z-axis) which is perpendicular to the central axis Ax1 of the condensing lens 30. The window 120a is formed parallel to the central axis Ax1 of the condensing lens 30.

In order to improve convenience in assembling the main case 101 and to reduce tolerance of the main case 101, the main case 101 includes a plurality of segments, which may be coupled to each other. As shown in FIGS. 9A and 9B, the main case 101 includes a first case 110 and a second case 120.

The window 120a, the optical opening 110a, and the light emission opening 122 may be defined by the coupling between the first case 110 and the second case 120. Alternatively, the window 120a, the optical opening 110a, and the light emission opening 122 may be formed in the first case 110 or the second case 120. In this embodiment, the window 120a and the optical opening 110a are formed in the first case 110, and the light emission opening 122 is formed by the coupling between the first case 110 and the second case 120.

A space for receiving the condensing lens 30, the first optical path conversion member 40, and the auxiliary condensing lens 60 is defined by the coupling between the first case 110 and the second case 120.

The main case 101 has a space parallel to the optical axis. The light emission opening 122 is formed in the front surface of the main case 101, and the window 120a and the optical opening 110a are formed in the rear surface of the main case 101.

The first case 110 constitutes the lower part of the main case 101. The first case 110 is provided with a lens holder 112, to which the condensing lens 30 is coupled. The lens holder 112 is formed to have a ring shape, in which the condensing lens 30 is coupled. The lens holder 112 is coupled to the edge of the condensing lens 30. A lens insertion groove, into which the edge of the auxiliary condensing lens 60 is inserted, is formed in the front surface of the first case 110. The optical opening 110a and the window 120a are formed in the rear surface 119 of the first case 110.

The first optical path conversion member 40 is coupled to the first case 110 via a supporter 151. The supporter 151 is formed in a "U" shape to support the first optical path conversion member 40 and not to disturb the advance of light.

The second case 120 constitutes the upper part of the main case 101. A lens insertion groove 111, into which the edge of the auxiliary condensing lens 60 is inserted, is formed in the front surface of the second case 120.

One surface of the first case 110 and one surface of the second case 120 are coupled to each other in a contact fashion. Specifically, the side surface of the first case 110 intersecting the rear surface 119 and the side surface of the second case 120 intersecting the rear surface 119 are coupled to each other in a contact fashion. The side surface of the first case 110 and the side surface of the second case 120 which contact each other are referred to as coupling surfaces 111a and 111b, respectively.

Light advancing in the main case 101 may leak through a gap between the coupling surfaces 111a and 111b. In order to prevent light from leaking through a gap between the first case 110 and the second case 120, a light blocking wall 180 is formed at the main case 101.

In particular, referring to FIG. 9B, the light blocking wall 180 is formed at the coupling surface 111a of the first case 110 or the coupling surface 111b of the second case 120 in a protruding fashion. In this embodiment, the light blocking wall 180 is formed at the coupling surface 111a of the first case 110 in a protruding fashion. In particular, the coupling surfaces of the first case 110 and the second case 120 are formed approximately in parallel to the optical axis for convenience in assembling the condensing lens 30.

Specifically, the light blocking wall 180 is located between the auxiliary condensing lens 60 and the condensing lens 30. More specifically, the light blocking wall 180 is located around the edge of the auxiliary condensing lens 60. The light blocking wall 180 has a predetermined area on the surface perpendicular to the central axis Ax1 of the condensing lens 30.

Figure 10A:
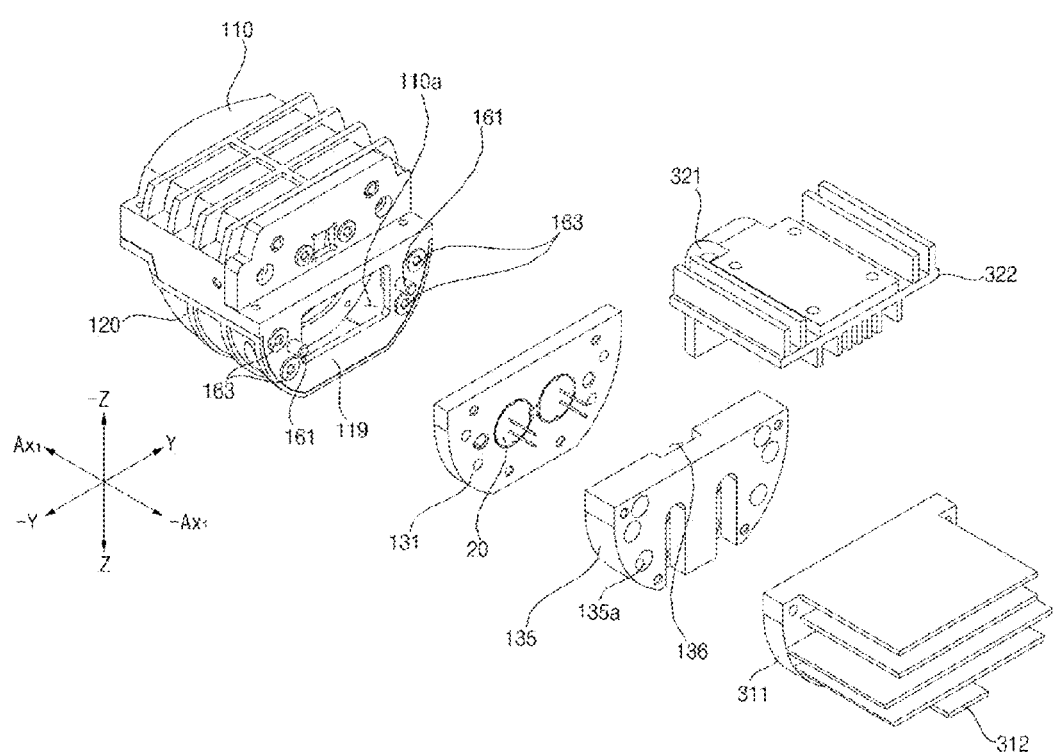
FIGS. 10A and 10B are exploded perspective views of a main case, a light source case, and a light source heat dissipation unit according to an embodiment of the present invention when viewed in different directions.
Figure 10B:
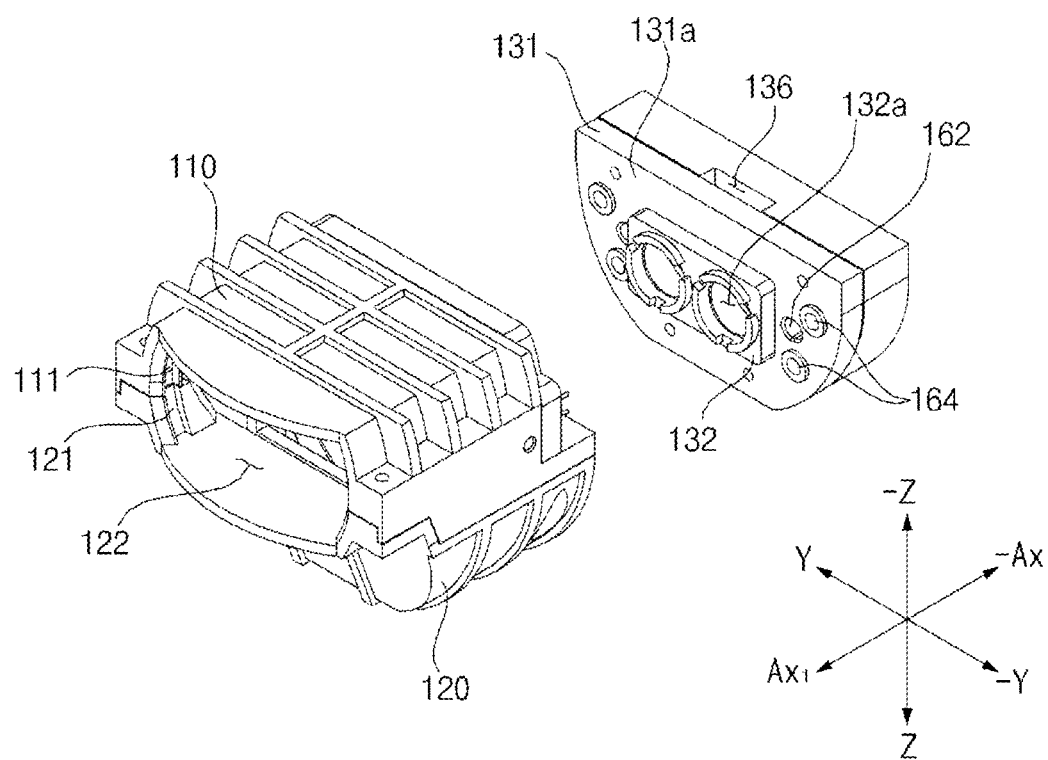
Figure 10C:
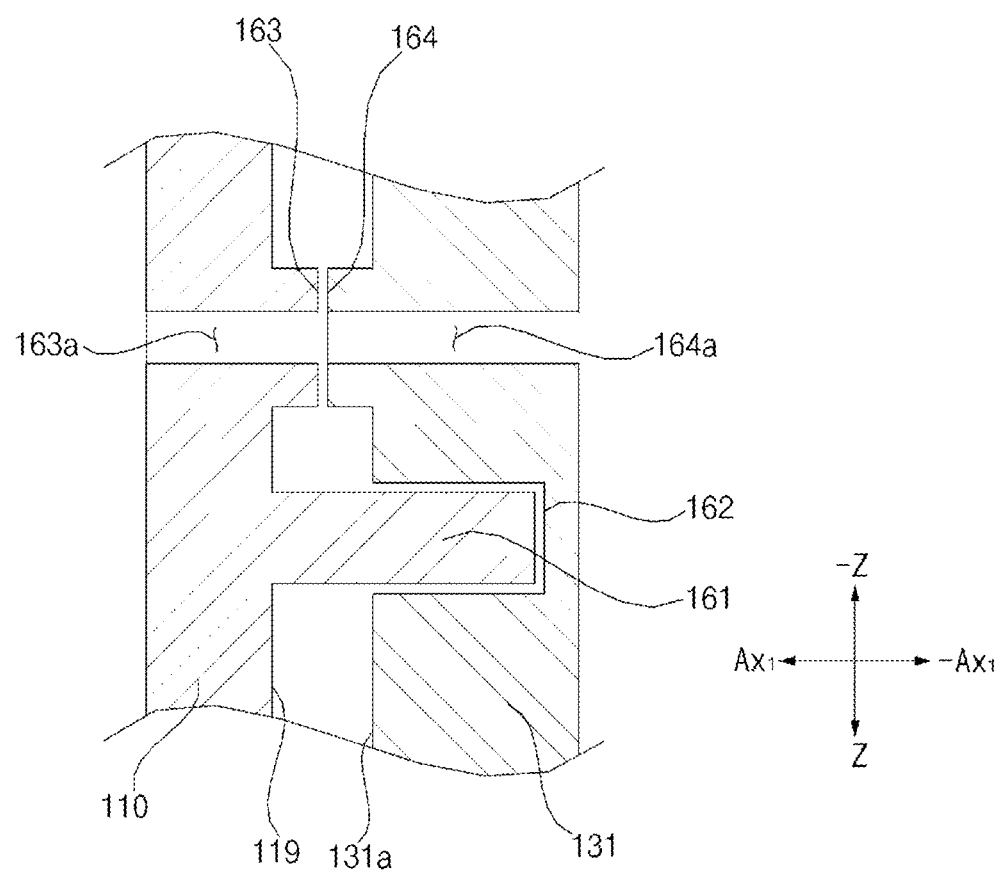
FIG. 10C is a sectional view illustrating the coupling between the main case and the light source case according to the embodiment of the present invention.
Figure 10D:
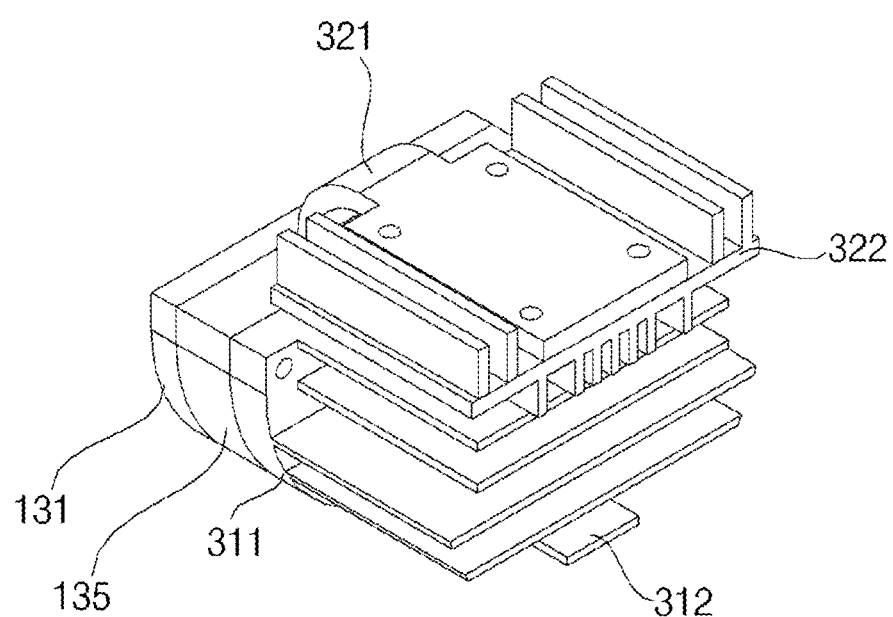
FIG. 10D is a perspective view illustrating the coupling between the light source case and the light source heat dissipation unit according to the embodiment of the present invention.

FIGS. 10A and 10B are exploded perspective views of a main case, a light source case, and a light source heat dissipation unit according to an embodiment of the present invention when viewed in different directions, FIG. 10C is a sectional view illustrating the coupling between the main case and the light source case according to the embodiment of the present invention, and FIG. 10D is a perspective view illustrating the coupling between the light source case and the light source heat dissipation unit according to the embodiment of the present invention.

Referring to FIGS. 10A and 10B, the light source case 103 receives the light source 20. The light source case 103 is disposed such that light emitted from the light source 20 is supplied to the condensing lens 30 through the optical opening 110a.

The light source case 103 may be a single member, or may include a plurality of parts. For example, the light source case 103 may include a first light source case 131 and a second light source case 135, which are coupled to each other. A space in which the light source 20 is received is defined by the coupling between the first light source case 131 and the second light source case 135.

One surface of the light source case 103 closes at least the optical opening 110a. A light supply hole 132a, though which the light source 20 is exposed, is formed in one surface of the light source case 103.

Specifically, the light source case 103 includes a cover surface 131a for covering the circumference of the optical opening 110a, an insertion part 132 protruding from the cover surface 131a such that the insertion part 132 is inserted into the optical opening 110a, and a light supply hole 132a formed in the insertion part 132 for allowing light generated by the light source 20 to pass therethrough.

The cover surface 131a is disposed so as to face the rear surface of the main case 101. The cover surface 131a defines a surface that intersects the optical axis. Specifically, the cover surface 131a is disposed so as to cover the rear surface 119 of the upper part of the main case 101, which defines the circumference of the optical opening 110a.

The insertion part 132 is formed at the cover surface 131a in a protruding fashion. The insertion part 132 and the cover surface 131a are disposed so as to form a step. The insertion part 132 is formed so as to correspond to the optical opening 110a such that the insertion part 132 can be inserted into the optical opening 110a. The insertion part 132 is inserted into the optical opening 110a to prevent light emitted from the light source 20 from leaking to the circumference of the optical opening 110a through the optical opening 110a. The insertion part 132 may be located in the middle of the cover surface 131a.

The light supply hole 132a defines a space, through which light generated by the light source 20 passes. The light supply hole 132a is formed in the insertion part 132. The light source 20, which is received in the light source case 103, is exposed through the light supply hole 132a.

In this embodiment, the cover surface 131a and the insertion part 132 are formed at the first light source case 131.

The position of the light source 20 and the distance between the light source 20 and the condensing lens 30 greatly affect the efficiency of the light emitting module and the shape and size of light emitted from the light emitting module. In this embodiment, therefore, the position of the light source 20 is accurately set using a first positioning unit. The first positioning unit provides a criterion of arrangement when the light source case 103 and the main case 101 are coupled to each other.

The first positioning unit sets the position of the light source 20. For example, the first positioning unit may include a first alignment member for setting the position of the light source 20 in vertical and horizontal directions and/or a first spacer for setting the position of the light source 20 on the optical axis (the distance between the light source 20 and the condensing lens 30).

The first alignment member sets the position of the light source 20 in the vertical and horizontal directions. That is, the first alignment member adjusts the distance between the light source 20 and the central axis Ax1 of the condensing lens 30 in the first direction (direction of Z-axis) which is perpendicular to the central axis Ax1 of the condensing lens 30.

For example, the first alignment member may include a first boss 161 and a first boss hole 162.

The first boss 161 is formed at one selected from between the main case 101 and the light source case 103. In this embodiment, the first boss 161 is formed at the rear surface 119 of the upper part of the main case 101 such that the first boss 161 protrudes rearward. The first boss 161 is inserted into the first boss hole 162. Consequently, the first boss 161 has a shape corresponding to that of the first boss hole 162. The first boss 161 has a predetermined length sufficient to improve the accuracy of alignment. The first boss 161 is disposed parallel to the central axis Ax1 of the condensing lens 30.

The first boss hole 162 is formed in the other selected from between the main case 101 and the light source case 103. In this embodiment, the first boss hole 162 is formed through the cover surface 131a of the light source case 103. In another embodiment, the first boss hole 162 may be formed to have a recess shape. The first boss hole 162 defines a space, into which the first boss 161 is inserted. The first boss hole 162 has a predetermined length sufficient to improve the accuracy of alignment. The first boss hole 162 is disposed parallel to the central axis Ax1 of the condensing lens 30.

A plurality of first bosses 161 and a plurality of first boss holes 162 may be provided. The position of the light source 20 in the Y-Z axis plane is set by the coupling between the first bosses 161 and the first boss holes 162.

The first spacer sets the position of the light source 20 on the optical axis (the distance between the light source 20 and the condensing lens 30). For example, the first spacer may include a first flat surface 163 and a first contact surface 164.

The first flat surface 163 is formed at one selected from between the main case 101 and the light source case 103. In this embodiment, the first flat surface 163 is formed at the rear surface 119 of the upper part of the main case 101 (the surface defining the circumference of the optical opening 110a). A plurality of first flat surfaces 163 may be provided in order to improve accuracy.

The first flat surface 163 is formed so as to be flat. Specifically, the first flat surface 163 is disposed perpendicular to the central axis Ax1 of the condensing lens 30. The first flat surface 163 may be formed on the rear surface 119 of the upper part of the main case 101 such that the first flat surface 163 protrudes, or may be formed in the rear surface 119 of the upper part of the main case 101 such that the first flat surface 163 is recessed. In particular, the flatness of the first flat surface 163 is important since the first flat surface 163 is aligned based on the contact with the first contact surface 164. Consequently, the first flat surface 163 has an area smaller than that of the rear surface 119 of the upper part of the main case 101, whereby the first flat surface 163 may be easily formed so as to be flat. In this embodiment, the first flat surface 163 is formed on the rear surface 119 of the upper part of the main case 101 in a protruding fashion.

The first contact surface 164 is formed at the other selected from between the main case 101 and the light source case 103 such that the first contact surface 164 is in surface contact with the first flat surface 163. In this embodiment, the first contact surface 164 is formed at the cover surface 131a of the light source case 103. A plurality of first contact surfaces 164 may be provided in order to improve accuracy.

The first contact surface 164 is formed so as to be flat. Specifically, the first contact surface 164 is disposed perpendicular to the central axis Ax1 of the condensing lens 30. The first contact surface 164 may be formed on the cover surface 131a of the light source case 103 such that the first contact surface 164 protrudes, or may be formed in the cover surface 131a of the light source case 103 such that the first contact surface 164 is recessed. In particular, the flatness of the first contact surface 164 is important since the first contact surface 164 is aligned based on the contact with the first flat surface 163. Consequently, the first contact surface 164 has an area smaller than that of the cover surface 131a of the light source case 103, whereby the first contact surface 164 may be easily formed so as to be flat. In this embodiment, the first contact surface 164 is formed on the cover surface 131a of the light source case 103 in a protruding fashion.

In addition, the light source case 103 and the main case 101 are fastened to each other using fastening members, such as bolts. The light source case 103 and the main case 101 are provided with first bolt holes 163a and 164a, through which the fastening members are inserted. The positions of the first bolt holes 163a and 164a are not particularly restricted. The first bolt holes 163a and 164a may be formed in the first flat surface 163 and the first contact surface 164.

In particular, referring to FIGS. 10A and 10D, the light source heat dissipation unit 300 dissipates heat generated from the light source 20.

The light source heat dissipation unit 300 is thermally connected to the light source 20 and/or the light source case 103 in order to dissipate heat generated from the light source 20.

For example, the light source heat dissipation unit 300 includes a first light source heat dissipation unit 320 connected to the light source 20 and the light source case 103. Specifically, the first light source heat dissipation unit 320 includes a heat pipe 321 disposed in surface contact with the light source 20 and one surface of the first light source case 131 at one side thereof and a first heat dissipation member 322 located at the other side of the heat pipe 321.

The heat pipe 321 transfers heat from the light source 20 and the light source case 103 to the first heat dissipation member 322. One surface of the heat pipe 321 is flat. One surface of the heat pipe 321 is disposed in surface contact with the light source 20 and one surface of the first light source case 131. In a case in which one surface of the heat pipe 321 is disposed in surface contact with the light source 20 and the first light source case 131, heat generated from the light source 20 may be rapidly transferred to the heat pipe 321. More specifically, one surface of the heat pipe 321 is disposed in contact with the surface of the first light source case 131 that faces the cover surface 131a.

The heat pipe 321 is disposed in surface contact with one surface of the second light source case 135. Specifically, the other surface of the heat pipe 321, which is opposite to one surface of the heat pipe 321, is disposed in surface contact with one surface of the light source case 103. In general, the heat pipe 321 is fitted between the first light source case 131 and the second light source case 135. To this end, the first light source case 131 and/or the second light source case 135 may be provided with a location groove 136, in which the heat pipe 321 is located. The location groove 136 is formed so as to correspond to the heat pipe 321.

The heat pipe 321 may be made of a metal or resin material that exhibits high thermal conductivity. Specifically, the heat pipe 321 may be formed to have a pipe shape having an empty space defined therein. Working liquid for absorbing heat may be received in the space defined in the heat pipe 321.

The working liquid functions as a refrigerant for absorbing heat. For example, the working liquid may include water or oil.

The first heat dissipation member 322 is connected to the other side of the heat pipe 321 to exchange heat with external air. The first heat dissipation member 322 has various shapes that increase the contact area with external air. Specifically, the first heat dissipation member 322 includes a plurality of heat dissipation fins or heat dissipation plates. The first heat dissipation member 322 has a structure in which a plurality of heat dissipation fins is connected to a plate. The plate of the first heat dissipation member 322 is disposed in surface contact with the heat pipe 321. The first heat dissipation member 322 is located outside the light source case 103.

The light source case 103 may be made of one (a single metal) selected from a group consisting of aluminum (Al), gold (Au), silver (Ag), copper (Cu), nickel (Ni), tin (Sn), zinc (Zn), tungsten (W), and iron (Fe), or an alloy (e.g. stainless steel) of at least two selected therefrom. In consideration of weight and cost, the light source case 103 may be made of aluminum (Al) or an aluminum (Al) alloy. In this case, the first heat dissipation member 322 may be made of a material that exhibits thermal conductivity higher than that of the light source case 103.

For the convenience of assembly and alignment, the light source 20 is received in the light source case 103. If the light source case 103 is made of a material that exhibits high thermal conductivity, it is difficult to manufacture the light source case 103, and manufacturing cost of the light source case 103 is increased. For this reason, the first light source heat dissipation unit 320 is configured such that the heat pipe 321 is disposed so as to be in direct contact with the light source 20, and the first heat dissipation member 322, which is connected to the heat pipe 321, is disposed outside the light source case 103, whereby the first light source heat dissipation unit 320 is easily manufactured, the manufacturing cost of the first light source heat dissipation unit 320 is reduced, and heat dissipation efficiency is improved.

In another example, the light source heat dissipation unit 300 further includes a second light source heat dissipation unit 310. In a further example, the light source heat dissipation unit 300 further includes a first light source heat dissipation unit 320 and a second light source heat dissipation unit 310. The first light source heat dissipation unit 320 and the second light source heat dissipation unit 310 may be provided based on the amount of heat generated from the light source 20. In this embodiment, the light source heat dissipation unit 300 dissipates heat through two channels using the first light source heat dissipation unit 320 and the second light source heat dissipation unit 310.

The second light source heat dissipation unit 310 dissipates heat transferred from the light source 20 to the light source case 103 to the outside. The second light source heat dissipation unit 310 is disposed in surface contact with the outer surface of the light source case 103.

Specifically, the second light source heat dissipation unit 310 includes a heat dissipation plate 311 disposed in surface contact with the other surface of the second light source case 135 and a second heat dissipation member 312 connected to the heat dissipation plate 311.

The other surface of the second light source case 135 is opposite to one surface of the second light source case 135. The heat dissipation plate 311 is formed to have a plate shape. The second heat dissipation member 312 is connected to the heat dissipation plate 311. The heat dissipation plate 311 has a shape corresponding to the shape of the other surface of the second light source case 135. The heat dissipation plate 311 may be made of a metal material that exhibits thermal conductivity higher than that of the second light source case 135.

The second heat dissipation member 312 is connected to the heat dissipation plate 311 to exchange heat with external air. The second heat dissipation member 312 has various shapes that increase the contact area with external air. Specifically, the second heat dissipation member 312 includes a plurality of heat dissipation fins or heat dissipation plates.

Figure 11A:
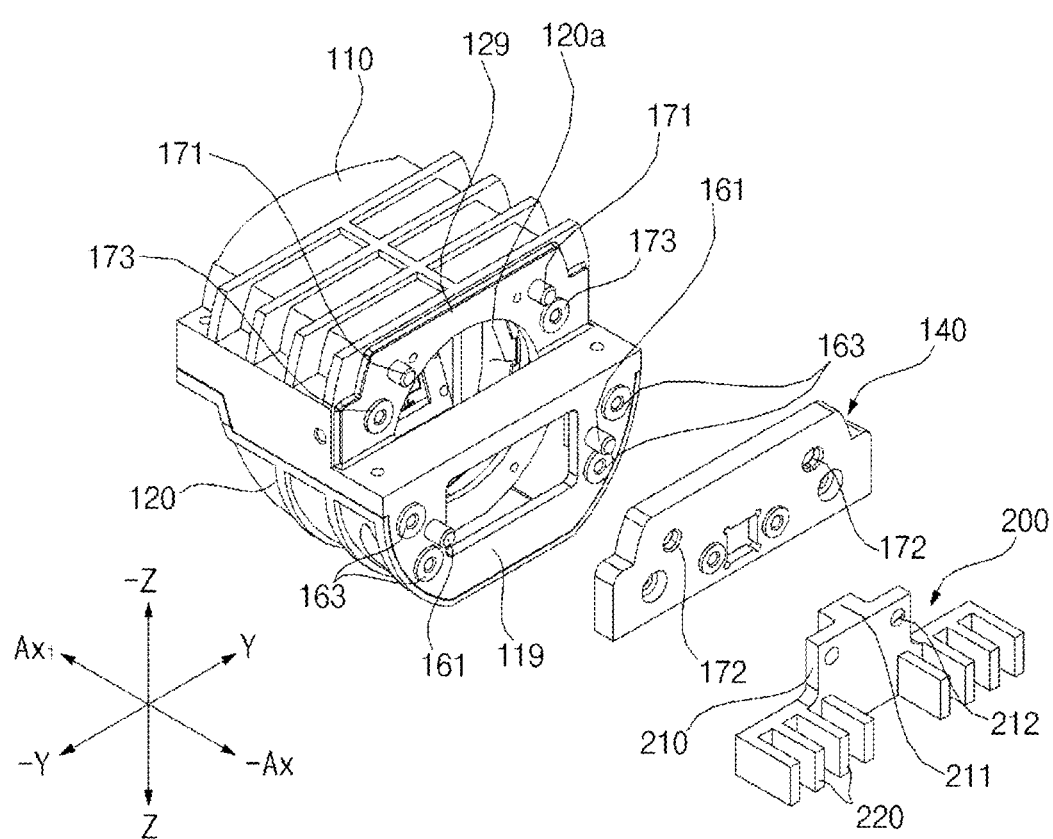
FIGS. 11A and 11B are exploded perspective views of a main case, a bracket, and a heat dissipation unit according to an embodiment of the present invention when viewed in different directions.
Figure 11B:
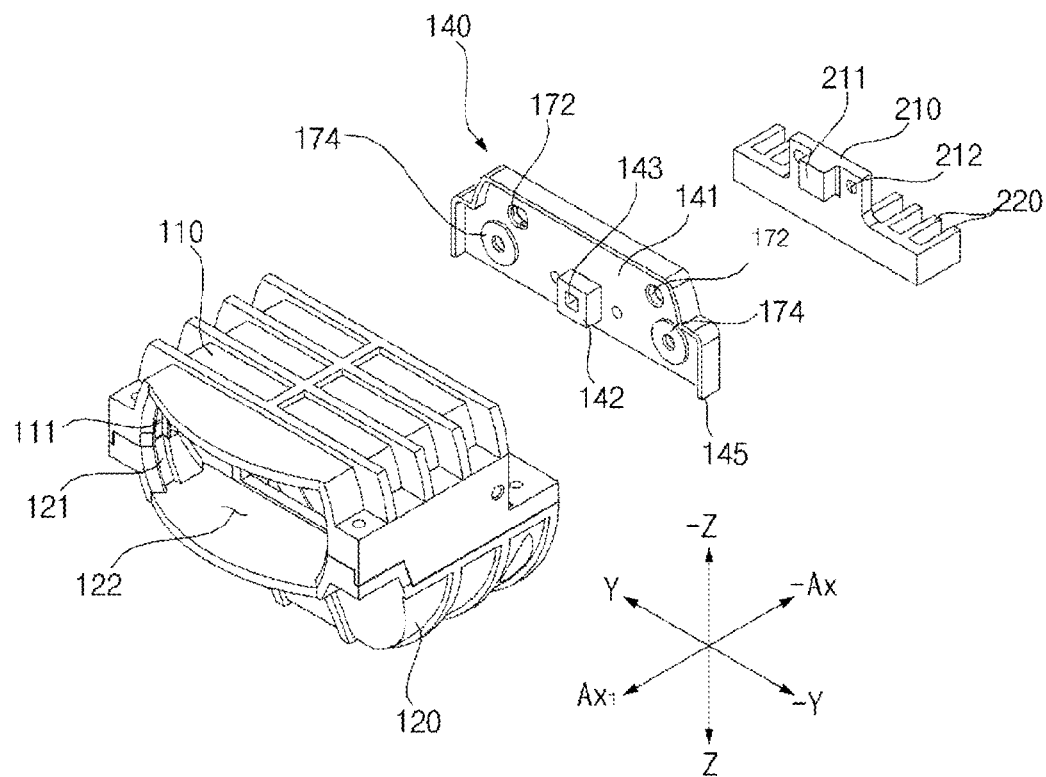
Figure 11C:
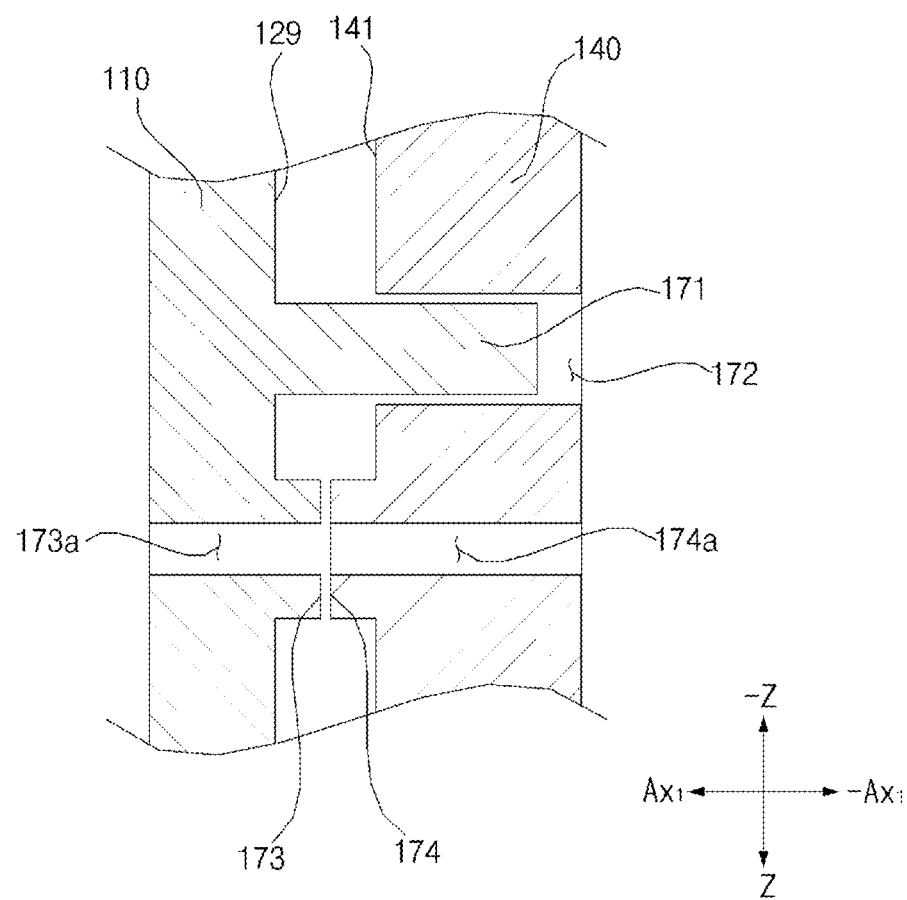
FIG. 11C is a sectional view illustrating the coupling between the main case and the bracket according to the embodiment of the present invention.
Figure 11D:
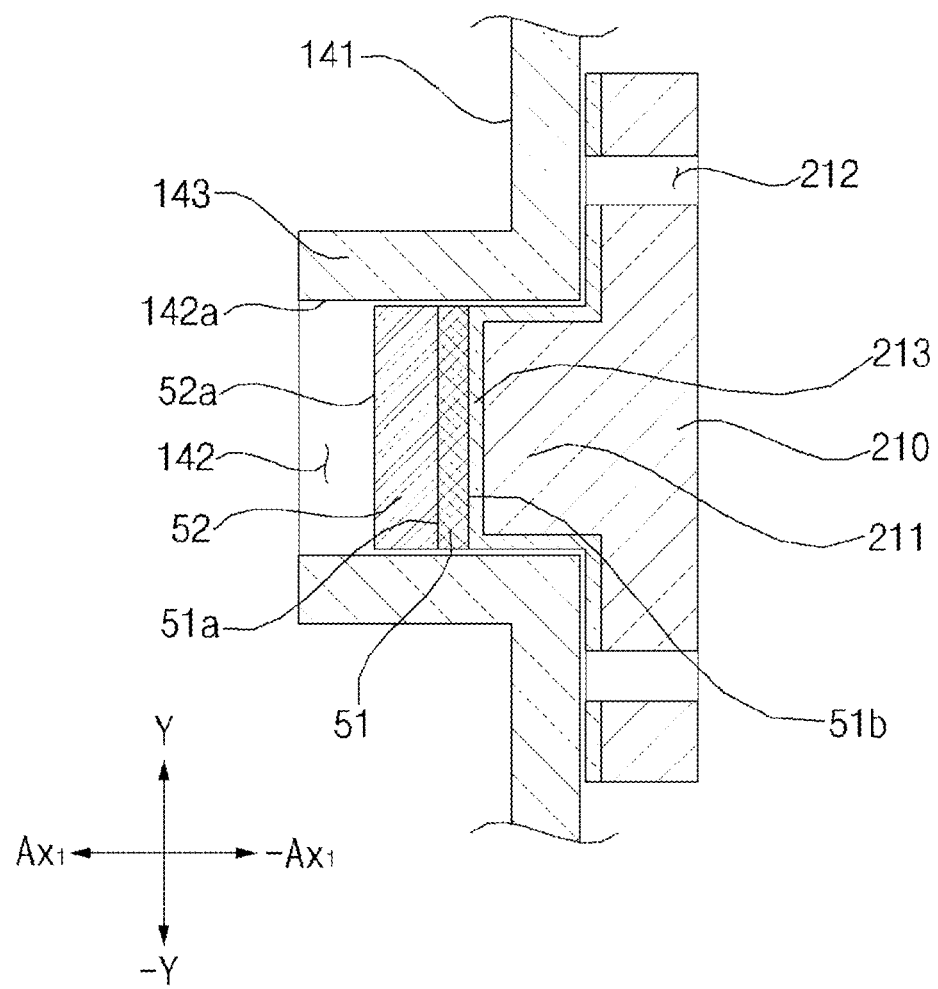
FIG. 11D is a sectional view illustrating the coupling between the bracket and the heat dissipation unit according to the embodiment of the present invention.

FIGS. 11A and 11B are exploded perspective views of a main case, a bracket, and a heat dissipation unit according to an embodiment of the present invention when viewed in different directions, FIG. 11C is a sectional view illustrating the coupling between the main case and the bracket according to the embodiment of the present invention, and FIG. 11D is a sectional view illustrating the coupling between the bracket and the heat dissipation unit according to the embodiment of the present invention.

Referring to FIGS. 11A to 11D, the bracket 140 receives the wavelength conversion unit 50. The bracket 140 is disposed such that light provided by the wavelength conversion unit 50 is supplied to the condensing lens 30 through the window 120a.

One surface of the bracket 140 closes at least the window 120a. The wavelength conversion unit 50 is exposed through one surface of the bracket 140.

Specifically, the bracket 140 includes a cover surface 141 for covering the circumference of the window 120a, an insertion protrusion 142 protruding from the cover surface 141 such that the insertion protrusion 142 is inserted into the window 120a, and a receiving hole 143 formed in the insertion protrusion 142 for receiving the wavelength conversion unit 50.

The cover surface 141 is disposed opposite to the rear surface of the main case 101. The cover surface 141 defines a surface that intersects the optical axis. Specifically, the cover surface 141 is disposed so as to cover the rear surface 129 of the lower part of the main case 101, which defines the circumference of the window 120a. A flange 145 is formed at the edge of the cover surface 141. The flange 145 matches with a surface protruding from the rear surface 129 of the main case 101.

The insertion protrusion 142 is formed at the cover surface 141 in a protruding fashion. The insertion protrusion 142 and the cover surface 141 are disposed so as to form a step. The insertion protrusion 142 is formed so as to correspond to the window 120a such that the insertion protrusion 142 can be inserted into the window 120a. The insertion protrusion 142 is inserted into the window 120a to prevent light provided by the wavelength conversion unit 50 from leaking to the circumference of the window 120a through the window 120a. The insertion protrusion 142 may be located in the middle of the cover surface 141.

The receiving hole 143 defines a space, in which the wavelength conversion unit 50 is received. The receiving hole 143 is formed in the insertion protrusion 142. The receiving hole 143 will be described hereinafter in detail.

The position of the wavelength conversion unit 50 and the distance between the wavelength conversion unit 50 and the condensing lens 30 greatly affect the efficiency of the light emitting module and the shape and size of light emitted from the light emitting module. In this embodiment, therefore, the position of the wavelength conversion unit 50 is accurately set using a second positioning unit. The second positioning unit provides a criterion of arrangement when the bracket 140 and the main case 101 are coupled to each other.

The second positioning unit sets the position of the wavelength conversion unit 50. For example, the second positioning unit may include a second alignment member for setting the position of the wavelength conversion unit 50 in vertical and horizontal directions and/or a second spacer for setting the position of the wavelength conversion unit 50 on the optical axis (the distance between the wavelength conversion unit 50 and the condensing lens 30).

The second alignment member sets the position of the wavelength conversion unit 50 in the vertical and horizontal directions. That is, the second alignment member adjusts the distance between the wavelength conversion unit 50 and the central axis Ax1 of the condensing lens 30 in the second direction (direction of −Z-axis) which is perpendicular to the central axis Ax1 of the condensing lens 30.

For example, the second alignment member may include a second boss 171 and a second boss hole 172.

The second boss 171 is formed at one selected from between the main case 101 and the bracket 140. In this embodiment, the second boss 171 is formed at the rear surface 129 of the lower part of the main case 101 such that the second boss 171 protrudes rearward. The second boss 171 is inserted into the second boss hole 172. Consequently, the second boss 171 has a shape corresponding to that of the second boss hole 172. The second boss 171 has a predetermined length sufficient to improve the accuracy of alignment. The second boss 171 is disposed parallel to the central axis Ax1 of the condensing lens 30.

The second boss hole 172 is formed in the other selected from between the main case 101 and the bracket 140. In this embodiment, the second boss hole 172 is formed through the cover surface 141 of the bracket 140. In another embodiment, the second boss hole 172 may be formed to have a recess shape. The second boss hole 172 defines a space, into which the second boss 171 is inserted. The second boss hole 172 has a predetermined length sufficient to improve the accuracy of alignment. The second boss hole 172 is disposed parallel to the central axis Ax1 of the condensing lens 30.

A plurality of second bosses 171 and a plurality of second boss holes 172 may be provided. The position of the wavelength conversion unit 50 in the Y-Z axis plane is set by the coupling between the second bosses 171 and the second boss holes 172.

The second spacer sets the position of the wavelength conversion unit 50 on the optical axis (the distance between the wavelength conversion unit 50 and the condensing lens 30). For example, the second spacer may include a bracket flat surface 173 and a bracket contact surface 174.

The bracket flat surface 173 is formed at one selected from between the main case 101 and the bracket 140. In this embodiment, the bracket flat surface 173 is formed at the rear surface 129 of the lower part of the main case 101 (the surface defining the circumference of the window 120a). A plurality of bracket flat surfaces 173 may be provided in order to improve accuracy.

The bracket flat surface 173 is formed so as to be flat. Specifically, the bracket flat surface 173 is disposed perpendicular to the central axis Ax1 of the condensing lens 30. The bracket flat surface 173 may be formed on the rear surface 129 of the lower part of the main case 101 such that the bracket flat surface 173 protrudes, or may be formed in the rear surface 129 of the lower part of the main case 101 such that the bracket flat surface 173 is recessed. In particular, the flatness of the bracket flat surface 173 is important since the bracket flat surface 173 is aligned based on the contact with the bracket contact surface 174. Consequently, the bracket flat surface 173 has an area smaller than that of the rear surface 129 of the lower part of the main case 101, whereby the bracket flat surface 173 may be easily formed so as to be flat. In this embodiment, the bracket flat surface 173 is formed on the rear surface 129 of the lower part of the main case 101 in a protruding fashion.

The bracket contact surface 174 is formed at the other selected from between the main case 101 and the bracket 140 such that the bracket contact surface 174 is in surface contact with the bracket flat surface 173. In this embodiment, the bracket contact surface 174 is formed at the cover surface 141 of the bracket 140. A plurality of bracket contact surfaces 174 may be provided in order to improve accuracy.

The bracket contact surface 174 is formed so as to be flat. Specifically, the bracket contact surface 174 is disposed perpendicular to the central axis Ax1 of the condensing lens 30. The bracket contact surface 174 may be formed on the cover surface 141 of the bracket 140 such that the bracket contact surface 174 protrudes, or may be formed in the cover surface 141 of the bracket 140 such that the bracket contact surface 174 is recessed. In particular, the flatness of the bracket contact surface 174 is important since the bracket contact surface 174 is aligned based on the contact with the bracket flat surface 173. Consequently, the bracket contact surface 174 has an area smaller than that of the cover surface 141 of the bracket 140, whereby the bracket contact surface 174 may be easily formed so as to be flat. In this embodiment, the bracket contact surface 174 is formed on the cover surface 141 of the bracket 140 in a protruding fashion.

In addition, the bracket 140 and the main case 101 are fastened to each other using fastening members, such as bolts. The bracket 140 and the main case 101 are provided with second bolt holes 173a and 174a, through which the fastening members are inserted. The positions of the second bolt holes 173a and 174a are not particularly restricted. The second bolt holes 173a and 174a may be formed in the bracket flat surface 173 and the bracket contact surface 174.

The heat dissipation unit 200 is thermally connected to the wavelength conversion unit 50 to dissipate heat generated from the wavelength conversion unit 50. In addition, the heat dissipation unit 200 may be thermally connected to the bracket 140.

The heat dissipation unit 200 includes a heat dissipation support member 210 having supporting force and a heat dissipation base layer 213 supported by the heat dissipation support member 210, the heat dissipation base layer 213 having thermal conductivity higher than that of the heat dissipation support member 210.

The heat dissipation support member 210 is formed to have a plate shape having a predetermined area. The heat dissipation support member 210 may have a single-layered structure or a multi-layered structure. The heat dissipation support member 210 has a sufficient area to support at least the reflection plate 51. The heat dissipation support member 210 exhibits predetermined rigidity. In addition, a heat sink 220 is connected to one side of the heat dissipation support member 210 in order to transfer heat generated from the reflection plate 51 to the heat sink 220.

In an embodiment, the heat dissipation support member 210 includes a metal layer, which exhibits high thermal conductivity.

The metal layer is a base layer having high heat dissipation and supportability. For example, the metal layer may be constituted by at least one selected from between a metal film and a metal mesh. Specifically, the metal layer may be constituted by a metal film or a metal mesh or by stacking the metal film and the metal mesh. The metal layer may be constituted by a metal film. The kind of metal constituting the metal layer is not particularly restricted so long as the metal layer is made of a metal material that exhibits high thermal conductivity.

Although the metal constituting the metal layer is not particularly restricted, the metal layer may be made of a metal material having a thermal conductivity of 3 W/mK to 420 W/mK.

In a concrete example, the metal layer may be made of one (a single metal) selected from a group consisting of aluminum (Al), gold (Au), silver (Ag), copper (Cu), nickel (Ni), tin (Sn), zinc (Zn), tungsten (W), and iron (Fe), or an alloy (e.g. stainless steel) of at least two selected therefrom. In consideration of weight and cost, the metal layer 57a may be made of aluminum (Al) or an aluminum (Al) alloy.

The heat dissipation support member 210 covers at least a portion of the bracket 140. Specifically, the heat dissipation support member 210 is disposed in surface contact with the surface (i.e. the rear surface) of the bracket 140 that is opposite to the cover surface 141. Of course, the heat dissipation base layer 213 may be disposed in surface contact with the rear surface of the bracket 140. However, the present invention is not limited thereto. Consequently, heat generated from the bracket is dissipated through the heat dissipation support member 210 and/or the heat dissipation base layer 213.

The heat dissipation support member 210 is further provided with a fastening hole 212, through which a fastening member is inserted such that the fastening member is coupled to the bracket 140.

The heat dissipation support member 210 further includes a support part 211 for supporting the wavelength conversion device 52. The support part 211 is formed at the heat dissipation support member 210 in a protruding fashion. The support part 211 supports the wavelength conversion device 52. The support part 211 is inserted into the receiving hole 143 of the bracket 140.

Specifically, the heat dissipation support member 210 covers the circumference of the receiving hole 143 at the side of the bracket 140 that is opposite to the cover surface 141. The support part 211 is inserted into the receiving hole 143. At this time, the wavelength conversion device 52 is located in the middle of the receiving hole 143. Consequently, the inner surface of the receiving hole 143 functions to guide light radiated from the wavelength conversion device 52. For example, a reflection side surface 142a for guiding light radiated from the wavelength conversion device 52 such that the light is incident on the condensing lens 30 is formed at the inner surface of the receiving hole 143.

The reflection side surface 142a guides light reflected by the reflection plate 51 and light the wavelength of which has been converted by the wavelength conversion device 52 such that they are radiated from the second region of the rear surface 32 of the condensing lens 30.

The reflection side surface 142a may be made of a material having a good reflection property, for example, a material selected from the group consisting of Ag, Ni, Al, Rh, Pd, Ir, Ru, Mg, Zn, Pt, Au, Hf, and a combination thereof. The reflection side surface 142a may be made of a material identical to or different from that of the bracket 140.

The reflection side surface 142a defines a closed curved line or a closed space on a surface intersecting the central axis Ax1 of the condensing lens 30.

The reflection side surface 142a is formed so as to intersect the reflection surface 51a. Specifically, the reflection side surface 142a of the bracket 140 is disposed parallel to the central axis Ax1 of the condensing lens 30. More specifically, the section of the reflection side surface 142a of the bracket 140 that is parallel to the central axis Ax1 of the condensing lens 30 has a shape such that the sectional area of the receiving hole 143 gradually increases toward the front of the optical axis Ax. The reflection side surface 142a of the bracket 140 disposed so as to surround a side surface of the wavelength conversion device 52 that intersects the light radiation surface 52a.

In a case in which the reflection side surface 142a is formed parallel to the central axis Ax1 of the condensing lens 30, light radiated from the wavelength conversion unit 50 is incident on a single spot of the condensing lens 30 in a relatively concentrated state. On the other hand, in a case in which the reflection side surface 142a is formed such that the sectional area of the receiving hole 143 gradually increases toward the front of the optical axis Ax, light radiated from the wavelength conversion unit 50 is incident on a single spot of the condensing lens 30 in a relatively diffused state.

The heat dissipation base layer 213 is supported by the heat dissipation support member 210. The heat dissipation base layer 213 has thermal conductivity higher than that of the heat dissipation support member 210. The heat dissipation base layer 213 is disposed in contact with the reflection plate 51. Specifically, the heat dissipation base layer 213 is disposed in surface contact with the heat conduction surface 51b of the reflection plate 51. Heat transferred from the wavelength conversion device 52 to the reflection plate 51 is transferred to the heat dissipation base layer 213.

The heat dissipation base layer 213 is stacked on the heat dissipation support member 210, which has supporting force.

The heat dissipation base layer 213 contains a thermally conductive organic material. The organic material exhibits high thermal conductivity. Specifically, the organic material may exhibit higher thermal conductivity than the metal layer. The organic material may be a carbon material. The carbon material may be at least one selected from a group consisting of graphite, graphene, carbon nano tube (CNT), and carbon nano fiber (CNF). Although the particle size of the organic material is not particularly restricted, the organic material may have a particle size of 200 μm or less, specifically 5 nm to 200 μm. Although the thermal conductivity of the organic material is not particularly restricted, the organic material may have a thermal conductivity of 3 W/mK or higher.

The heat dissipation base layer 213 is disposed in surface contact with the surface (i.e. the rear surface) of the bracket 140 that is opposite to the cover surface 141. Consequently, heat generated from the wavelength conversion unit 50 may be rapidly transferred to the heat dissipation base layer 213 via the reflection plate and the bracket 140.

In addition, although not shown in the drawings, a heat pipe may be embedded in the heat dissipation support member 210. The heat pipe is embedded in the heat dissipation support member 210 to absorb heat from the reflection plate 51 and/or the heat dissipation support member 210. The heat pipe may be in surface contact with the heat conduction surface 51b of the reflection plate 51. In addition, the heat pipe may be in contact with the heat dissipation support member 210. The heat pipe may be flat. One surface of the heat pipe may be in contact with the heat conduction surface 51b of the reflection plate 51, and the other surface of the heat pipe may be in contact with the heat dissipation support member 210.

The heat pipe may be made of a metal or resin material that exhibits high thermal conductivity. Specifically, the heat pipe may be formed to have a pipe shape having an empty space defined therein. Working liquid for absorbing heat may be received in the space defined in the heat pipe.

The working liquid functions as a refrigerant for absorbing heat. For example, the working liquid may include water or oil.

In this embodiment, the light emitting module further includes a heat sink 220 thermally connected to the heat dissipation unit 200 for dissipating heat from the heat dissipation unit 200. The heat sink 220 may have various structures for exchanging heat with external air.

For example, one side of the heat sink 220 is connected to the heat dissipation support member 210 and/or the heat dissipation base layer 213 of the heat dissipation unit 200. The heat sink 220 has various shapes that increase the contact area with external air. Specifically, the heat sink 220 includes a plurality of heat dissipation fins or heat dissipation plates.

Figure 12A:
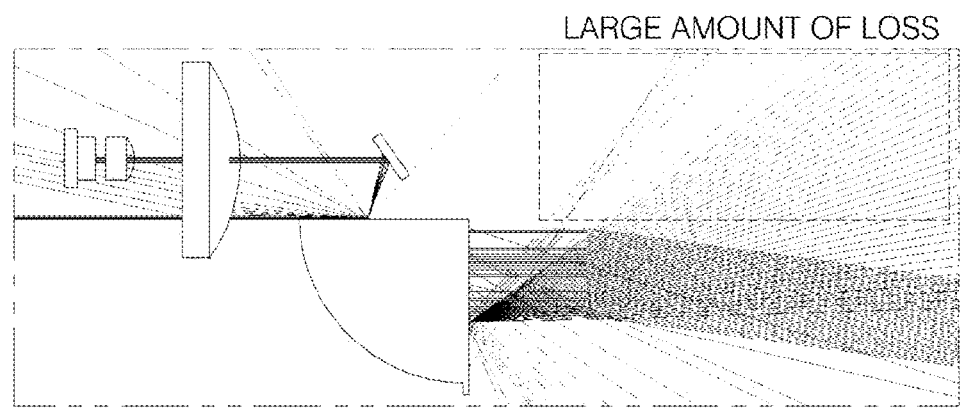
FIG. 12A is a view illustrating an optical path of a conventional light emitting module.
Figure 12B:
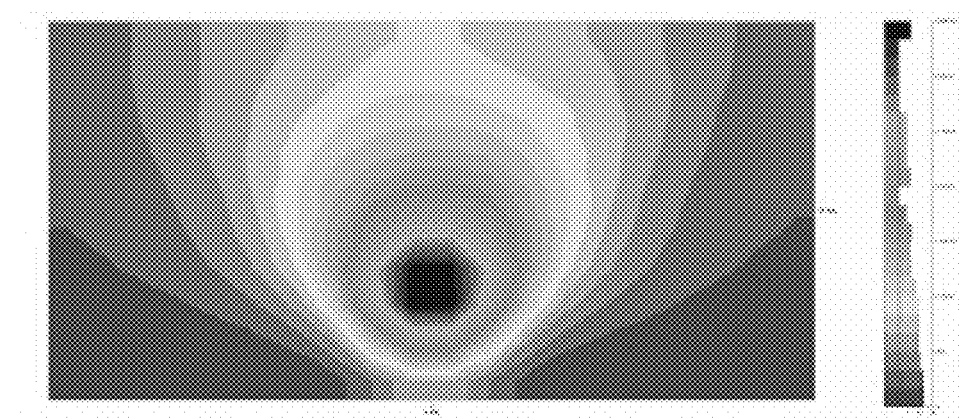
FIG. 12B is a view illustrating a projection image of the conventional light emitting module.

FIG. 12A is a view illustrating an optical path of a conventional light emitting module. FIG. 12B is a view illustrating a projection image of the conventional light emitting module.

Referring to FIG. 12A, the conventional light emitting module operates such that light from a light source disposed on an optical axis is incident into a condensing lens, passes through the condensing lens, and is radiated therefrom. The light concentrated by the condensing lens is refracted by a reflection unit disposed on the optical axis, and passes through a light transmissive phosphor. A wavelength of the light is converted while passing through the light transmissive phosphor.

The light incident into the light transmissive phosphor from the reflection unit is concentrated on one point; however, the light radiated from the light transmissive phosphor spreads out radially. At the time of passing through the light transmissive phosphor, the optical efficiency is considerably deteriorated.

The light from the light transmissive phosphor is radiated ahead of the optical axis by a spherical mirror.

Some of the light from the spherical mirror is projected parallel to the optical axis, but some of the light is projected in a non-parallel direction relative to the optical axis, which causes optical loss.

From FIG. 12B, illustrating a projection image at 20 meters ahead of the light source, it can be known that some of the light is concentrated, but some of the light is wasted by being directed upward.

Figure 13A:
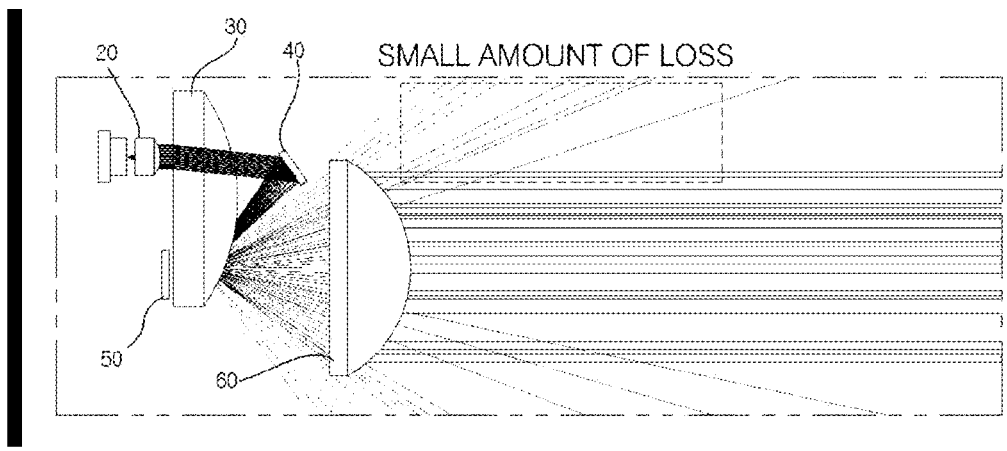
FIG. 13A is a view illustrating an optical path of the light emitting module according to the present invention.
Figure 13B:
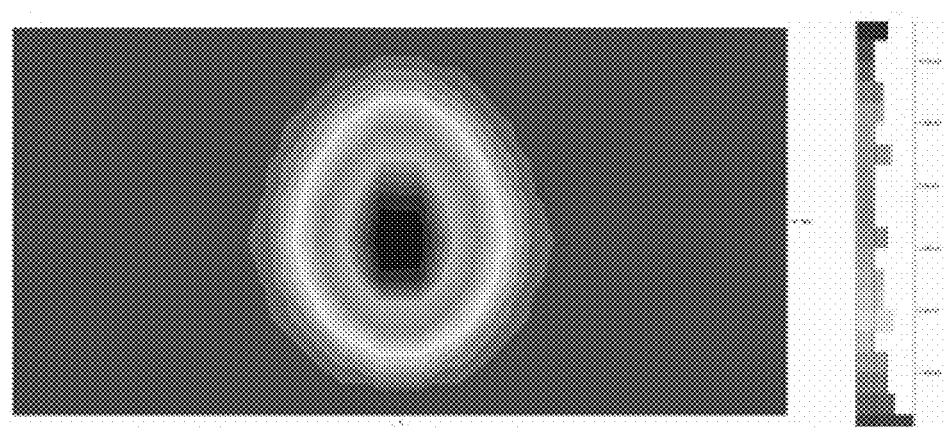
FIG. 13B is a view illustrating a projection image of the light emitting module according to the present invention.

FIG. 13A is a view illustrating an optical path of the light emitting module according to the present invention. FIG. 13B is a view illustrating a projection image of the light emitting module according to the present invention.

Referring to FIG. 13A, the first light 21 generated from the light source 20 is incident into the upper region (first region) of the condensing lens 30, is refracted, and is radiated from the condensing lens 30. The first light 21 radiated from the condensing lens 30 is incident on the first optical path conversion member 40.

The first light 21 incident on the first optical path conversion member 40 is reflected therefrom, and is radiated as the first reflected light 22. The first reflected light 22 is incident into the lower region (second region) of the condensing lens 30. The first reflected light 22 is radiated rearward through the lower region of the condensing lens 30.

The first reflected light 22 radiated from the condensing lens 30 is incident on the wavelength conversion unit 50. The first reflected light 22 is converted into white light at the wavelength conversion unit 50 by wavelength conversion, is reflected from the wavelength conversion unit 50, and is radiated as the second reflected light 23.

At this time, since the second reflected light 23 undergoes Lambertian reflection, the second reflected light 23 becomes fan-shaped light which is directed at a predetermined angle based on an arbitrary line parallel to the optical axis.

The second reflected light 23 is incident into the lower region of the condensing lens 30, is refracted, and is radiated ahead of the condensing lens 30.

The second reflected light 23 radiated from the condensing lens 30 is concentrated by the auxiliary condensing lens 60, and is radiated as the second light 24.

The majority of the second reflected light 23 is incident into the auxiliary condensing lens 60, and is refracted to be parallel light.

From FIG. 13B, illustrating a projection image at 20 meters ahead of the light source 20, it can be known that the majority of the light is concentrated on a small region.

Figure 14A:
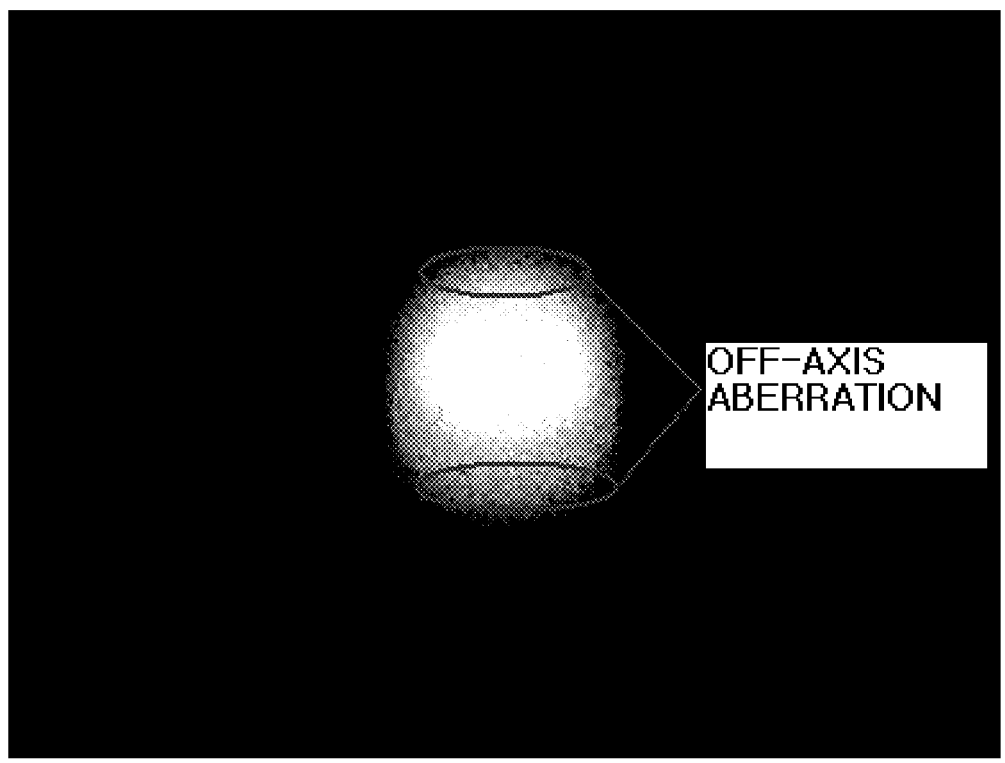
FIG. 14A is a view illustrating a projection image of a light emitting module according to a comparative example.
Figure 14B:
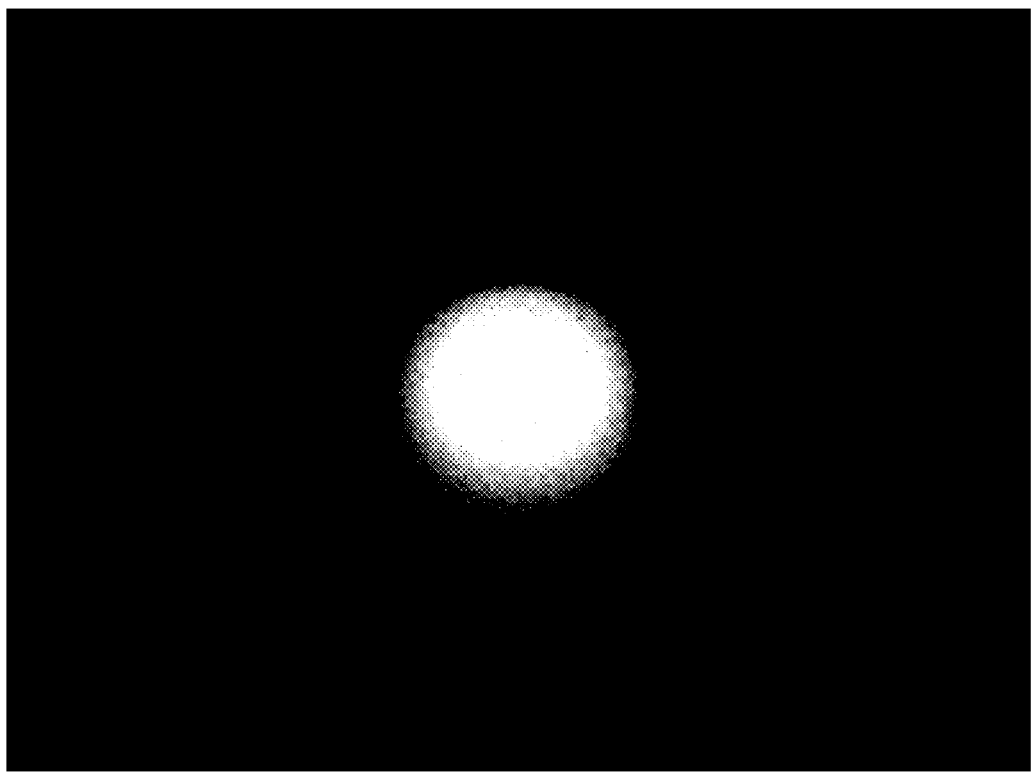
FIG. 14B is a view illustrating a projection image of the light emitting module according to the present invention.

FIG. 14A is a view illustrating a projection image of a light emitting module according to a comparative example, and FIG. 14B is a view illustrating a projection image of the light emitting module according to the present invention.

In the comparative example of FIG. 14A, the structure for removing the off-axis aberration is not applied to the first refractive surface 62a and 62b of the auxiliary condensing lens 60.

Referring to FIG. 14A, in the light emitting module according to the comparative example, the light source 20 is decentered with respect to the central axis of the condensing lens 30, and light is incident eccentrically with respect to the central axis of the condensing lens 30. When light is radiated from the auxiliary condensing lens 60, therefore, off-axis aberration occurs in the vertical direction.

Specifically, the light radiated from the auxiliary condensing lens 60 of the comparative example does not become a true circle, but becomes an oval having a vertical diameter greater than a horizontal diameter, with the result that the light cannot be concentrated on a desired spot. In addition, the light radiated from the auxiliary condensing lens 60 of the comparative example does not become white light, but becomes light having different colors at the upper and lower parts thereof.

Referring to FIG. 14B, it can be seen that, in a case in which the auxiliary condensing lens 60 of the embodiment of the present invention is used, off-axis aberration in the vertical direction is removed.

Specifically, light radiated from the auxiliary condensing lens 60 of the embodiment of the present invention becomes almost circular white light as the result of the off-axis aberration being removed.

Figure 15A:
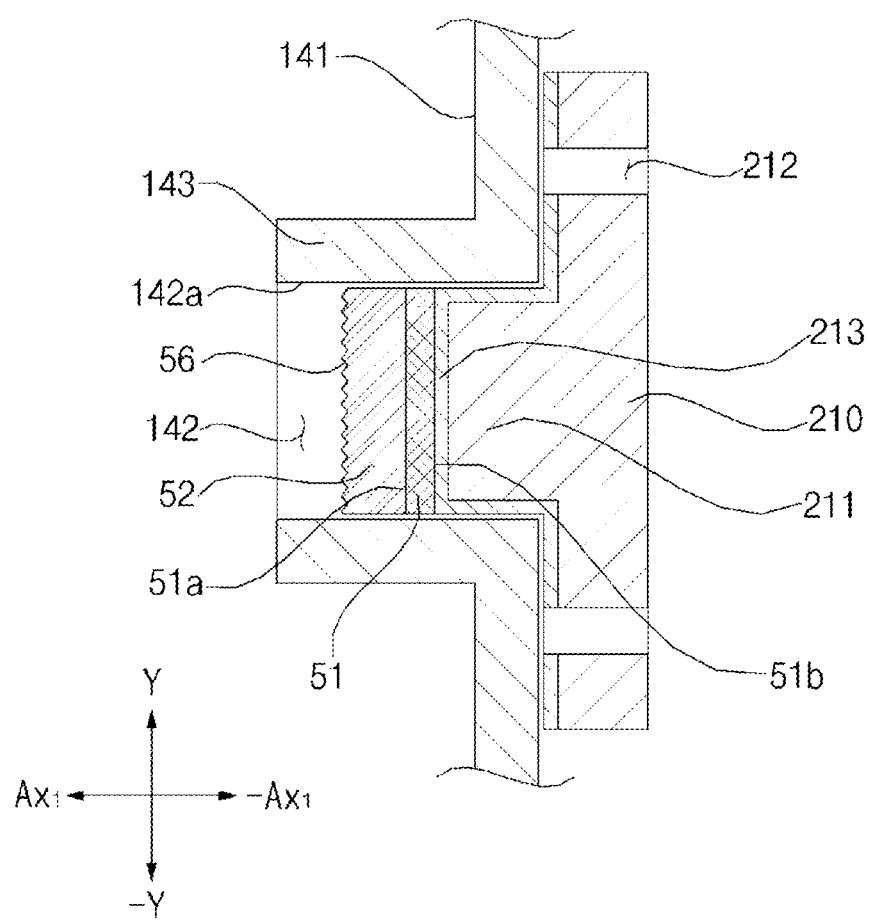
FIG. 15A is a sectional view illustrating the coupling between a bracket and a heat dissipation unit according to another embodiment of the present invention.

FIG. 15A is a sectional view illustrating the coupling between a bracket and a heat dissipation unit 200 according to another embodiment of the present invention.

Referring to FIG. 15A, the light emitting module according to this embodiment shown in FIG. 15A is different from the light emitting module of the previous embodiment shown in FIG. 11D in that the shape of the wavelength conversion device 52 according to this embodiment is different from that of the wavelength conversion device 52 according to previous embodiment shown in FIG. 11D.

In this embodiment, the wavelength conversion device 52 further includes a concave and convex pattern 56 formed on the light radiation surface 52a.

The wavelength conversion device 52 is made of a material having a refractive index than that of air. For example, the wavelength conversion device 52 has a refractive index of about 1.8 to 1.9. Consequently, a portion of light the wavelength of which is converted by the wavelength conversion device 52 or light which is reflected by the reflection surface 51a of the reflection plate 51 and passes through the wavelength conversion device 52 is totally reflected due to the difference in refractive index at the boundary surface (the light radiation surface 52a) of the wavelength conversion device 52. The total reflection on the light radiation surface 52a of the wavelength conversion device 52 extremely reduces light efficiency of the light emitting module.

In order to reduce the total reflection, therefore, a structure for improving light extraction efficiency is formed at the light radiation surface 52a of the wavelength conversion device 52. For example, the concave and convex pattern 56 is formed on the light radiation surface 52a of the wavelength conversion device 52.

The concave and convex pattern 56 includes an uneven surface (as compared with the reflection surface 51a of the reflection plate 51). Specifically, the concave and convex pattern 56 is formed such that the light radiation surface 52a of the wavelength conversion device 52 has a surface that is not parallel to the reflection surface 51a of the reflection plate 51.

For example, the concave and convex pattern 56 may be formed to have various shapes, such as a cylindrical shape, a prism shape, a conical shape, a pyramidal shape, a truncated conical shape, and a truncated pyramidal shape, in section. Preferably, the concave and convex pattern 56 is formed to have a conical shape or a pyramidal shape in section.

The concave and convex pattern 56 may be formed by etching the light radiation surface 52a of the wavelength conversion device 52. However, the present invention is not limited thereto. The light radiation surface 52a of the wavelength conversion device 52 may be etched by wet etching and/or dry etching.

The concave and convex pattern 56 prevents light reflected by the reflection surface 51a of the reflection plate 51 from being totally reflected by the light radiation surface 52a of the wavelength conversion device 52 with the result that the light is reabsorbed or scattered, thereby improving light extraction efficiency of the light emitting module.

Figure 15B:
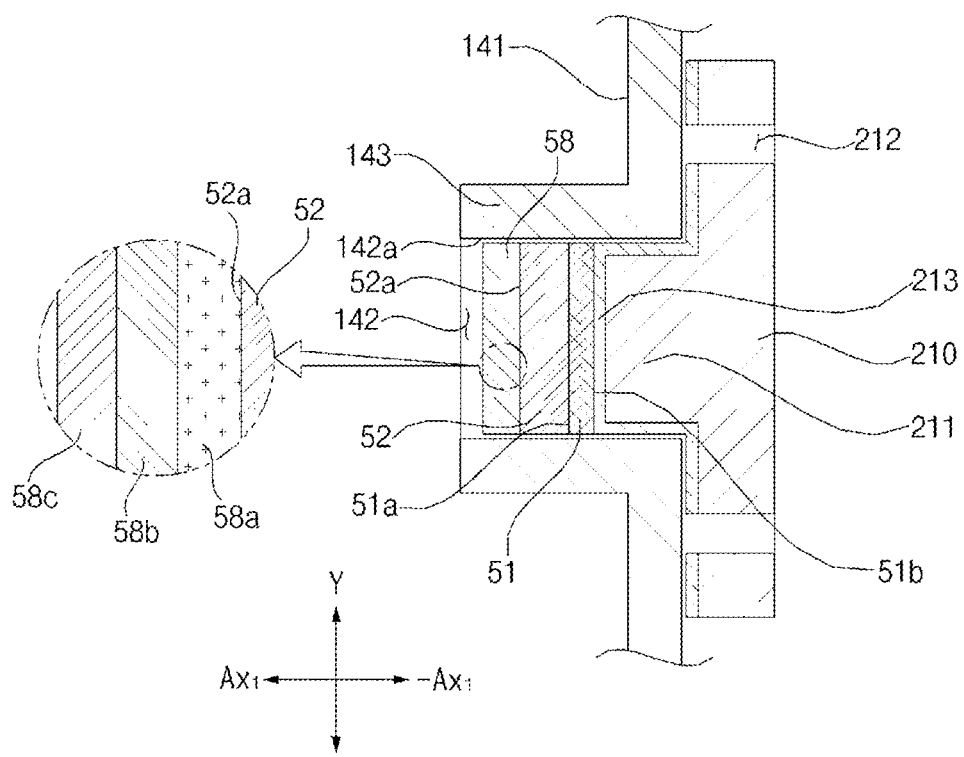
FIG. 15B is a sectional view illustrating the coupling between a bracket and a heat dissipation unit according to a further embodiment of the present invention.

FIG. 15B is a sectional view illustrating the coupling between a bracket and a heat dissipation unit 200 according to a further embodiment of the present invention.

Referring to FIG. 15B, the light emitting module according to this embodiment shown in FIG. 15B is different from the light emitting module of the previous embodiment shown in FIG. 11D in that the wavelength conversion unit according to this embodiment further includes a light extraction layer 58.

The light extraction layer 58 reduces total reflection occurring on the boundary surface between the wavelength conversion device 52 and external air, i.e. the light radiation surface 52a. Specifically, the light extraction layer 58 reduces the difference in refractive index between the wavelength conversion device 52 and the external air to reduce total reflection occurring on the boundary surface between the wavelength conversion device 52 and the external air.

The light extraction layer 58 is supported by the light radiation surface 52a of the wavelength conversion device 52. The light extraction layer 58 covers the light radiation surface 52a of the wavelength conversion device 52.

The refractive index of the light extraction layer 58 may be less than that of the wavelength conversion device 52, and may be greater than 1. Specifically, the light extraction layer 58 has a refractive index of 1.1 to 1.6.

The light extraction layer 58 may have a single-layered structure or a multi-layered structure. In this embodiment, as shown in FIG. 15B, the light extraction layer 58 has a multi-layered structure. Specifically, the light extraction layer 58 has a plurality of refraction layers 58a, 58b, and 58c. The refraction layers 58a, 58b, and 58c have different refractive indices, which gradually increases toward the light radiation surface 52a of the wavelength conversion device 52.

Figure 16A:
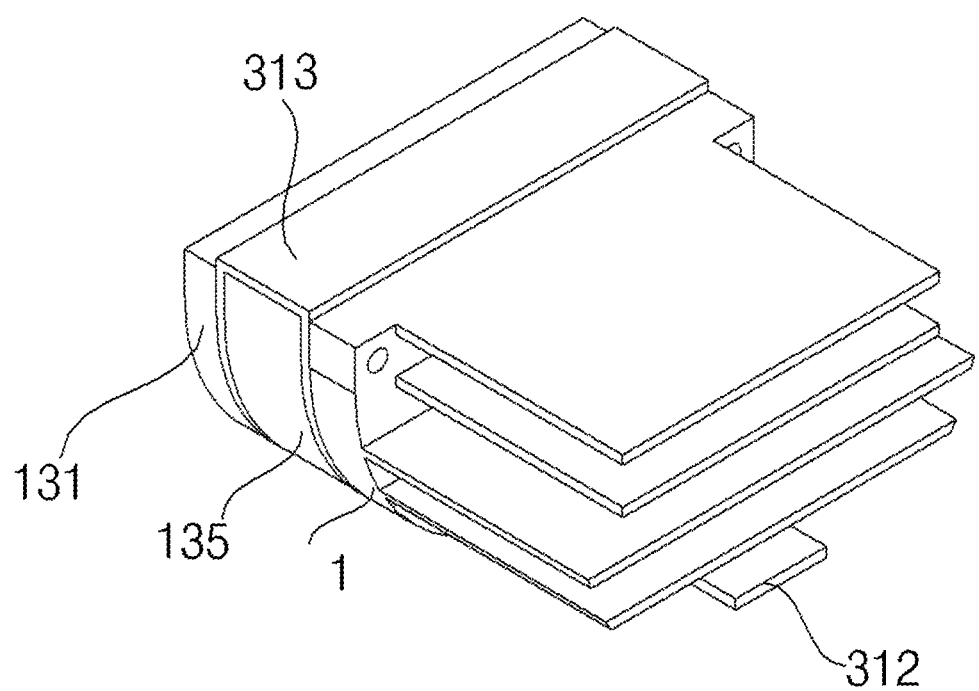
FIG. 16A is a perspective view illustrating the coupling between a light source case and a light source heat dissipation unit according to another embodiment of the present invention.
Figure 16B:
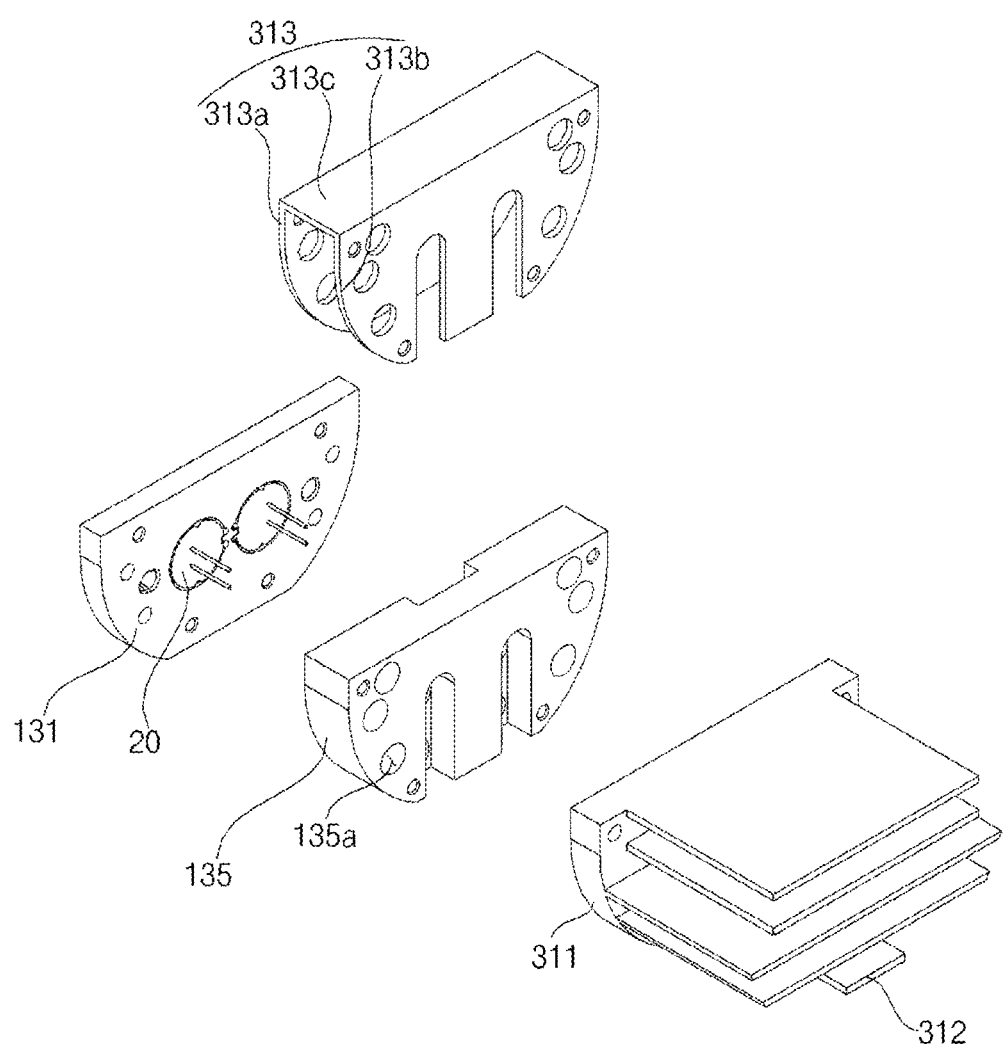
FIG. 16B is an exploded perspective view of the light source case and the light source heat dissipation unit illustrated in FIG. 16A.
Figure 16C:
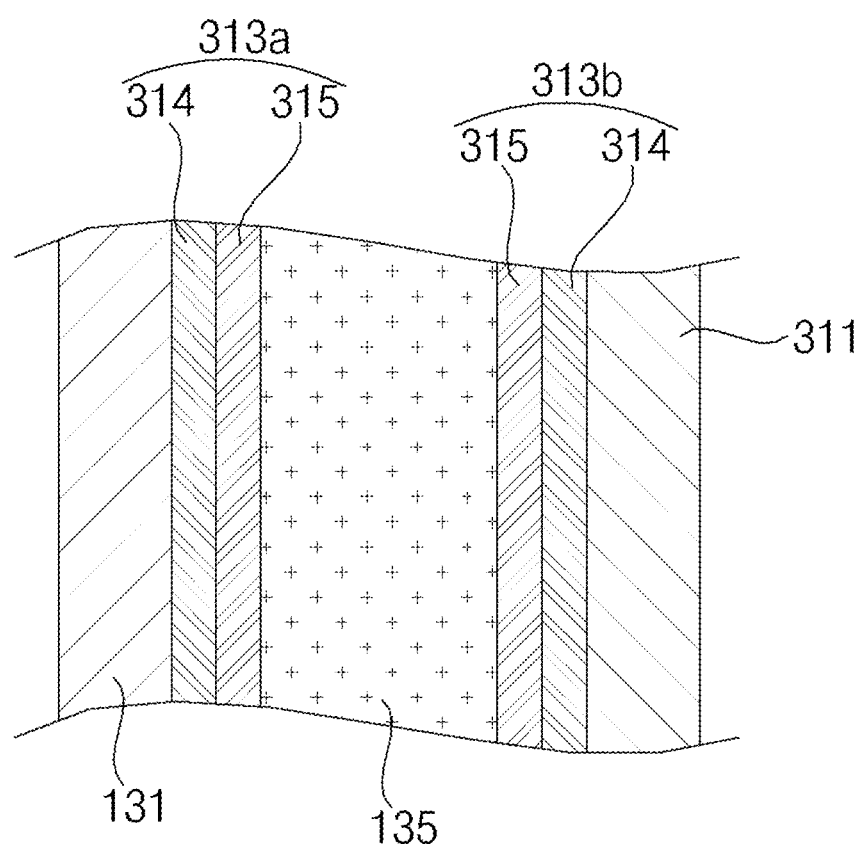
FIG. 16C is a sectional view of the light source case and the light source heat dissipation unit illustrated in FIG. 16A.

FIG. 16A is a perspective view illustrating the coupling between a light source case and a light source heat dissipation unit according to another embodiment of the present invention, FIG. 16B is an exploded perspective view of the light source case and the light source heat dissipation unit illustrated in FIG. 16A, and FIG. 16C is a sectional view of the light source case and the light source heat dissipation unit illustrated in FIG. 16A.

Referring to FIGS. 16A, 16B, and 16C, the light source heat dissipation unit 300 according to this embodiment is different from the light source heat dissipation unit 300 of the previous embodiment shown in FIG. 10 in that the first light source heat dissipation unit 320 is omitted, and the second light source heat dissipation unit 310 is configured differently.

The second light source heat dissipation unit 310 according to this embodiment includes a heat dissipation transfer member 313, a heat dissipation plate 311, and a second heat dissipation member 312. The second heat dissipation member 312 is identical to that shown in FIG. 10.

The heat dissipation transfer member 313 rapidly transfer heat generated from the light source 20 and/or the light source case 103 to the heat dissipation plate 311. Specifically, one side of the heat dissipation transfer member 313 is inserted between the first light source case 131 and the second light source case 135, and the other side of the heat dissipation transfer member 313 is exposed outward from the light source case 103.

For example, the heat dissipation transfer member 313 includes a first circumferential plate 313a and a second circumferential plate 313b, which are disposed so as to face each other, and a connection plate 313c for connecting the first circumferential plate 313a and the second circumferential plate 313b to each other.

The first circumferential plate 313a is inserted between the first light source case 131 and the second light source case 135, and the second circumferential plate 313b is exposed outward from the light source case 103.

The heat dissipation transfer member 313 is disposed in surface contact with the first light source case 131 and the second light source case 135. Specifically, one surface of the first circumferential plate 313a of the heat dissipation transfer member 313 is disposed in surface contact with the first light source case 131, and the other surface of the first circumferential plate 313a of the heat dissipation transfer member 313 is disposed in surface contact with the second light source case 135. The light source 20 is disposed in contact with the heat dissipation transfer member 313. Specifically, the first circumferential plate 313a is disposed in contact with the light source 20.

The heat dissipation transfer member 313 has a thermal conductivity higher than that of the light source case 103. For example, the heat dissipation transfer member 313 may be made of a metal material that exhibits thermal conductivity higher than that of the light source case 103.

In another example, the heat dissipation transfer member 313 contains a thermally conductive organic material 314. The organic material exhibits high thermal conductivity. Specifically, the organic material may exhibit higher thermal conductivity than the metal layer. The organic material may be a carbon material. The carbon material may be at least one selected from a group consisting of graphite, graphene, carbon nano tube (CNT), and carbon nano fiber (CNF). Although the particle size of the organic material is not particularly restricted, the organic material may have a particle size of 200 μm or less, specifically 5 nm to 200 μm. Although the thermal conductivity of the organic material is not particularly restricted, the organic material may have a thermal conductivity of 3 W/mK or higher.

The heat dissipation transfer member 313 may have a multi-layered structure including an organic material 314 and a metal layer 315 for reinforcing the organic material 314, which has low rigidity.

The metal layer 315 is a base layer having high heat dissipation and supportability. For example, the metal layer 315 may be constituted by at least one selected from between a metal film and a metal mesh. Specifically, the metal layer 315 may be constituted by a metal film or a metal mesh or by stacking the metal film and the metal mesh. The metal layer 315 may be constituted by a metal film. The kind of metal constituting the metal layer 315 is not particularly restricted so long as the metal layer 315 is made of a metal material that exhibits high thermal conductivity.

Although the metal constituting the metal layer 315 is not particularly restricted, the metal layer 57a may be made of a metal material having a thermal conductivity of 3 W/mK to 420 W/mK.

In a concrete example, the metal layer 315 may be made of one (a single metal) selected from a group consisting of aluminum (Al), gold (Au), silver (Ag), copper (Cu), nickel (Ni), tin (Sn), zinc (Zn), tungsten (W), and iron (Fe), or an alloy (e.g. stainless steel) of at least two selected therefrom.

The first light source case 131 and the light source 20 are disposed in surface contact with the organic material 314 of the heat dissipation transfer member 313.

The heat dissipation plate 311 is disposed in surface contact with the heat dissipation transfer member 313. The heat dissipation plate 311 absorbs heat from the heat dissipation transfer member 313. Specifically, the heat dissipation plate 311 is disposed in surface contact with the other side of the heat dissipation transfer member 313, which is exposed outward from the light source case 103. In order to improve thermal conductivity, the organic material 314 of the heat dissipation transfer member 313 is disposed in surface contact with the heat dissipation plate 311.

In this embodiment, only one light source heat dissipation unit 300 is used; however, the heat dissipation transfer member 313, which exhibits high thermal conductivity, is further used, thereby maintaining heat dissipation efficiency while reducing the volume of the light emitting module.

Figure 17:
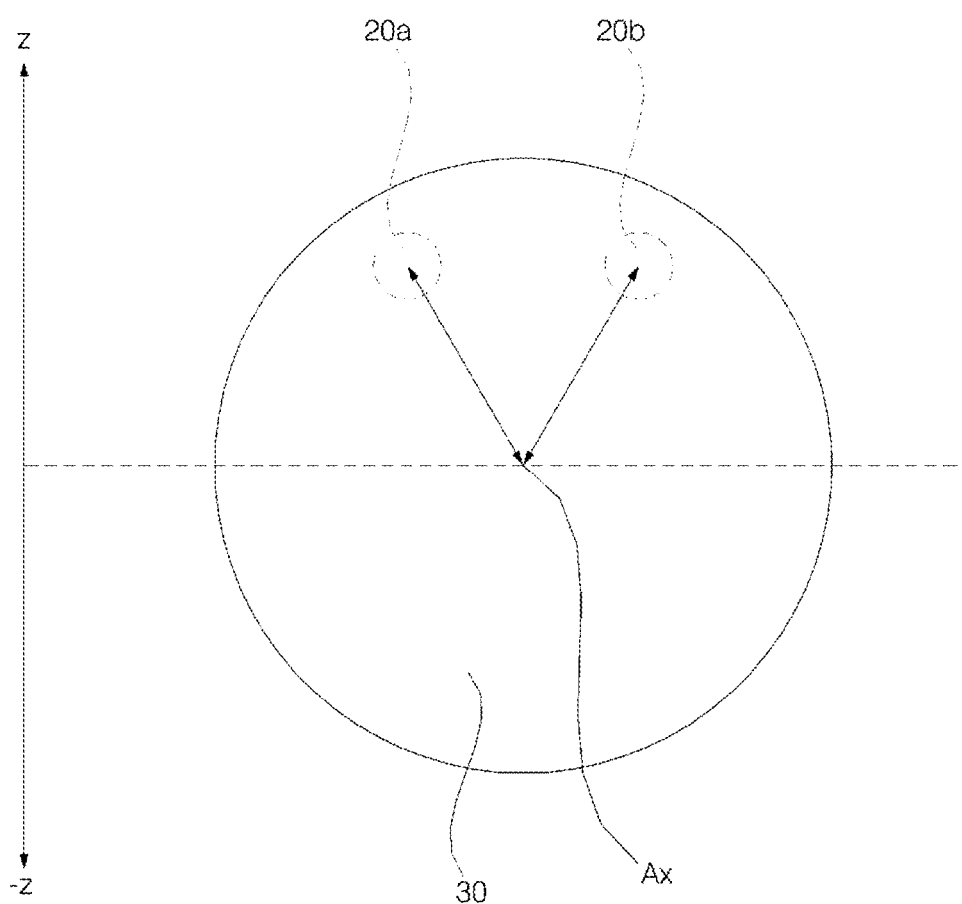
FIG. 17 is a conceptual view of a light emitting module according to another embodiment of the present invention.

FIG. 17 is a conceptual view of a light emitting module according to another embodiment of the present invention.

Referring to FIG. 17, the number of light sources 20 in the light emitting module 10 according to this embodiment is different from that in the light emitting module of the previous embodiment, shown in FIG. 1.

FIG. 17 is a view of the light emitting module when viewed from the front of the optical axis. The light emitting module according to this embodiment may include a plurality of light sources 20.

The light sources 20a and 20b are arranged in the first region of the condensing lens 30, and the distances (first distance h1) between the central axis Ax1 of the condensing lens 30 and the respective light sources 20a and 20b are equal. Therefore, when viewed from the front of the optical axis, the light sources 20a and 20b are arranged on a circular arc at the first distance h1 from the central axis Ax1 of the condensing lens 30 within the first region of the condensing lens 30. The minimum interval between the light sources 20a and 20b is set in consideration of heat dissipation.

Figure 18:
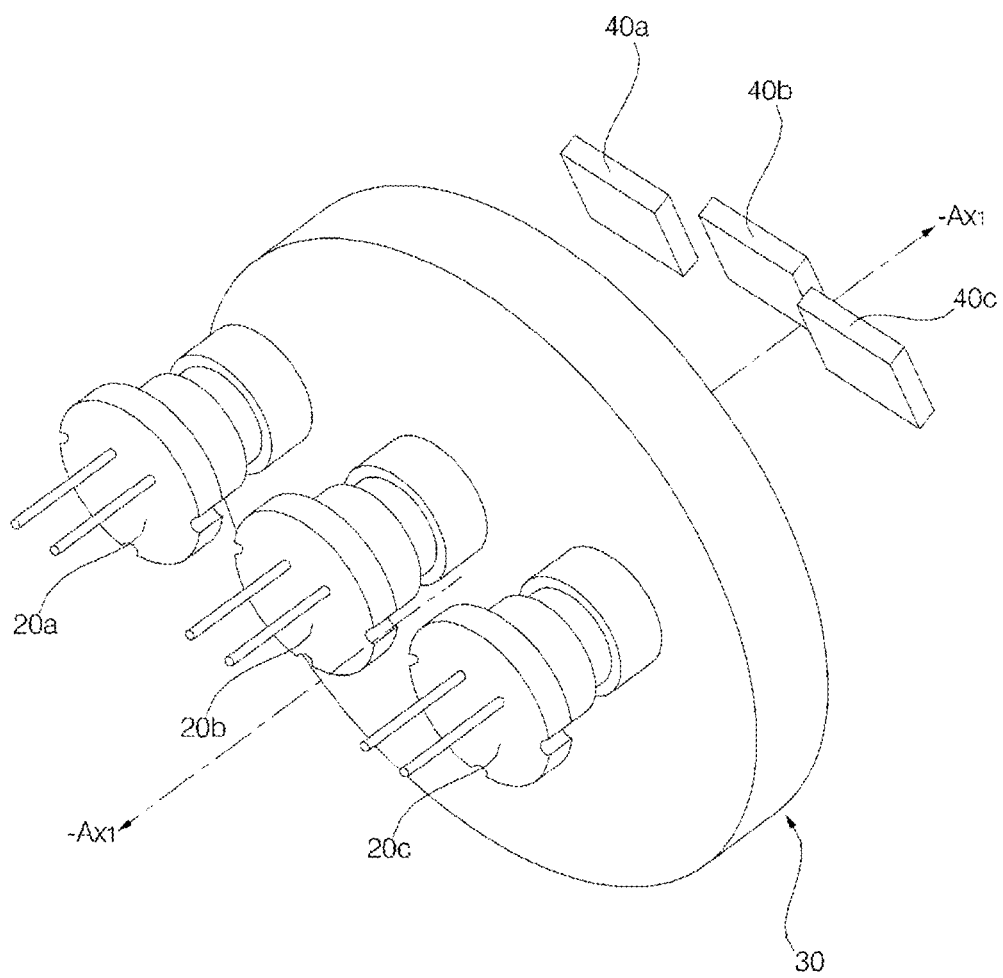
FIG. 18 is a conceptual view of a light emitting module according to a further embodiment of the present invention.

FIG. 18 is a conceptual view of a light emitting module according to a further embodiment of the present invention.

Referring to FIG. 18, the number of light sources 20 and first optical path conversion members 40 in the light emitting module 10 according to this embodiment is different from those in the light emitting module of the previous embodiment, shown in FIG. 1.

The light emitting module according to this embodiment may include a plurality of light sources 20 and a plurality of first optical path conversion members 40.

The light sources 20a, 20b, and 20C are arranged in the first region of the condensing lens 30, and the distances (first distance h1) between the central axis Ax1 of the condensing lens 30 and the respective light sources 20a, 20b, and 20C are equal. Therefore, when viewed from the front of the optical axis, the light sources 20a, 20b, and 20C are arranged on a circular arc at the first distance h1 from the central axis Ax1 of the condensing lens 30 within the first region of the condensing lens 30. The minimum interval among the light sources 20a, 20b, and 20C is set in consideration of heat dissipation.

The first optical path conversion members 40a, 40b, and 40C are arranged in the first region of the condensing lens 30. Light beams, generated by the light sources 20a, 20b, and 20C, pass through the condensing lens 30, and are then incident on the first optical path conversion members 40a, 40b, and 40C. The number of the first optical path conversion members 40a, 40b, and 40C corresponds to that of the light sources 20a, 20b, and 20C. The first optical path conversion members 40a, 40b, and 40C may individually adjust reflected angles of the light beams incident from the light sources 20a, 20b, and 20C such that the light beams radiated to the wavelength conversion unit 50 is concentrated on a single spot.

Figure 19:
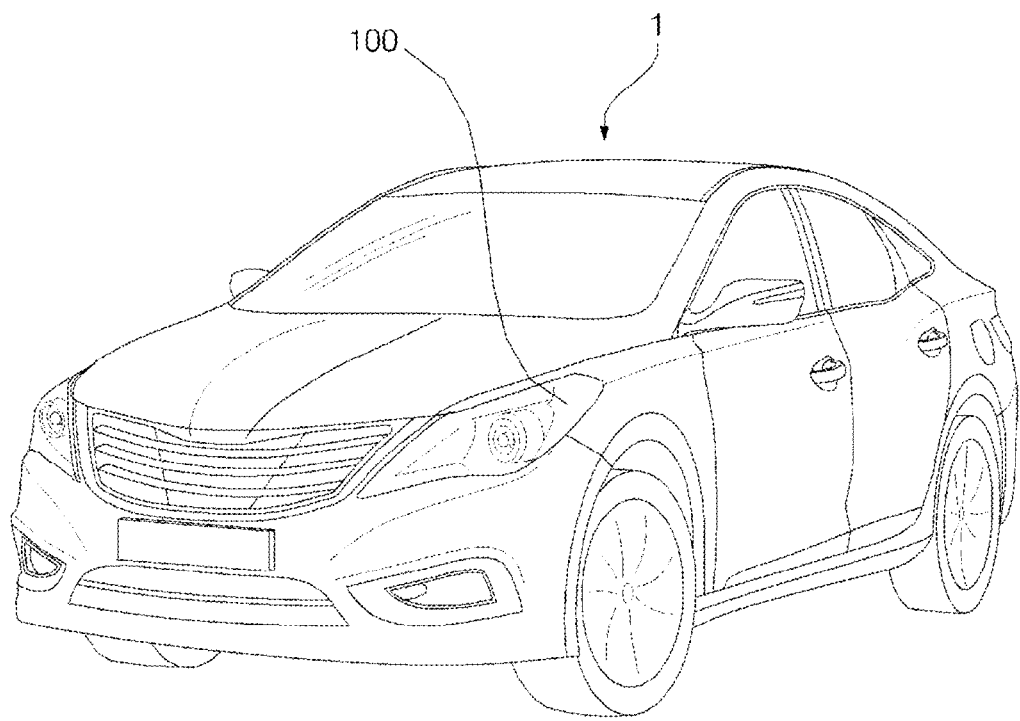
FIG. 19 is a view illustrating a car equipped with the light emitting module according to the present invention.
Figure 20:
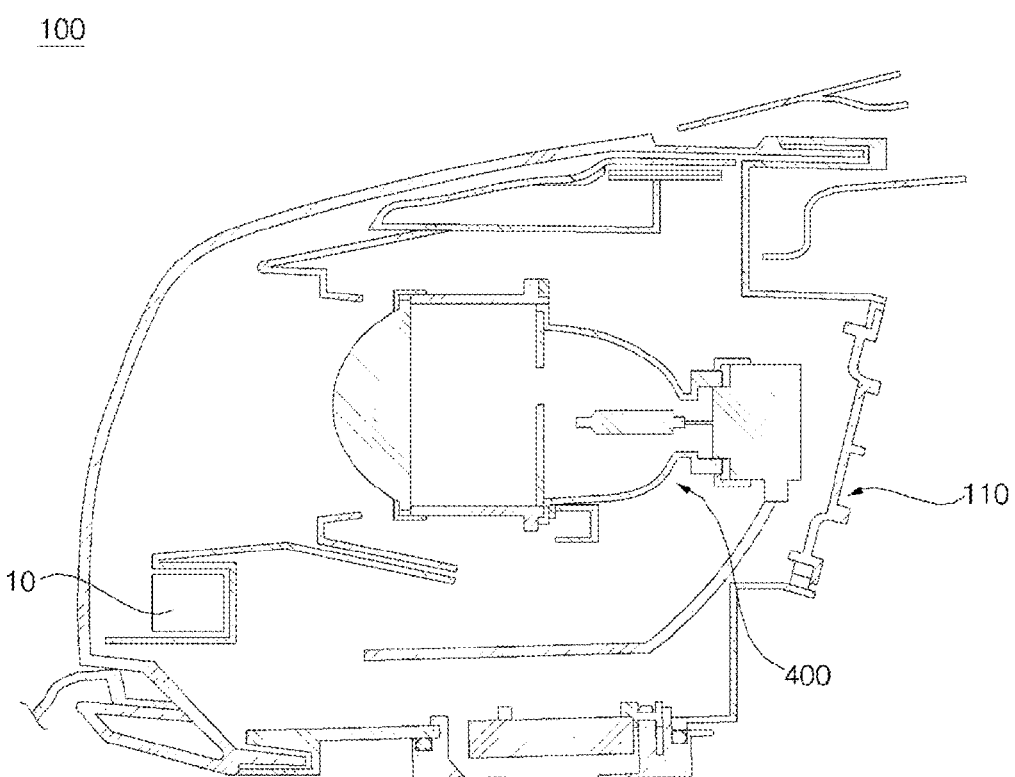
FIG. 20 is a sectional view illustrating a lamp device for vehicles including the light emitting module according to the present invention.

FIG. 19 is a view illustrating a car equipped with the light emitting module 10 according to the present invention, and FIG. 20 is a sectional view illustrating a lamp device for vehicles including the light emitting module 10 according to the present invention.

Referring to FIG. 19, the light emitting module 10 according to the embodiment is mounted to the front portion of a vehicle 1. The light emitting module 10 may be accommodated in an automotive lamp device 100, and the automotive lamp device 100 may be mounted to the front portion of the vehicle 1. In this embodiment, the automotive lamp device 100 includes a head lamp for illuminating the area ahead while driving at night, a fog lamp, a turn signal lamp and so on.

In another embodiment, the automotive lamp device may be mounted to the rear portion of the vehicle 1 so as to function as a tail lamp.

Referring to FIG. 20, the automotive lamp device 100 according to the embodiment of the present invention comprises the lamp housing 110 and the light emitting module 10 accommodated in the lamp housing 110.

According to embodiments, the automotive lamp device 100 may further comprise a light source unit 400.

The lamp housing 110 provides a space in which the light emitting module 10 and/or the light source unit 400 are disposed.

The light source unit 400 functions to output light which is necessary for vehicle driving.

Here, the light emitting module 10 and the light source unit 400 may emit the same type of light. Preferably, the light emitted from the light emitting module 10 may have a different color from that emitted from the light source unit 400, or one thereof may be plane light and the other may be point light.

The light emitted from the light source unit 400 has good diffusivity and may be used to illuminate a region spaced apart by a short distance. The light emitted from the light emitting module 10 has good straightness and may be used to illuminate a small region spaced apart by a long distance.

The light emitting module 10 may use a laser diode, and the light source unit 400 may use a xenon lamp.

A light emitting module according to another embodiment of the present invention includes a condensing lens 30, a light source 20, a first optical path conversion member 40, a mirror bracket 151, a main case 101, and a mirror adjustment unit.

Figure 21:
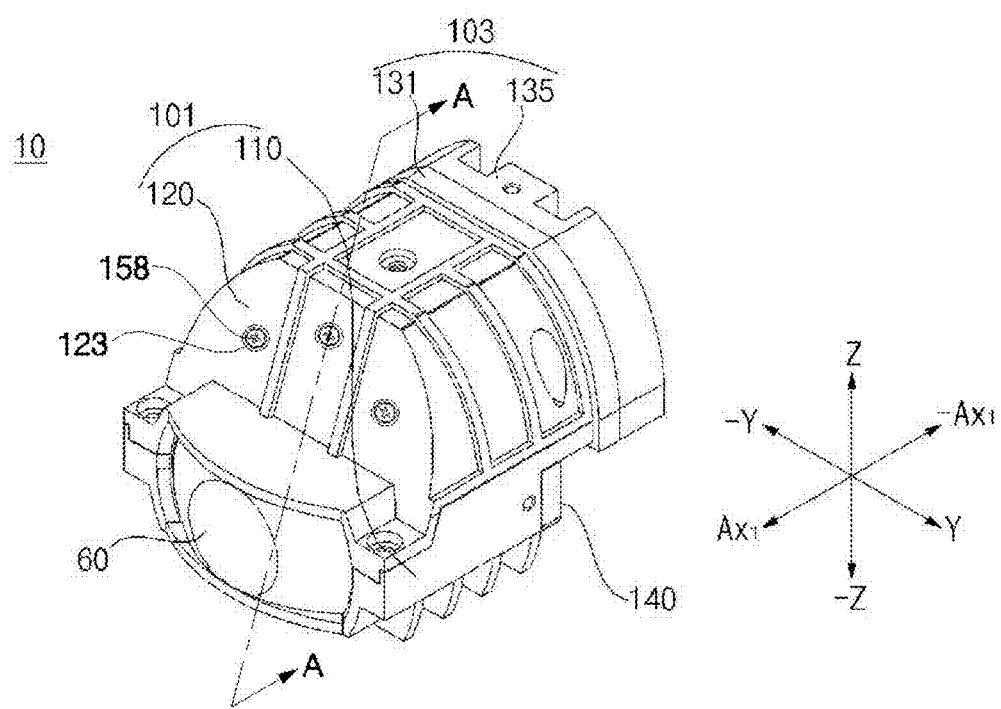
FIG. 21 is a perspective view of a light emitting module including a case according to another embodiment of the present invention.
Figure 22A:
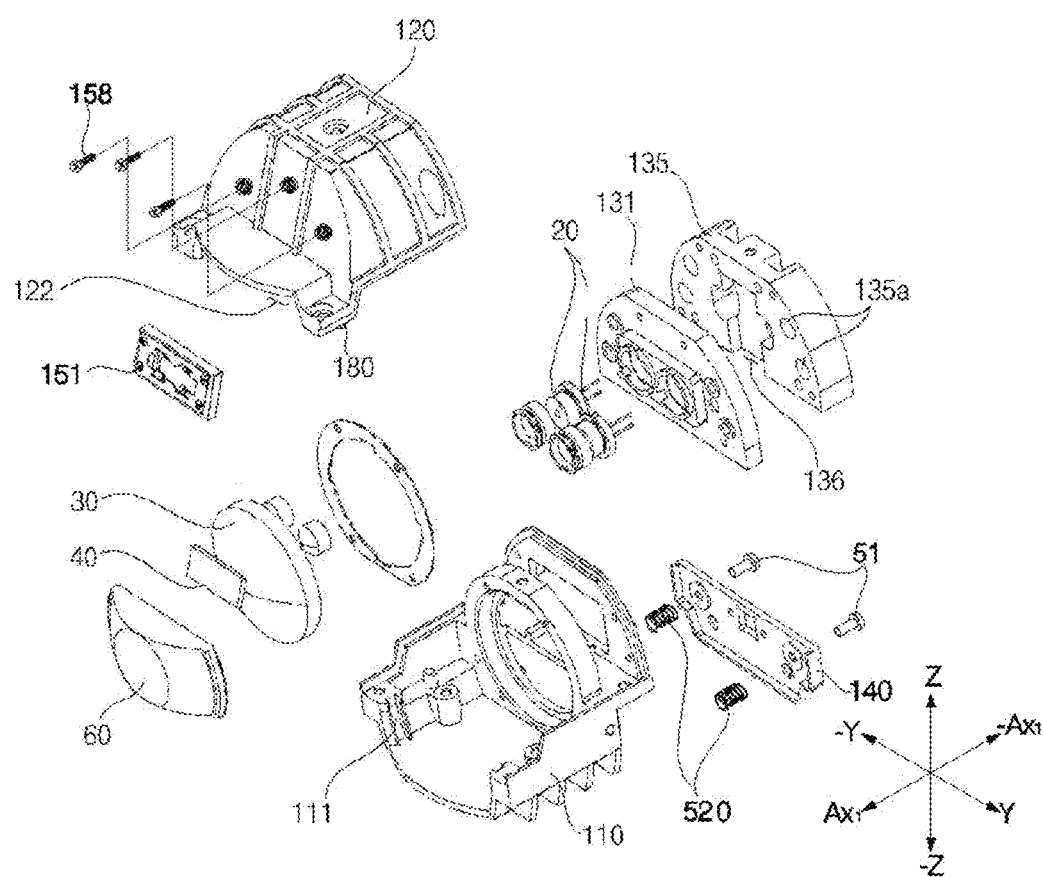
FIGS. 22A and 22B are exploded perspective views of the light emitting module including the case shown in FIG. 21 when viewed in different directions.
Figure 22B:
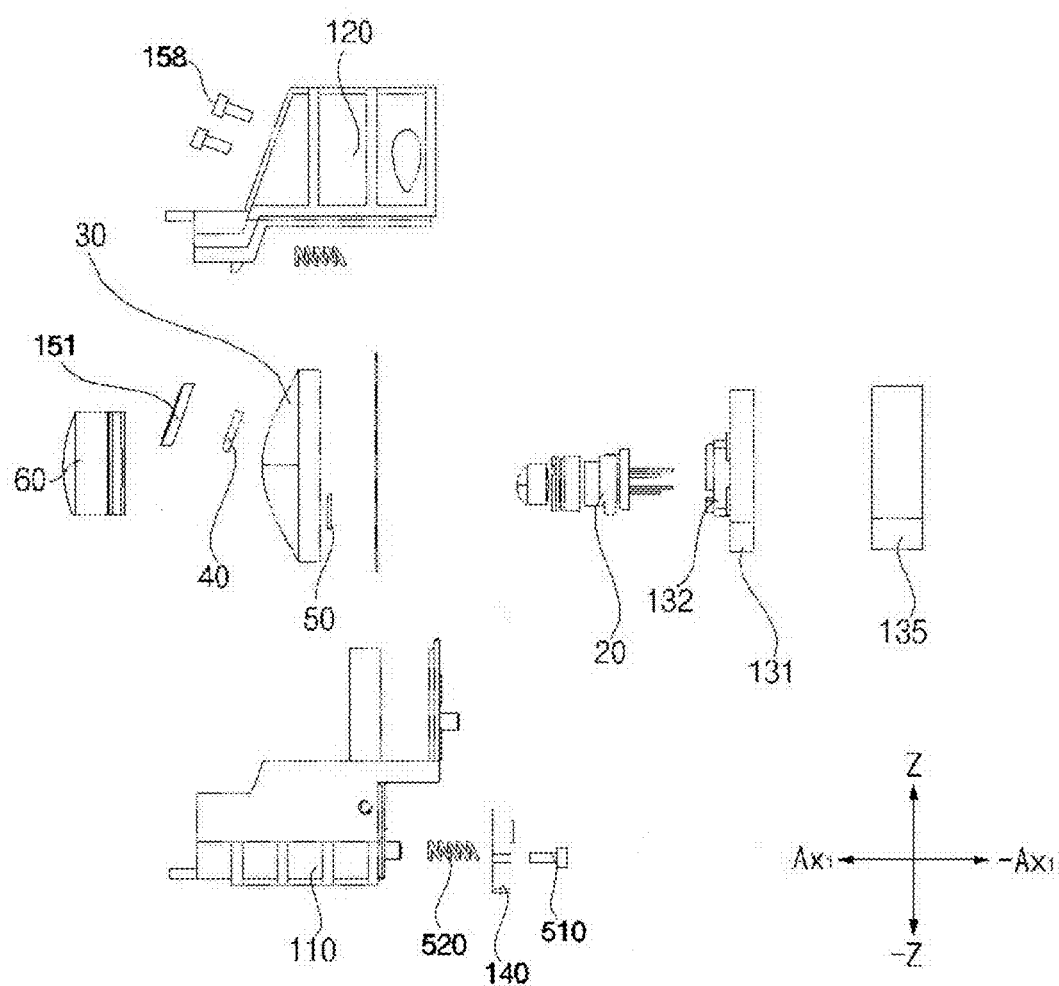
Figure 23A:
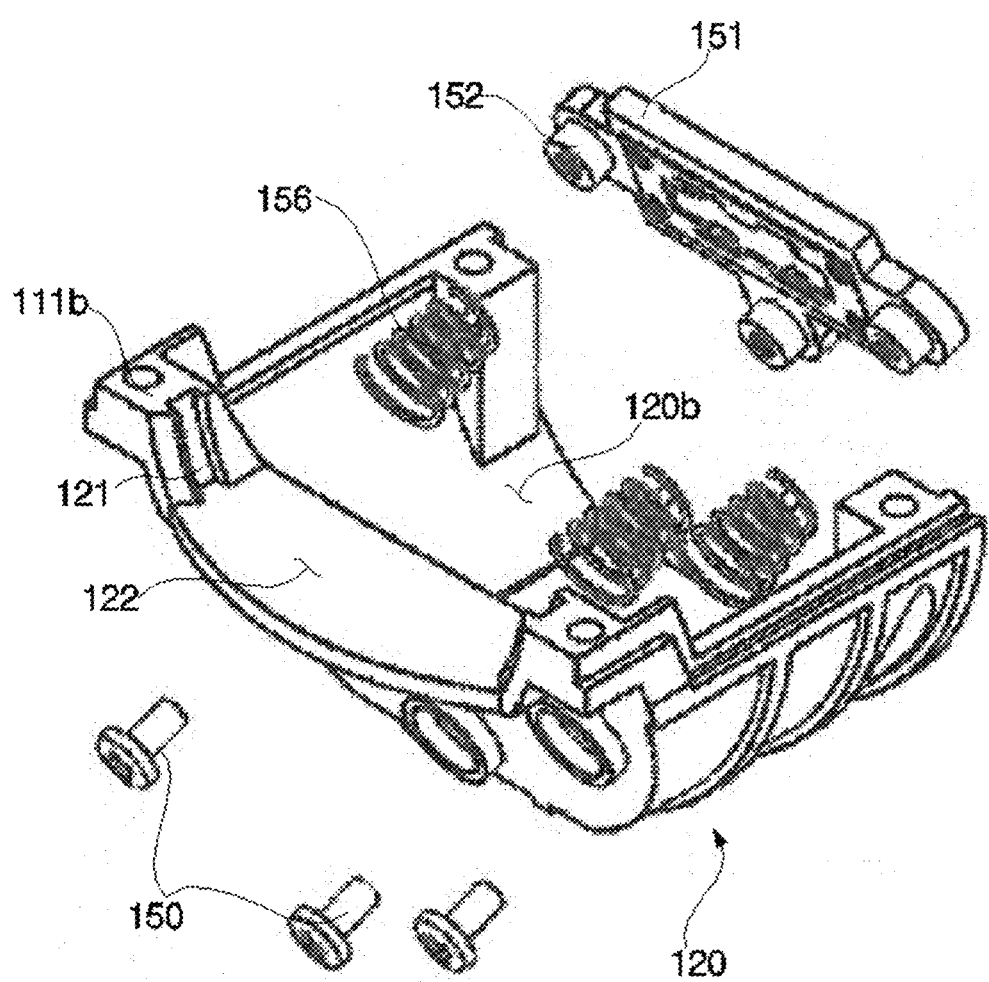
FIG. 23A is a perspective view of a first case shown in FIG. 21.
Figure 23B:
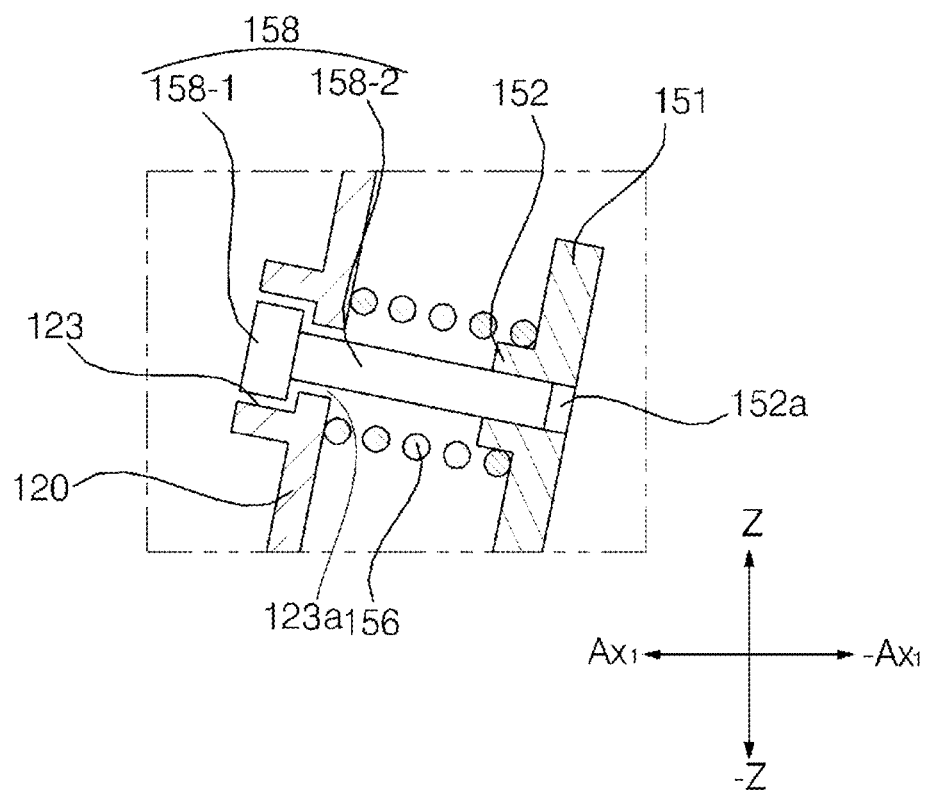
FIG. 23B is a sectional view of the light emitting module taken along line A-A of FIG. 21.
Figure 23C:
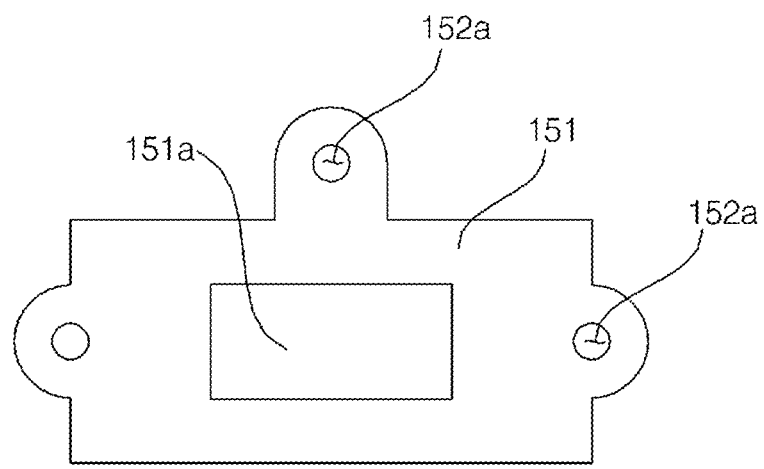
FIG. 23C is a front view of a mirror bracket according to an embodiment of the present invention.
Figure 24A:
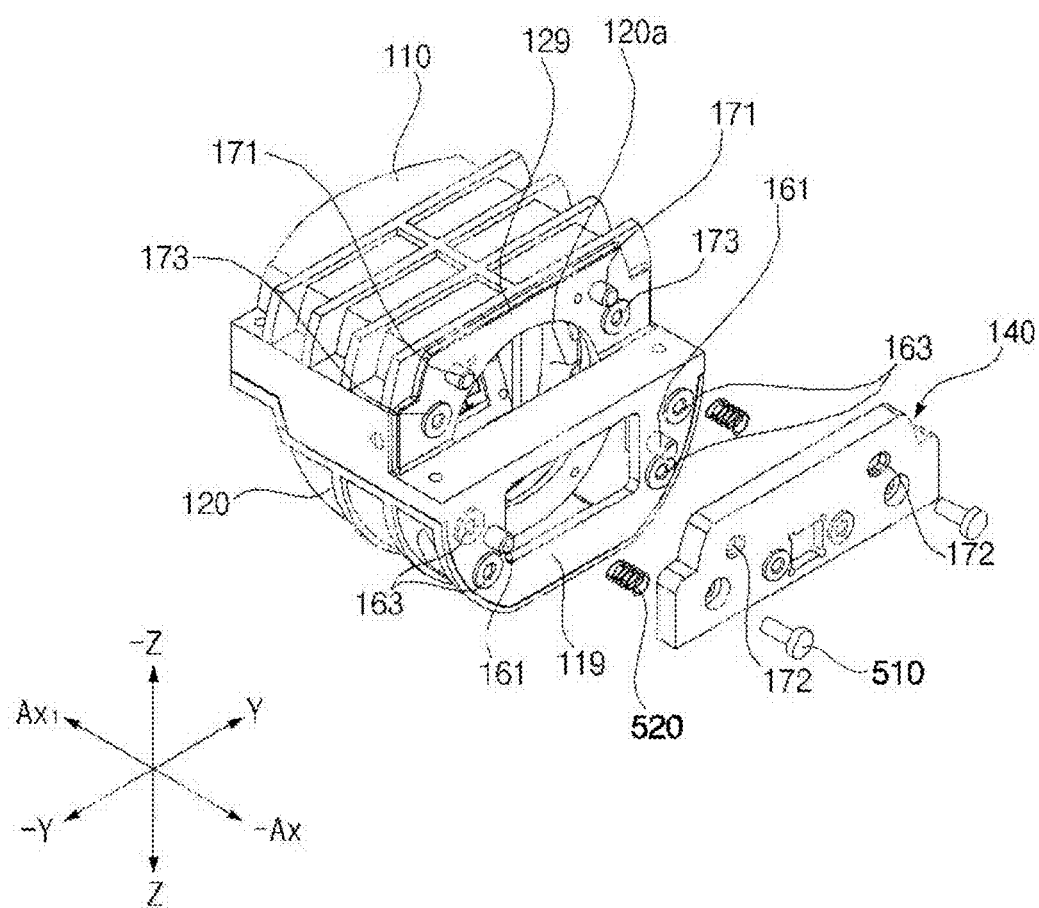
FIGS. 24A and 24B are exploded perspective views of a main case and a bracket according to an embodiment of the present invention when viewed in different directions.
Figure 24B:
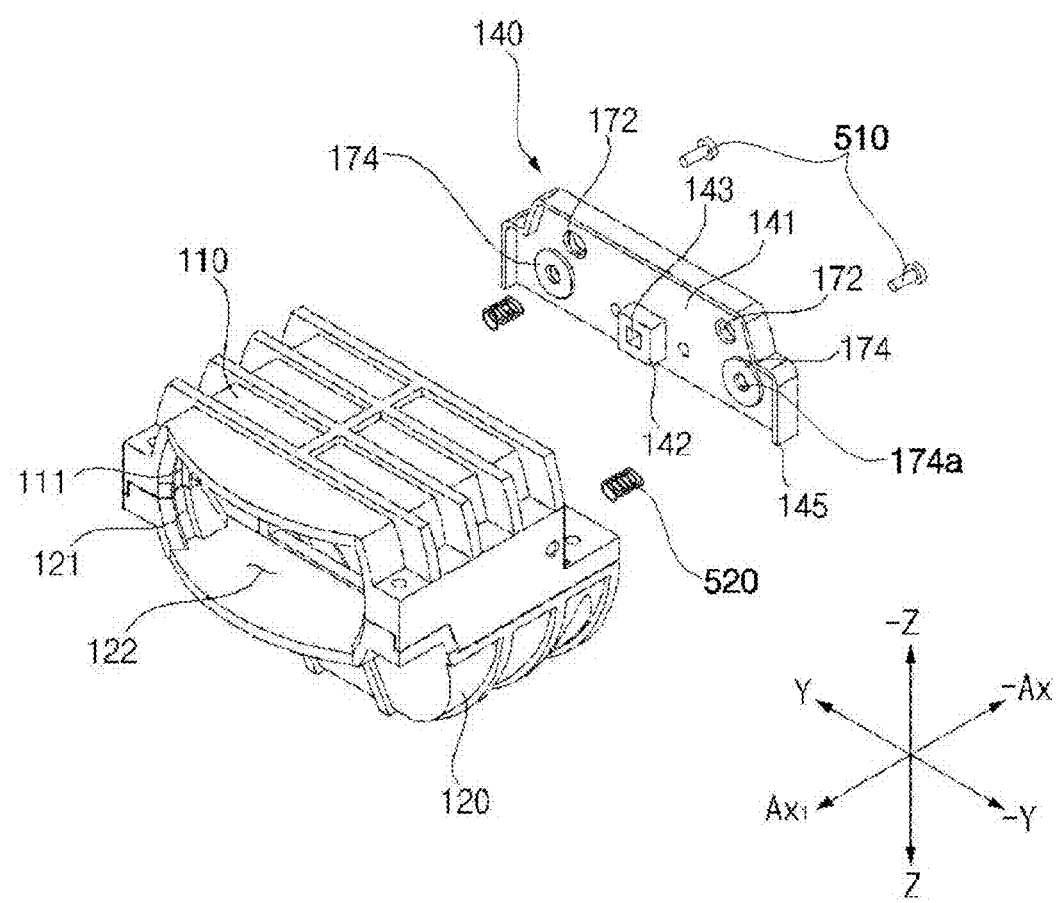
Figure 24C:
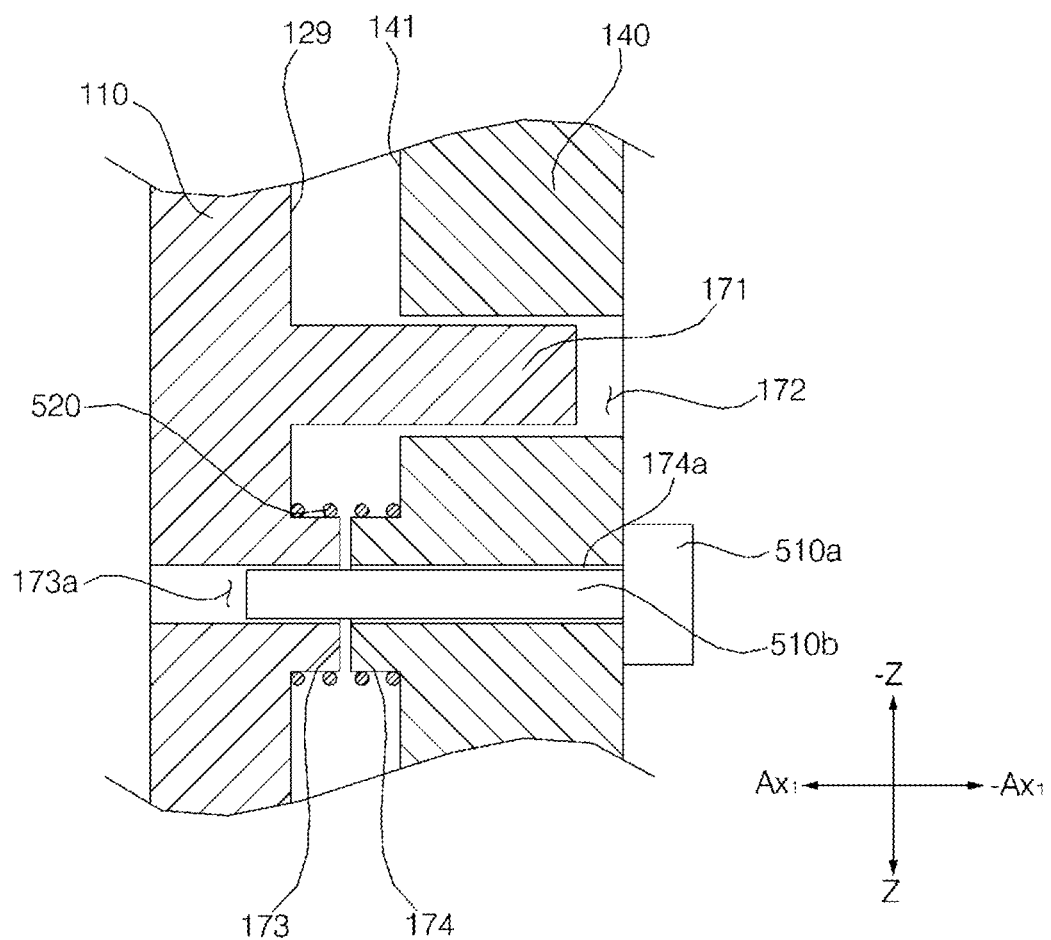
FIG. 24C is a sectional view of the main case and the bracket according to the embodiment of the present invention when the main case and the bracket are coupled to each other.
Figure 24D:
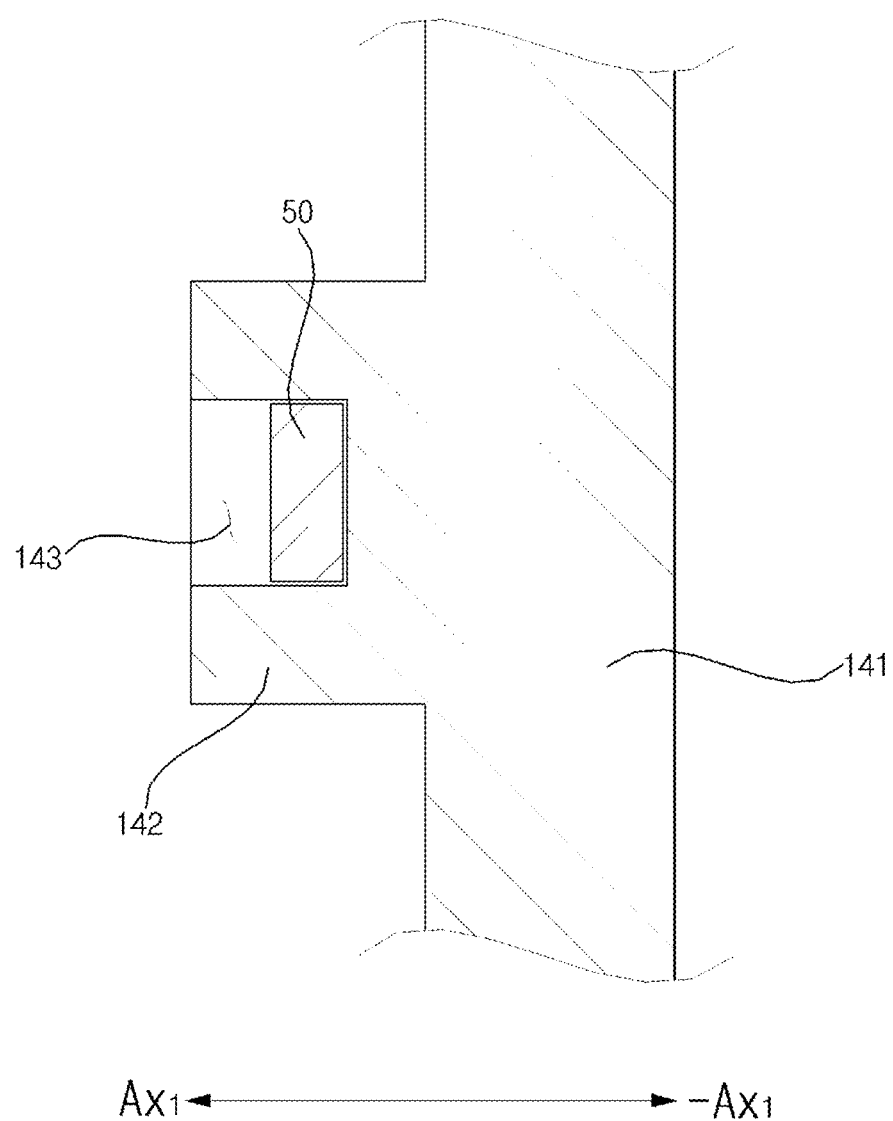
FIG. 24D is a partial sectional view of the bracket according to the embodiment of the present invention.

Referring to FIGS. 21 to 23, the light emitting module according to this embodiment is different from the light emitting module according to the embodiment shown in FIG. 7 in that the light emitting module according to this embodiment does not include a light source heat dissipation unit and a heat dissipation unit 200 but includes a mirror adjustment unit.

For example, a case includes a main case 101 and a light source case 103. Alternatively, the case includes a main case 101, a light source case 103, and a bracket 140.

In order to improve convenience in assembly and to reduce tolerance, a plurality of segments may be coupled to constitute the main case 101. As shown in FIGS. 23A and 23B, the main case 101 includes a first case 110 and a second case 120.

As previously described, the first optical path conversion member 40 is spaced apart from the condensing lens 30 to reflect light that has passed through the condensing lens 30 such that the light is provided back to the condensing lens 30.

Specifically, the first optical path conversion member 40 is coupled to the main case 101. More specifically, the first optical path conversion member 40 is coupled to the main case 101 such that the angle of first reflected light 22 can be adjusted.

For example, the first optical path conversion member 40 is received in the mirror bracket 151, and the mirror bracket 151 is coupled to the main case 101 via the mirror adjustment unit.

In particular, referring to FIGS. 23D and 23E, the mirror bracket 151 receives the first optical path conversion member 40. The mirror bracket 151 provides a space, in which the first optical path conversion member 40 is received, and a space, in which the mirror adjustment unit is coupled. The distance between the mirror bracket 151 and the condensing lens 30 is adjusted by the mirror adjustment unit. In addition, the angle of a reflection surface of the first optical path conversion member 40 is adjusted by the mirror adjustment unit.

The mirror bracket 151 may be provided with a location surface 151a, on which the first optical path conversion member 40 is located. The location surface 151a may be formed by depressing one surface of the mirror bracket 151. The first optical path conversion member 40 is coupled to the mirror bracket 151 using various kinds of coupling means.

The mirror bracket 151 is provided with a plurality of screw recesses 152a, into which adjustment bolts 158, which will be described hereinafter, are screw-coupled. Specifically, the screw recesses 152a are formed so as to correspond to the respective adjustment bolts 158. The screw recesses 152a are spaced apart from each other in order to provide a degree of freedom to the mirror bracket 151. More specifically, the screw recesses 152a, which are formed in the mirror bracket 151, may be arranged oppositely or symmetrically with respect to the location surface 151a, on which the first optical path conversion member 40 is located.

The screw recesses 152a may be formed by forming screws in recesses formed in the mirror bracket 151 or by forming screws in holes formed through the mirror bracket 151.

For example, as shown in FIG. 23E, the location surface 151a is provided in the center of the mirror bracket 151, and the screw recesses 152a are provided around the location surface 151a. The screw recesses 152a may be spaced apart from each other along a line surrounding the location surface 151a.

In addition, the mirror bracket 151 is provided with a positioning surface 152, which is in contact with one surface of the main case 101, for setting the initial position of the mirror bracket 151. As least two positioning surfaces 152 may be provided. The positioning surfaces 152 are in surface contact with the main case for adjustment of the correct position of the mirror bracket 151. The positioning surfaces 152 are flat. The positioning surfaces 152 may protrude from the mirror bracket 151. The screw recesses 152a may be formed in the respective positioning surfaces 152.

Consequently, it is possible to prevent light incident on the first optical path conversion member 40 from being lost due to the adjustment bolts 158.

The mirror adjustment unit couples the mirror bracket 151 to the main case 101. In addition, the mirror adjustment unit adjusts the position of the mirror bracket 151. The mirror adjustment unit may be configured such that the first optical path conversion member 40 can be tilted about one axis or two axes. The mirror adjustment unit provides a degree of freedom to the mirror bracket 151. Specifically, the mirror adjustment unit allows the reflection surface of the first optical path conversion member 40 and/or the location surface 151*a* of the mirror bracket 151 to be tilted with respect to a vertical surface and/or a horizontal surface. The mirror adjustment unit adjusts the distance between the first optical path conversion member 40 and the condensing lens 30.

During the manufacture of the light emitting module, the position of the first optical path conversion member 40 at which optimal efficiency can be obtained is set in consideration of a light path. However, tolerances generated in the manufacturing process are accumulated, with the result that the efficiency of the light emitting module is reduced, contrary to the design. The mirror adjustment unit prevents the reduction in efficiency of the light emitting module attributable to such accumulated tolerances.

The mirror adjustment unit adjusts the distance between the main case 101 and the mirror bracket 151.

For example, the mirror adjustment unit includes at least two elastic bodies 156 for providing elastic force to one surface of the main case 101 and to the mirror bracket 151 and at least two adjustment bolts 158 extending through the one surface of the main case 101 so as to be screw-coupled into the screw recesses 152*a*, which are formed in the mirror bracket 151.

The elastic bodies 156 are disposed between the second case 120 of the main case 101 and the mirror bracket 151. Specifically, the elastic bodies 156 are realized as coil springs. One end of each of the coil springs is in contact with the main case 101, and the other end of each of the coil springs is in contact with the surface of the mirror bracket 151 opposite the location surface 151*a* of the mirror bracket 151. The coil springs are fitted on the respective adjustment bolts 158.

The adjustment bolts 158 extend through one surface of the main case 101, and are then screw-coupled into the screw recesses 152*a*, which are formed in the mirror bracket 151. The number of adjustment bolts 158 is equal to the number of screw recesses 152*a*. At least two adjustment bolts 158 are provided.

In the mirror adjustment unit, the adjustment bolts 158 are independently rotatable so as to provide a degree of freedom to the location surface 151*a* of the mirror bracket 151. Specifically, when the adjustment bolts 158 are rotated, the distance between one surface of the main case 101 and one side of the mirror bracket 151 is adjusted. As the result of rotation of the adjustment bolts 158, the distance between one surface of the main case 101 and the mirror bracket 151 is changed. In addition, the angle of the reflection surface of the first optical path conversion member 40 with respect to the vertical surface and the horizontal surface is changed. Consequently, the position at which the first reflected light, reflected by the first optical path conversion member 40, is incident on the condensing lens 30 is changed.

Each of the adjustment bolts 158 includes a bolt body 158-2 having threads formed in the outer surface thereof and a head 158-1 coupled to one end of the bolt body 158-2, the head 158-1 having a size greater than that of the bolt body 158-2. For convenience in coupling and positioning, the head 158-1 of each of the adjustment bolts 158 is exposed outside the main case 101.

The main case 101 is provided with case holes 123*a*, through which the respective adjustment bolts 158 extend. The case holes 123*a* are formed in the front surface of the second case 120. The case holes 123*a* are spaced apart upward from the central axis of the condensing lens 30.

The main case 101 is provided with head walls 123, which surround the respective case holes 123*a*. The head 158-1 of each of the adjustment bolts 158 is placed in a corresponding one of the head walls 123.

Referring to FIGS. 24A to 24D, a light emitting module according to another embodiment of the present invention includes a condensing lens 30, a light source 20, a first optical path conversion member 40, a main case 101, a bracket 140, a second optical path conversion member 50, and a bracket adjustment unit.

The light emitting module according to this embodiment is different from the light emitting module according to the embodiment shown in FIG. 7 in that the light emitting module according to this embodiment does not include a light source heat dissipation unit or a heat dissipation unit 200, but includes a bracket adjustment unit.

The bracket 140 receives the second optical path conversion member 50. The bracket 140 is disposed such that light provided from the second optical path conversion member 50 is supplied to the condensing lens 30 through a window 120*a*.

Specifically, the bracket 140 is disposed such that a spot of light incident on the second optical path conversion member 50 is positioned at the center of the second optical path conversion member 50.

The second optical path conversion member 50 is received in the bracket 140, and the bracket 140 is coupled to the main case 101 via the bracket adjustment unit.

One surface of the bracket 140 covers at least the window 120*a*. The second optical path conversion member 50 is exposed from the surface of the bracket 140 that covers the window 120*a*.

Specifically, the bracket 140 includes a covering surface 141 for covering the circumference of the window 120*a*, an insertion protrusion 142 protruding from the covering surface 141 so as to be inserted into the window 120*a*, and a receiving recess 143 formed in the insertion protrusion 142 for receiving the second optical path conversion member 50.

The covering surface 141 is disposed so as to face the rear surface of the main case 101. The covering surface 141 constitutes a surface intersecting an optical axis. Specifically, the covering surface 141 is disposed so as to cover a lower rear surface 129 of the main case 101, which defines the circumference of the window 120*a*. A flange 145 is formed at the edge of the covering surface 141. The flange 145 matches the surface protruding from the rear surface of the main case 101.

The insertion protrusion 142 is formed so as to protrude from the covering surface 141. The insertion protrusion 142 and the covering surface 141 form a step. At least a portion of the insertion protrusion 142 is formed so as to correspond to the window 120*a* such that the insertion protrusion 142 can be received in the window 120*a*. The insertion protrusion 142 is inserted into the window 120*a* to prevent light provided from the second optical path conversion member 50 through the window 120*a* from leaking to the circumference of the window 120*a*. The insertion protrusion 142 may be disposed at the center of the covering surface 141.

The receiving recess 143 defines a space for receiving the second optical path conversion member 50. The receiving recess 143 is formed by depressing a portion of the insertion protrusion 142.

The position of the second optical path conversion member 50 and the distance between the second optical path conversion member 50 and the condensing lens 30 greatly affect the efficiency of the light emitting module and the shape and size of the light emitted by the light emitting module.

The distance between the bracket 140 and the condensing lens 30 is adjusted by the bracket adjustment unit. In addition, the angle of a reflection surface 51 of the second optical path conversion member 50 is adjusted by the bracket adjustment unit.

The bracket 140 is provided with a plurality of through holes 174a, into which fastening bolts 510, which will be described hereinafter, extend. Specifically, the through holes 174a are formed so as to correspond to the respective fastening bolts 510. The through holes 174a are spaced apart from each other in order to provide a degree of freedom to the bracket 140. More specifically, the through holes 174a, which are formed in the bracket 140, may be arranged oppositely or symmetrically with respect to the receiving recess 143, in which the second optical path conversion member 50 is located. Alternatively, the through holes 174a, which are formed in the bracket 140, may be arranged oppositely or symmetrically with respect to the second optical path conversion member 50, which is disposed in the bracket 140.

The through holes 174a are formed through the bracket 140. No threads are formed inside the through holes 174a. Consequently, the bracket 140 is tilted by the elastic force of a supporting elastic body 520.

For example, the receiving recess 143 is formed in the center of the bracket 140, and the through holes 174a are provided around the receiving recess 143. The through holes 174a may be spaced apart from each other along a line surrounding the receiving recess 143.

A second flat surface 173 and a second contact surface 174 are brought into surface contact with each other to set the initial position of the bracket 140. The second flat surface 173 and the second contact surface 174 contact each other so as to adjust the correct position of the bracket 140. The through holes 174a may be formed in the second flat surface 173 or the second contact surface 174.

Consequently, it is possible to prevent light incident on the second optical path conversion member 50 from being lost due to the fastening bolts 510.

The bracket adjustment unit couples the bracket 140 to the main case 101. In addition, the bracket adjustment unit adjusts the position of the bracket 140. The bracket adjustment unit may be configured such that the second optical path conversion member 50 can be tilted about one axis or two axes. The bracket adjustment unit provides a degree of freedom to the bracket 140. Specifically, the bracket adjustment unit tilts the reflection surface of the second optical path conversion member 50 and/or the bracket 140 with respect to a vertical surface and/or a horizontal surface. The bracket adjustment unit adjusts the distance between the second optical path conversion member 50 and the condensing lens 30.

During the manufacture of the light emitting module, the position of the second optical path conversion member 50 at which optimal efficiency can be obtained is designed in consideration of a light path. However, tolerances occurring in the manufacturing process are accumulated, with the result that the efficiency of the light emitting module is reduced, contrary to the design. The bracket adjustment unit prevents a reduction in the efficiency of the light emitting module attributable to such accumulated tolerances.

The bracket adjustment unit adjusts the distance between the main case 101 and the bracket 140.

For example, the bracket adjustment unit includes at least two support elastic bodies 520 for providing elastic force to the other surface of the main case 101 and to the bracket 140 and at least two fastening bolts 510 extending through the bracket 140 so as to be screw-coupled into the bolt recesses 173a, which are formed in the main case 101.

The support elastic bodies 520 are disposed between the second case 120 of the main case 101 and the bracket 140. Specifically, the support elastic bodies 520 are realized as coil springs. One end of each of the coil springs is in contact with an upper rear surface 119 of the main case 101, and the other end of each of the coil springs is in contact with the front surface of the bracket 140. The coil springs are fitted on the respective fastening bolts 510.

The fastening bolts 510 extend through one surface of the main case 101, and are then screw-coupled into the bolt recesses 173a, which are formed in the main case 101. The number of fastening bolts 510 is equal to the number of bolt recesses 173a. At least two fastening bolts 510 are provided.

The fastening bolts 510 are arranged oppositely or symmetrically with respect to the second optical path conversion member 50. The fastening bolts 510 are spaced apart from each other on an arbitrary curved line surrounding the receiving recess 143 of the bracket 140.

In the bracket adjustment unit, the fastening bolts 510 are independently rotated so as to provide a degree of freedom to the reflection surface of the second optical path conversion member 50. Specifically, when the fastening bolts 510 are rotated, the distance between the other surface of the main case 101 and one side of the bracket 140 is adjusted. As the result of rotation of the fastening bolts 510, the distance between the other surface of the main case 101 and the bracket 140 is changed. In addition, the angle of the reflection surface of the second optical path conversion member 50 with respect to the vertical surface and the horizontal surface is changed. Consequently, the position at which the second reflected light, reflected by the second optical path conversion member 50, is incident on the condensing lens 30 is changed.

Each of the fastening bolts 510 includes a bolt body 510b having threads formed in the outer surface thereof and a head 510a coupled to one end of the bolt body 510b, the head 510a having a size greater than that of the bolt body 510b. For convenience in coupling and positioning, the head 510a of each of the fastening bolts 510 is exposed outside the main case 101.

The main case 101 is provided with bolt recesses 173a, into which the respective fastening bolts 51 are screw-coupled. The bolt recesses 173a are formed in the upper rear surface 119 of the main case 101. The bolt recesses 173a may be formed in the main case 101. Alternatively, bolt holes may be formed in the main case 101. Threads are formed inside the respective bolt recesses 173a.

Figure 25A:
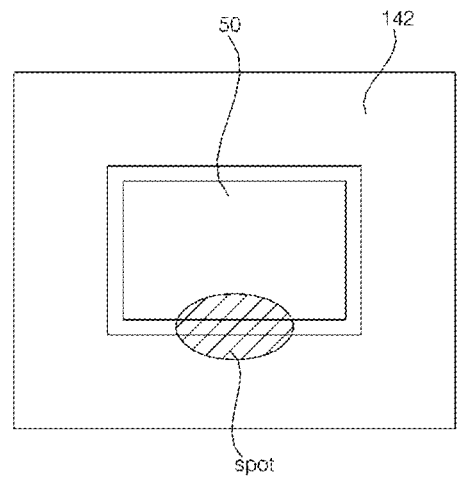
FIG. 25A is a view showing a spot of light incident on a second optical path conversion member in a light emitting module in which tolerances are generated and accumulate.

FIG. 25A is a view showing a spot of light incident on a second optical path conversion member in a light emitting module in which accumulated tolerances are generated.

Referring to FIG. 25A, even when the light emitting module is manufactured based on the initial design, light incident on the second optical path conversion member 50 is not positioned at the center of the second optical path conversion member 50 but is decentered due to accumulated tolerances. Consequently, some of the light incident on the second optical path conversion member 50 is incident on a member other than the second optical path conversion member 50, with the result that the loss of light occurs. The loss of light leads to the reduction in efficiency of the light emitting module.

Figure 25B:
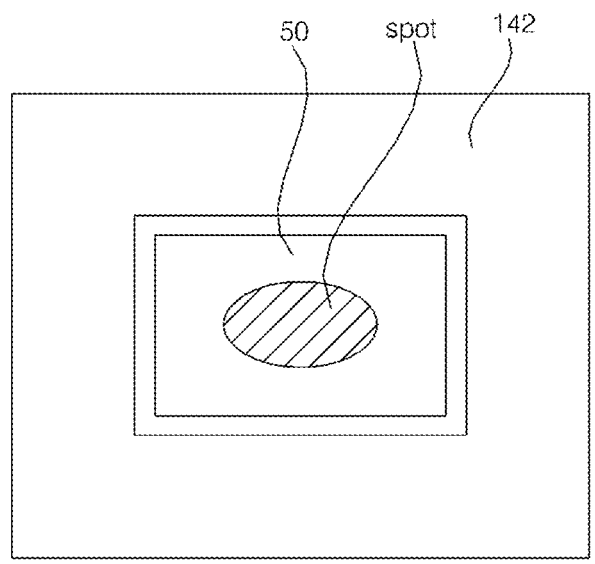
FIG. 25B is a view showing a spot of light incident on the second optical path conversion member in the state in which the accumulated tolerances generated in FIG. 25A are removed.
Figure 26:
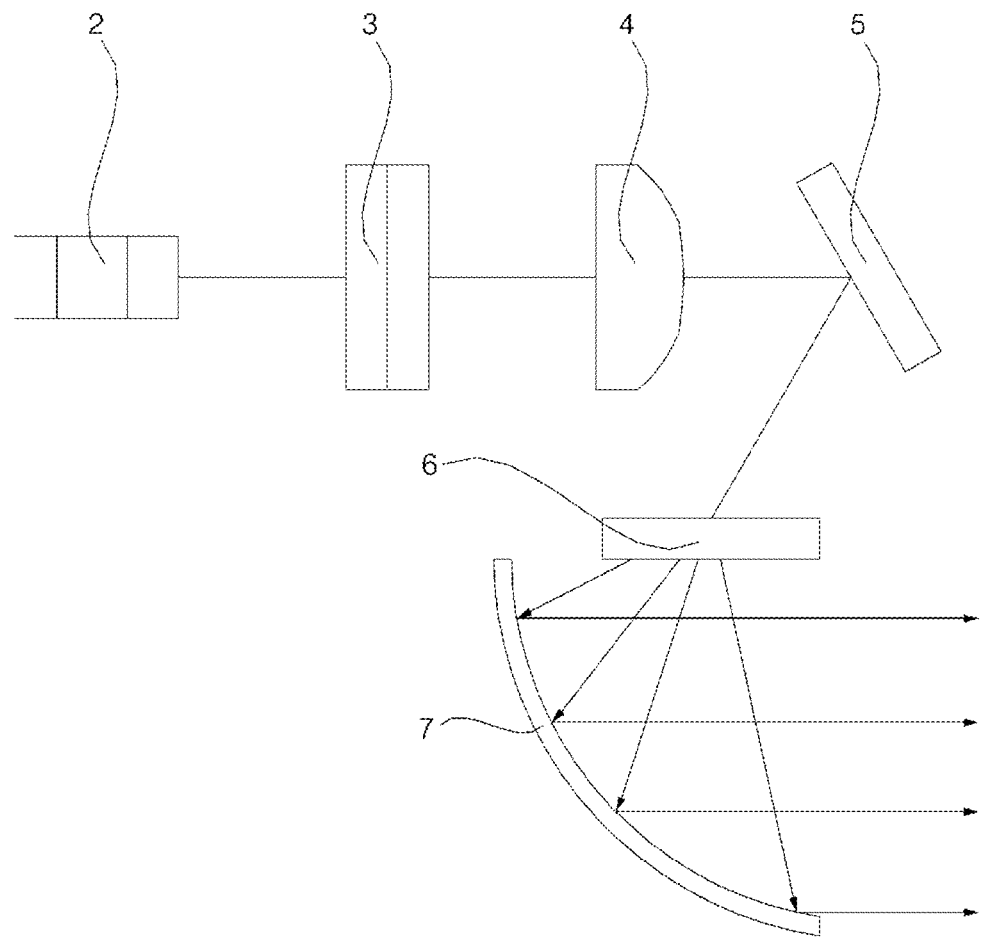
FIG. 26 is a conceptual view of a conventional light emitting module.

FIG. 25B is a view showing a spot of light incident on the second optical path conversion member in the state in which the accumulated tolerances generated in FIG. 25A are removed.

Referring to FIG. 25B, the mirror adjustment unit and/or the bracket adjustment unit may be operated such that light incident on the second optical path conversion member 50 is positioned at the center of the second optical path conversion member 50. As a result, the light emitting module has the intended efficiency.

In this embodiment, therefore, the angle of the light reflected by the first optical path conversion member 40 and/or the second optical path conversion member 50 is adjusted by the mirror adjustment unit and/or the bracket adjustment unit, thereby removing accumulated tolerances of the light emitting module.

According to embodiments, by disposing the light source at the upper portion behind the condensing lens and disposing the wavelength conversion unit at the lower portion behind the condensing lens, the length of the light emitting module may be reduced, and space utilization may be maximized. As a result, the light emitting module may be easily accommodated in the housing.

Further, since the condensing lens is divided into the upper and lower regions, the number of components constituting the light emitting module may be decreased and the manufacturing cost of the light emitting module may be reduced.

Further, since heat generated from the wavelength conversion unit and the light source is effectively dissipated, light efficiency and heat dissipation efficiency are improved.

Further, since a simple lens structure for condensing light is used instead of a multi-stage structure for condensing light emitted from the light source, the light emitting module may emit light having good light convergence and straightness.

Further, off-axis aberration may be compensated for.

Further, the positions of the light source and the wavelength conversion unit may be accurately adjusted using the positioning units.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A light emitting module comprising:
   a condensing lens for condensing incident light into a space;
   a light source for providing first light to pass through the condensing lens;
   a first optical path conversion member for reflecting the first light to provide first reflected light to pass through the condensing lens;
   a second optical path conversion member for providing the first reflected light as second reflected light to pass through the condensing lens; and
   a case for receiving at least the condensing lens, the light source, the first optical path conversion member, and the second optical path conversion member,
   wherein the case comprises:
      a main case for receiving at least the condensing lens and the first optical path conversion member,
      a mirror bracket received in the main case for supporting the first optical path conversion member, and
      a mirror adjustment unit for coupling the mirror bracket to the main case and adjusting a position of the mirror bracket, and
   wherein the mirror adjustment unit comprises:
      at least two elastic bodies for providing elastic force to one surface of the main case and to the mirror bracket, and
      at least two adjustment bolts extending through the one surface of the main case so as to be screw-coupled into screw recesses formed in the mirror bracket.

2. The light emitting module according to claim 1, wherein the case comprises:
   a main case for receiving at least the condensing lens and the first optical path conversion member, the main case having an optical opening for allowing light provided by the light source to pass therethrough; and
   a light source case for receiving the light source, the light source case being coupled to the main case such that light provided by the light source is supplied to the condensing lens through the optical opening.

3. The light emitting module according to claim 2, further comprising:
   a first positioning unit for setting a position of the light source, wherein
   the first positioning unit comprises:
   at least one first boss formed on one selected from between the main case and the light source case; and
   at least one first boss hole formed in the other selected from between the main case and the light source case such that the at least one first boss is inserted into the at least one first boss hole.

4. The light emitting module according to claim 2, further comprising:
   a first positioning unit for setting a position of the light source, wherein
   the first positioning unit comprises:
   at least one first flat surface formed on one selected from between the main case and the light source case; and
   a first contact surface formed on the other selected from between the main case and the light source case such that the first contact surface comes into surface contact with the first flat surface.

5. The light emitting module according to claim 2, further comprising:
   a bracket for receiving the second optical path conversion member, the bracket being coupled to the main case such that light having passed through the second optical path conversion member is supplied to the condensing lens through a window formed in the main case, and
   a second positioning unit for setting a position of the second optical path conversion member.

6. The light emitting module according to claim 1, further comprising:
   a wavelength conversion unit for absorbing a portion of light incident from the light source, converting a wavelength of the absorbed light, and radiating light the wavelength of which has been converted, wherein
   the wavelength conversion unit comprises:
   a reflection plate having a reflection surface for reflecting the incident light;
   a wavelength conversion device supported by the reflection surface of the reflection plate for absorbing a portion of the incident light and converting a wavelength of the absorbed light; and a side wall supported by the reflection surface of the reflection plate, the side wall being disposed so as to surround the wavelength conversion device.

7. The light emitting module according to claim 6, wherein the side wall is provided with a reflection side surface intersecting an arbitrary line that is parallel to the reflection surface of the reflection plate for reflecting the incident light while surrounding the wavelength conversion device.

8. The light emitting module according to claim 6, wherein the reflection surface of the reflection plate defines a surface intersecting an arbitrary line that is parallel to a central axis of the condensing lens.

9. The light emitting module according to claim 7, wherein the reflection side surface of the side wall is parallel to a central axis of the condensing lens.

10. The light emitting module according to claim 1, wherein the mirror adjustment unit adjusts a distance between the main case and the mirror bracket.

11. The light emitting module according to claim 1, wherein the mirror adjustment unit is configured such that the adjustment bolts are independently rotated so as to provide a degree of freedom to a location surface formed on the mirror bracket.

12. The light emitting module according to claim 1, wherein each of the adjustment bolts comprises:
    a bolt body having a screw formed on an outer surface thereof; and
    a head coupled to one end of the bolt body, the head having a larger size than the bolt body,
    the head being exposed outside the main case.

13. The light emitting module according to claim 1, wherein the case comprises:
    a main case for receiving at least the condensing lens and the first optical path conversion member, and wherein the case further comprises:
    a bracket for receiving the second optical path conversion member, the bracket being coupled to the main case such that light having passed through the second optical path conversion member is supplied to the condensing lens; and
    a bracket adjustment unit for coupling the bracket to the main case and adjusting a position of the bracket.

14. The light emitting module according to claim 13, wherein the bracket adjustment unit comprises:
    at least two support elastic bodies for providing elastic force to the other surface of the main case and to the bracket; and
    at least two fastening bolts extending through the bracket so as to be screw-coupled into bolt recesses formed in the main case.

15. The light emitting module according to claim 14, wherein the bracket comprises:
    a covering surface for covering a circumference of the window;
    an insertion protrusion protruding from the covering surface so as to be inserted into the window; and
    a receiving recess formed in the insertion protrusion for receiving the second optical path conversion member,
    the fastening bolts extending through the covering surface.

16. The light emitting module according to claim 1, further comprising a light source heat dissipation unit for dissipating heat generated from the light source.

17. The light emitting module according to claim 1, further comprising:
    a wavelength conversion unit for absorbing a portion of light incident from the light source, converting a wavelength of the absorbed light, and radiating light the wavelength of which has been converted; and
    a heat dissipation unit thermally connected to the wavelength conversion unit for dissipating heat generated from the wavelength conversion unit.

18. The light emitting module according to claim 1, further comprising:
    an auxiliary condensing lens for condensing the second reflected light having passed through the condensing lens, wherein
    the auxiliary condensing lens is received in the main case.

* * * * *